US012228857B2

United States Patent
Kamimura

(10) Patent No.: US 12,228,857 B2
(45) Date of Patent: Feb. 18, 2025

(54) SOLUTION, SOLUTION STORAGE BODY, ACTINIC RAY-SENSITIVE OR RADIATION-SENSITIVE RESIN COMPOSITION, PATTERN FORMING METHOD, AND MANUFACTURING METHOD OF SEMICONDUCTOR DEVICE

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/147,228

(22) Filed: Dec. 28, 2022

(65) Prior Publication Data

US 2023/0135117 A1 May 4, 2023

Related U.S. Application Data

(60) Division of application No. 16/289,813, filed on Mar. 1, 2019, now Pat. No. 11,573,489, which is a continuation of application No. PCT/JP2017/031543, filed on Sep. 1, 2017.

(30) Foreign Application Priority Data

Sep. 2, 2016 (JP) ................................. 2016-172239
Aug. 31, 2017 (JP) ................................. 2017-166461

(51) Int. Cl.
| | | |
|---|---|---|
| G03F 7/004 | (2006.01) | |
| G03F 7/00 | (2006.01) | |
| G03F 7/038 | (2006.01) | |
| G03F 7/039 | (2006.01) | |
| G03F 7/075 | (2006.01) | |
| G03F 7/16 | (2006.01) | |
| G03F 7/20 | (2006.01) | |
| G03F 7/32 | (2006.01) | |
| G03F 7/38 | (2006.01) | |
| H01L 21/027 | (2006.01) | |

(52) U.S. Cl.
CPC .......... *G03F 7/0048* (2013.01); *G03F 7/0012* (2013.01); *G03F 7/0044* (2013.01); *G03F 7/0046* (2013.01); *G03F 7/038* (2013.01); *G03F 7/039* (2013.01); *G03F 7/0392* (2013.01); *G03F 7/0397* (2013.01); *G03F 7/0757* (2013.01); *G03F 7/16* (2013.01); *G03F 7/162* (2013.01); *G03F 7/168* (2013.01); *G03F 7/2006* (2013.01); *G03F 7/2041* (2013.01); *G03F 7/32* (2013.01); *G03F 7/325* (2013.01); *G03F 7/38* (2013.01); *H01L 21/027* (2013.01); *H01L 21/0274* (2013.01)

(58) Field of Classification Search
CPC ........ G03F 7/0048; G03F 7/038; G03F 7/039; G03F 7/0047
See application file for complete search history.

(56) References Cited

U.S. PATENT DOCUMENTS

| 10,942,455 | B2 | 3/2021 | Kamimura | |
|---|---|---|---|---|
| 2009/0155713 | A1 | 6/2009 | Miyano et al. | |
| 2011/0245127 | A1 | 10/2011 | Suzuki | |
| 2012/0052449 | A1 | 3/2012 | Kato et al. | |
| 2014/0349224 | A1* | 11/2014 | Takizawa | G03F 7/325 430/311 |
| 2015/0227049 | A1 | 8/2015 | Yamanaka et al. | |
| 2016/0004156 | A1 | 1/2016 | Sugiyama et al. | |
| 2017/0184973 | A1 | 6/2017 | Yamanaka | |
| 2017/0285482 | A1 | 10/2017 | Tsuchihashi et al. | |

FOREIGN PATENT DOCUMENTS

| CN | 105051610 A | 11/2015 |
|---|---|---|
| JP | 59-222435 A | 12/1984 |
| JP | 07039701 A | 2/1995 |
| JP | 09-049000 A | 2/1997 |
| JP | 2007-171466 A | 7/2007 |
| JP | 2011-170151 A | 9/2011 |
| JP | 2013-177555 A | 9/2013 |
| JP | 2013-218308 A | 10/2013 |

(Continued)

OTHER PUBLICATIONS

Communication dated Jul. 31, 2020, from the Korean Patent Office in application No. 10-2019-7005852.
Communication issued Sep. 22, 2021 from the China National Intellectual Property Administration in Chinese Application No. 201780053869.4.
International Preliminary Report on Patentability with translation of the Written Opinion issued Mar. 5, 2019 in International Application No. PCT/JP2017031543.
International Search Report issued Nov. 21, 2017 in International Application No. PCT/JP2017/031543.
"Kojundo Yobai Primepure Series", Kanto Chemical Co., Inc., Jan. 1, 2016, 6 pages total.

(Continued)

*Primary Examiner* — Daborah Chacko-Davis
(74) *Attorney, Agent, or Firm* — Sughrue Mion, PLLC

(57) ABSTRACT

An object of the present invention is to provide a solution which contains an organic solvent as a main component (content: equal to or greater than 98% by mass) and has an excellent defect inhibition ability.
Another object of the present invention is to provide a solution storage body storing the solution, an actinic ray-sensitive or radiation-sensitive resin composition containing the solution, and a pattern forming method and a manufacturing method of a semiconductor device using the solution. The solution of the present invention is a solution containing at least one kind of organic solvent having a boiling point lower than 200° C. and an organic impurity having a boiling point equal to or higher than 250° C., in which a content of the organic solvent with respect to a total mass of the solution is equal to or greater than 98% by mass, and a content of the organic impurity with respect to the total mass of the solution is equal to or greater than 0.1 mass ppm and less than 100 mass ppm.

4 Claims, No Drawings

(56) References Cited

FOREIGN PATENT DOCUMENTS

| | | |
|---|---|---|
| JP | 2014-112176 A | 6/2014 |
| JP | 2016-073922 A | 5/2016 |
| KR | 10-2008-0072099 A | 8/2008 |
| KR | 10-2015-0063128 A | 6/2015 |
| TW | 200741339 A | 11/2007 |
| TW | 201423289 A | 6/2014 |
| TW | 201612656 A | 4/2016 |
| TW | 201627780 A | 8/2016 |
| WO | 2007/072702 A1 | 6/2007 |
| WO | 2016/052393 A1 | 4/2016 |

OTHER PUBLICATIONS

Notice of Reasons for Refusal dated Oct. 8, 2019 from the Japanese Patent Office in application No. 2018-537428.
Office Action issued Dec. 21, 2020 in Taiwanese Application No. 106129984.
Written opinion issued Nov. 21, 2017 in International Application No. PCT/JP2017/031543.
English Translation (computer-generated) of JP 07-039701 (Year: 1995).

\* cited by examiner

SOLUTION, SOLUTION STORAGE BODY, ACTINIC RAY-SENSITIVE OR RADIATION-SENSITIVE RESIN COMPOSITION, PATTERN FORMING METHOD, AND MANUFACTURING METHOD OF SEMICONDUCTOR DEVICE

CROSS-REFERENCE TO RELATED APPLICATIONS

This application is a Divisional of U.S. application Ser. No. 16/289,813 filed Mar. 1, 2019 which is a Continuation of PCT International Application No. PCT/JP2017/031543 filed on Sep. 1, 2017, which claims priority under 35 U.S.C. § 119(a) to Japanese Patent Application No. 2016-172239 filed on Sep. 2, 2016 and Japanese Patent Application No. 2017-166461 filed on Aug. 31, 2017. Each of the above applications is hereby expressly incorporated by reference, in its entirety, into the present application.

BACKGROUND OF THE INVENTION

1. Field of the Invention

The present invention relates to a solution containing an organic solvent as a main component (content: equal to or greater than 98% by mass). Furthermore, the present invention relates to a solution storage body storing the solution, an actinic ray-sensitive or radiation-sensitive resin composition containing the solution, and a pattern forming method and a manufacturing method of a semiconductor device using the solution.

2. Description of the Related Art

Conventionally, in a semiconductor device manufacturing process such as integrated circuit (IC) or a large scale integrated circuit (LSI), microfabrication is performed by lithography by using a photoresist composition. In recent years, as the integrated circuit has been more highly integrated, the formation of an ultrafine pattern in a submicron region and a quarter-micron region has been required. Consequently, an exposure wavelength such as a g-line tends to be replaced with a shorter wavelength such as an i-line and a KrF excimer laser light. Furthermore, currently, lithography in which electron beams, X-rays, or extreme ultraviolet (EUV) rays are used in addition to excimer laser light is under development.

In lithography, a film is formed of a photoresist composition (an actinic ray-sensitive or radiation-sensitive resin composition which is also called chemical amplification-type resist composition), the obtained film is then developed using a developer, and the film having undergone development is washed with a rinse solution. In addition, in order to improve the wettability of the photoresist composition with respect to a substrate, before the substrate is coated with the photoresist composition, a prewet solution is brought into contact with the surface of the substrate.

It is apprehended that in the aforementioned semiconductor device manufacturing process, the intermixing of coarse particles having a size of several micrometers may cause a defect failure in the semiconductor device. Therefore, raw materials, solvents, and the like used in the semiconductor device manufacturing process are required to have high purity.

Incidentally, JP2013-177555A discloses "a peeling composition containing a solvent for peeling a substrate from a support plate by dissolving an adhesive bonding the support plate to the substrate, in which a content of a high-boiling point impurity having a boiling point higher by 25° C. or more than a boiling point of the solvent is equal to or smaller than 5% by mass".

The peeling composition described in JP2013-177555A is used for removing a support plate bonded to a semiconductor wafer through an adhesive so as to improve the hardness of the semiconductor wafer at the time of manufacturing a semiconductor chip. Specifically, the peeling composition dissolves the aforementioned adhesive. In Examples in JP2013-177555A, a composition which does not contain the aforementioned high-boiling point impurity and a composition containing the aforementioned high-boiling point impurity in an amount of about 0.01% to 1.07% by mass are disclosed.

SUMMARY OF THE INVENTION

Meanwhile, the inventors of the present invention used the compositions specifically described in Example in JP2013-177555A, that is, two kinds of compositions including the composition which does not contain a high-boiling point impurity (in other words, a composition formed only of an organic solvent) and the composition containing the aforementioned high-boiling point impurity in an amount of about 0.01% to 1.07% by mass (a solution formed of an organic solvent as a main component and a high-boiling point impurity) in the semiconductor device manufacturing process. As a result, it was confirmed that both the compositions cause a defect failure in a substrate. That is, the inventors found that the defect inhibition ability does not reach the currently required level.

Therefore, an object of the present invention is to provide a solution which contains an organic solvent as a main component (content: equal to or greater than 98% by mass) and has an excellent defect inhibition ability.

Another object of the present invention is to provide a solution storage body containing the solution, an actinic ray-sensitive or radiation-sensitive resin composition containing the solution, and a pattern forming method and a manufacturing method of a semiconductor device using the solution.

In order to achieve the above objects, the inventors of the present invention conducted an intensive examination. As a result, the inventors have found that in a case where the solvent contains an organic solvent as a main component as well as an organic impurity having a boiling point equal to or higher than 250° C. in a trace amount within a predetermined range of numerical values, the above objects can be achieved. Based on the finding, the inventors have accomplished the present invention.

That is, the inventors have found that the above objects can be achieved by the following constitution.

[1] A solution containing at least one kind of organic solvent having a boiling point lower than 200° C., and an organic impurity having a boiling point equal to or higher than 250° C., in which a content of the organic solvent with respect to a total mass of the solution is equal to or greater than 98% by mass, and a content of the organic impurity with respect to the total mass of the solution is equal to or greater than 0.1 mass ppm and less than 100 mass ppm.

[2] The solution described in [1], in which a content of a metal component containing an element selected from the group consisting of Fe, Cr, Ni, and Pb with respect to the total mass of the solution is 0.001 to 10 mass ppt.

[3] The solution described in [2], in which the content of the metal component containing an element selected from the group consisting of Fe, Cr, Ni, and Pb with respect to the total mass of the solution is 0.1 to 10 mass ppt.

[4] The solution described in any one of [1] to [3], in which the number of objects to be counted that are counted by a light scattering-type liquid-borne particle counter and have a size equal to or greater than 0.1 µm is equal to or smaller than 100/mL.

[5] The solution described in any one of [1] to [4], in which a content of water with respect to the total mass of the solution is 0.01% to 1.0% by mass.

[6] The solution described in any one of [1] to [5], in which the organic impurity is an organic compound having 8 or more carbon atoms.

[7] The solution described in any one of [1] to [6], in which the organic impurity is an organic compound having 12 or more carbon atoms.

[8] The solution described in any one of [1] to [7], in which the organic impurity includes an organic impurity having a boiling point equal to or higher than 270° C., and a content of the organic impurity having a boiling point equal to or higher than 270° C. with respect to the total mass of the solution is 0.01 to 60 mass ppm.

[9] The solution described in any one of [1] to [8], in which the organic impurity includes an organic impurity having a boiling point equal to or higher than 300° C., and a content of the organic impurity having a boiling point equal to or higher than 300° C. with respect to the total mass of the solution is 0.01 to 30 mass ppm.

[10] The solution described in [9], in which the organic impurity includes the organic impurity having a boiling point equal to or higher than 300° C., and a content of the organic impurity having a boiling point equal to or higher than 300° C. with respect to the total mass of the solution is 0.1 to 30 mass ppm.

[11] The solution described in any one of [1] to [10], in which the organic impurity is one or more kinds of compounds selected from the group consisting of dioctyl phthalate, diisononyl phthalate, dioctyl adipate, dibutyl phthalate, ethylene propylene rubber, and an addition polymer of 5-ethylidene-2-norbornene.

[12] The solution described in any one of [1] to [11] that is used for at least one use selected from a prewet solution, a developer, and a solvent contained in an actinic ray-sensitive or radiation-sensitive resin composition in a semiconductor device manufacturing process.

[13] The solution described in any one of [1] to [12], in which the organic solvent is at least one kind of solvent selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, diisoamyl ether, butyl acetate, isoamyl acetate, and 4-methyl-2-pentanol.

[14] The solution described in any one of [1] to [13] that is used as a prewet solution or a developer for a resist film formed of an actinic ray-sensitive or radiation-sensitive resin composition containing a resin P having a repeating unit represented by Formula (AI), which will be described later, in a semiconductor device manufacturing process.

[15] The solution described in [14], in which the resin P further has a repeating unit Q having a lactone structure on a side chain.

[16] The solution described in [14], in which the resin P is a resin represented by Formula (I) which will be described later.

[17] The solution described in any one of [1] to [13] that is used as a prewet solution or a developer for a resist film formed of an actinic ray-sensitive or radiation-sensitive resin composition containing a resin P, which has a repeating unit having a phenolic hydroxyl group and has a group generating a polar group by being decomposed by the action of an acid, in a semiconductor device manufacturing process.

[18] A solution storage body comprising a container and the solution described in any one of [1] to [17] stored in the container.

[19] The solution storage body described in [18], in which a solution contact portion contacting the solution in the container is formed of a nonmetallic material or stainless steel.

[20] The solution storage body described in [19], in which the nonmetallic material is at least one kind of material selected from the group consisting of a polyethylene resin, a polypropylene resin, a polyethylene-polypropylene resin, a tetrafluoroethylene resin, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

[21] An actinic ray-sensitive or radiation-sensitive resin composition comprising the solution described in any one of [1] to [11] and a resin P having a repeating unit represented by Formula (AI) which will be described later.

[22] The actinic ray-sensitive or radiation-sensitive resin composition described in [21], in which the resin P further has a repeating unit Q having a lactone structure on a side chain.

[23] The actinic ray-sensitive or radiation-sensitive resin composition described in [21], in which the resin P is a resin represented by Formula (I) which will be described later.

[24] An actinic ray-sensitive or radiation-sensitive resin composition comprising the solution described in any one of [1] to [11] and a resin P which has a repeating unit having a phenolic hydroxyl group and has a group generating a polar group by being decomposed by the action of an acid.

[25] A pattern forming method comprising a resist film forming step of forming a resist film on a substrate by using an actinic ray-sensitive or radiation-sensitive resin composition, an exposure step of exposing the resist film, and a development step of developing the exposed resist film by using a developer, in which the actinic ray-sensitive or radiation-sensitive resin composition contains the solution described in any one of [1] to [11].

[26] A pattern forming method comprising a prewet step of bringing a prewet solution into contact with a substrate, a resist film forming step of forming a resist film on the substrate by using an actinic ray-sensitive or radiation-sensitive resin composition, an exposure step of exposing the resist film, and a development step of developing the exposed resist film by using a developer, in which the solution described in any one of [1] to [11] is used as the prewet solution.

[27] A pattern forming method comprising a resist film forming step of forming a resist film on a substrate by using an actinic ray-sensitive or radiation-sensitive resin composition, an exposure step of exposing the resist film, and a development step of developing the exposed resist film by using a developer, in which the solution described in any one of [1] to [11] is used as the developer.

[28] The pattern forming method described in any one of [25] to [27], in which the actinic ray-sensitive or radiation-sensitive resin composition contains a resin P having a repeating unit represented by Formula (AI) which will be described later.

[29] The pattern forming method described in [28], in which the resin P further has a repeating unit Q having a lactone structure on a side chain.

[30] The pattern forming method described in [28], in which the resin P is a resin represented by Formula (I) which will be described later.

[31] The pattern forming method described in any one of [25] to [27], in which the actinic ray-sensitive or radiation-sensitive resin composition contains a resin P which has a repeating unit having a phenolic hydroxyl group and has a group generating a polar group by being decomposed by the action of an acid.

[32] A manufacturing method of a semiconductor device comprising the pattern forming method described in any one of [25] to [31].

According to the present invention, it is possible to provide a solution which contains an organic solvent as a main component (content: equal to or greater than 98% by mass) and has an excellent defect inhibition ability.

Furthermore, according to the present invention, it is possible to provide a solution storage body storing the solution, an actinic ray-sensitive or radiation-sensitive resin composition containing the solution, and a pattern forming method and a manufacturing method of a semiconductor device using the solution.

DESCRIPTION OF THE PREFERRED EMBODIMENTS

Hereinafter, the present invention will be specifically described.

In the following section, constituents will be described based on typical embodiments of the present invention, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis, mixing, and the like but also the preparation of a specific substance by means of purchase.

In the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, a bright line spectrum of a mercury lamp, far ultraviolet rays represented by an excimer laser, extreme ultraviolet radiation (EUV rays), X-rays, electron beams, and the like. In addition, in the present invention, light means actinic rays or radiation. In the present invention, unless otherwise specified, "exposure" includes not only exposure by a mercury lamp, far ultraviolet rays represented by an excimer laser, X-rays, and EUV rays, but also lithography by particle beams such as electron beams or ion beams.

[Solution]

The solution according to the embodiment of the present invention is a solution containing at least one kind of organic solvent having a boiling point lower than 200° C. and an organic impurity having a boiling point equal to or higher than 250° C., in which a content of the organic solvent with respect to a total mass of the solution is equal to or greater than 98% by mass, and a content of the organic impurity with respect to the total mass of the solution is equal to or greater than 0.1 mass ppm and less than 100 mass ppm.

The inventors of the present invention have found that in a case where an organic solvent which contains an organic impurity and has a boiling point lower than 200° C. (in other words, a solution which contains an organic solvent having a boiling point lower than 200° C. as a main component and an organic impurity) is used in the semiconductor device manufacturing process, in the organic impurities, particularly a high-boiling point organic impurity having a boiling point equal to or higher than 250° C. remains without being volatilized and readily becomes the apparent cause of a defect failure in a substrate.

Presumably, the organic impurity having a boiling point equal to or higher than 250° C. may be a component intermixed at the time of manufacturing an organic solvent having a boiling point lower than 200° C. that constitutes the main component in the solution or at the time of manufacturing a raw material component that constitutes the organic solvent having a boiling point lower than 200° C. Particularly, as the organic impurity having a boiling point equal to or higher than 250° C., specifically, a plastic material (for example, an O-ring or the like) used as a member of a manufacturing device or a resin component, a plasticizer, or the like which is incorporated into a filter membrane in a step of manufacturing a filter can be considered. Presumably, these impurities may be eluted in the solution at any point in time during the manufacturing process.

As a result of the investigation conducted by the inventors of the present invention, it has been confirmed that provided that the content of the organic impurity having a boiling point equal to or higher than 250° C. in the solution is less than 100 mass ppm with respect to the total mass of the solution, in a case where the solution is used in the semiconductor device manufacturing process, a defect failure hardly occurs in a substrate (in other words, the solution has an excellent defect inhibition ability).

It has been confirmed that provided that the content of the organic impurity having a boiling point equal to or higher than 250° C. with respect to the total mass of the solution is equal to or greater than 100 mass ppm, for example, in a case where the solution is used as a prewet solution and brought into contact with a substrate, the organic impurity remains on the surface of the substrate without being volatilized and lead to a defect failure in some cases. Furthermore, it has been confirmed that the organic impurity remaining on the surface of the substrate becomes the cause of a defect failure in a resist film formed on the substrate after the prewet step.

In addition, it has been confirmed that in a case where the solution is used as a developer, the organic impurity adheres to the developed film and causes a defect failure in the film.

It has been also confirmed that, for example, in a case where the solution is used as a diluent of resist materials (solid components such as a resin forming a resist film, a photoacid generator, and a photopolymerization initiator) contained in a photoresist composition (actinic ray-sensitive or radiation-sensitive resin composition), the organic impurity remains in the film even after a baking treatment step performed on the exposed resist film and causes a defect failure in the film.

The inventors of the present invention considered that the smaller the content of the organic impurity having a boiling point equal to or higher than 250° C., the further the defect failure is inhibited. However, the inventors have found that in a case where the content is less than 0.1 mass ppm with respect to the total mass of the solution, sometimes the occurrence of the defect failure markedly increases instead.

The reason is unclear but is assumed to be as below.

It is considered that in the solution, the organic impurity having a boiling point equal to or higher than 250° C. (particularly, a component such as dioctyl phthalate (DOP, boiling point: 385° C.) eluted from an O-ring) may exhibit high compatibility with respect to components such as metal particles mixed with the solution as impurities, metal ions, and an organic impurity (organic impurity having a boiling point lower than 250° C.) other than these. Presumably, in a case where the content of the organic impurity having a boiling point equal to or higher than 250° C. in the solution is extremely small such as less than 0.1 mass ppm with respect to the total mass of the solution, the metal particles, the metal ions, or the organic impurity other than these may be easily precipitated, and consequently, the defect may worsen.

Hereinafter, the solution according to the embodiment of the present invention will be specifically described.

<Organic Solvent Having Boiling Point Lower than 200° C.>

The organic solvent having a boiling point lower than 200° C. is not particularly limited, and examples thereof include various organic solvents used in a semiconductor device manufacturing process and various organic solvents used in the process of manufacturing various materials used in a semiconductor device manufacturing process. Examples of the organic solvent include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methyl cyclohexanol, trimethyl cyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2,2-trifluoroethyl ether, ethyl vinyl ether, butyl vinyl ether, allyl ethyl ether, allyl propyl ether, allyl butyl ether, diallyl ether, 2-methoxypropene, ethyl-1-propenylether, cis-1-bromo-2-ethoxyethylene, 2-chloroethyl vinyl ether, allyl-1,1,2,2-tetrafluoroethyl ether, octane, isooctane, nonane, decane, methyl cyclohexane, decalin, xylene, ethyl benzene, diethyl benzene, cumene, sec-butyl benzene, cymene, dipentene, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, isoamyl acetate, chloroform, dichloromethane, 1,4-dioxane, tetrahydrofuran, and the like.

Among these, an organic solvent used as a prewet solution or a developer in a semiconductor device manufacturing process and an organic solvent used as a diluent of resist materials in an actinic ray-sensitive or radiation-sensitive resin composition are preferable, and at least one kind of solvent selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, diisoamyl ether, butyl acetate, isoamyl acetate, and 4-methyl-2-pentanol is more preferable.

Two or more kinds of organic solvents may be used in combination at any ratio. The combination is not particularly limited, but it is preferable to combine two or more kinds of organic solvents having different boiling points, different solubility parameters, or different dielectric constants. In a case where the above constitution is adopted, the occurrence of a defect in a semiconductor device can be further reduced. For example, in a case where an organic solvent having a low dielectric constant is used, the occurrence of a defect in a semiconductor device by static electricity can be reduced.

In the present specification, the boiling point means a boiling point at 1 atm.

In a case where two or more kinds of organic solvents are combined, the use of ethers is preferable, and the use of two or more kinds of ethers in combination is more preferable. In a case where ethers are used, the occurrence of a defect in a semiconductor device can be further reduced.

In a case where two or more kinds of ethers are combined, it is preferable to combine compounds selected from the group consisting of propylene glycol monomethyl ether acetate, propylene glycol monomethyl ether, diethylene glycol monomethyl ether, diethylene glycol monoethyl ether, and diethylene glycol monobutyl ether.

Among these, a combination (mixed solvent) of propylene glycol monomethyl ether acetate and propylene glycol monomethyl ether is preferable. In a case where two kinds of organic solvents are used in combination, the mixing ratio (mass) thereof is preferably within a range of 1/99 to 99/1, more preferably within a range of 10/90 to 90/10, and even more preferably within a range of 20/80 to 60/40.

Furthermore, three or more kinds of organic solvents may be mixed together at any ratio. In a case where three or more kinds of organic solvents are mixed together at any ratio, for example, it is possible to perform an operation such as delicate adjustment of a resist shape and adjustment of viscosity. Examples of the combination of three or more kinds of organic solvents include a combination of propylene glycol monomethyl ether acetate (PGMEA), propylene glycol monomethyl ether (PGME), and γ-butyrolactone, a combination of PGMEA, PGME, and cyclohexanone, a combination of PGMEA, PGME, and 2-heptanone, a combination of PGMEA, cyclohexanone, and γ-butyrolactone, a combination of PGMEA, γ-butyrolactone, and 2-heptanone, and the like.

As the components (for example, an organic solvent having a boiling point lower than 200° C.) used at the time of manufacturing the solution and raw materials of the components, high-purity grade products (particularly, products in which the content of metal components which will be described later, water, organic impurities which will be described later, and the like is small) can be purchased and used. Alternatively, the aforementioned high-purity grade products may be used after being subjected to a purification treatment which will be described later.

The content of the organic solvent having a boiling point lower than 200° C. with respect to the total mass of the solution is equal to or greater than 98% by mass, preferably equal to or greater than 99% by mass, more preferably equal to or greater than 99.5% by mass, and even more preferably equal to or greater than 99.8% by mass. The upper limit is not particularly limited, and can be about 99.99% by mass for example.

One kind of organic solvent having a boiling point lower than 200° C. may be used singly, or two or more kinds of such organic solvents may be used in combination. In a case where two or more kinds of organic solvents are used in combination, the total content thereof is preferably within the above range.

<Organic Impurity Having Boiling Point Equal to or Higher than 250° C.>

In the solution, the content of an organic impurity having a boiling point equal to or higher than 250° C. with respect to the total mass of the solution is equal to or greater than 0.1 mass ppm and less than 100 mass ppm.

The organic impurity means an organic substance other than the organic solvent having a boiling point lower than 200° C. that composes the solution (here, water is not included in the organic impurity). Examples of the organic impurity include a raw material component used at the time of synthesizing the organic solvent having a boiling point lower than 200° C., a structural isomer of the organic solvent having a boiling point lower than 200° C., a stabilizer for preventing oxidation of the organic solvent having a boiling point lower than 200° C. (for example, dibutylhydroxytoluene (BHT, boiling point: 265° C.) or the like), an organic substance eluted from a member of manufacturing device, and the like. The organic impurity having a boiling point equal to or higher than 250° C. means an impurity having a boiling point equal to or higher than 250° C. among the aforementioned organic impurities.

As described above, the organic substance eluted from a member of a manufacturing device specifically refers to a resin component, a plasticizer, or the like contained in a plastic material (for example, an O-ring or the like) used in the member of the manufacturing device. As such a component, for example, dioctyl phthalate (DOP, boiling point: 385° C.), diisononyl phthalate (DINP, boiling point: 403° C.), dioctyl adipate (DOA, boiling point: 335° C.), dibutyl phthalate (DBP, boiling point: 340° C.), ethylene propylene rubber (EPDM, boiling point: 300° C. to 450° C.), or the like has been confirmed.

Examples of the organic impurity include, in addition to the above components, bis(2-ethylhexyl)phthalate (DEHP), bis(2-propylheptyl)phthalate (DPHP), dibutyl phthalate (DBP), benzyl butyl phthalate (BBzP), diisodecyl phthalate (DIDP), diisooctyl phthalate (DIOP), diethyl phthalate (DEP), diisobutyl phthalate (DIBP), dihexyl phthalate, diisononyl phthalate, tris(2-ethylhexyl)trimellitate (TEHTM), tris(n-octyl-n-decyl)trimellitate (ATM), bis(2-ethylhexyl) adipate (DEHA), monomethyl adipate (MMAD), dioctyl adipate (DOA), dibutyl sebacate (DBS), dibutyl maleate (DBM), diisobutyl maleate (DIBM), azelaic acid ester, benzoic acid ester, terephthalate (example: dioctyl terephthalate (DEHT)), 1,2-cyclohexanedicarboxylic acid diisononyl ester (DINCH), epoxidized vegetable oil, sulfonamide (example: N-(2-hydroxypropyl)benzene sulfonamide (HP BSA), N-(n-butyl)benzene sulfonamide (BBSA-NBBS)), an organic phosphoric acid ester (example, tricresyl phosphate (TCP), tributyl phosphate (TBP)), acetylated monoglyceride, triethyl citrate (TEC), acetyl triethyl citrate (ATEC), tributyl citrate (TBC), acetyl tributyl citrate (ATBC), trioctyl citrate (TOC), acetyl trioctyl citrate (ATOC), trihexyl citrate (THC), acetyl trihexyl citrate (ATHC), epoxidized soybean oil, polybutene, and polymer plasticizers exemplified below.

Presumably, these organic impurities may be intermixed from a filter, a pipe, a tank, an O-ring, a container, and the like that the organic impurities contact in a purification step. Particularly, the intermixing of a compound other than alkyl olefin is not preferable because this leads to a bridging defect.

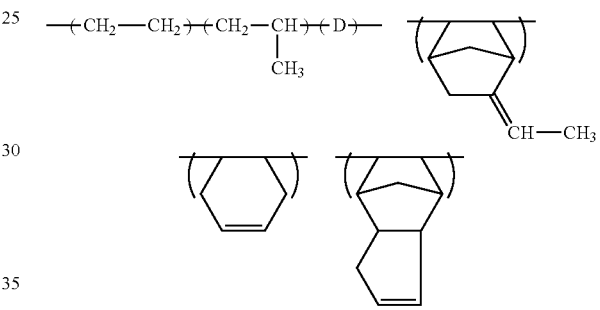

As the organic impurities, one or more kinds of compounds selected from the group consisting of dioctyl phthalate, diisononyl phthalate, dioctyl adipate, dibutyl phthalate, ethylene propylene rubber, and an addition polymer of 5-ethylidene-2-norbornene are preferable. In a case where the solution contains these organic impurities, the defect inhibition ability of the solution is further improved.

In view of obtaining a particularly excellent defect inhibition ability, it is preferable that the solution contains dioctyl phthalate as an organic impurity. The reason why the solution containing dioctyl phthalate (DOP) as an organic impurity has an excellent defect inhibition ability is unclear. However, one of the reasons is assumed to be as below. That is, owing to its coordinating properties, DOP is easily coordinated with a metal and present in a liquid in the form of a complex. Therefore, DOP is more hydrophilic than is predicted from the structure thereof. Presumably, for this reason, in a case where the purified solution containing DOP is used for washing of a substrate and the like, DOP may hardly remain on the substrate, and hence the occurrence of a defect and the like in the substrate can be further inhibited.

The upper limit of the boiling point of the organic impurity having a boiling point equal to or higher than 250° C. is not particularly limited, but is preferably equal to or lower than 1,000° C., more preferably equal to or lower than 800° C., and even more preferably equal to or lower than 500° C.

In a case where the organic impurity having a boiling point equal to or higher than 250° C. contains an organic impurity having a boiling point equal to or higher than 270°

C., from the viewpoint of further improving the defect inhibition ability, the content of the organic impurity having a boiling point equal to or higher than 270° C. with respect to the total mass of the solution is preferably 0.01 to 60 mass ppm and more preferably 0.1 to 60 mass ppm. In a case where the content of the organic impurity having a boiling point equal to or higher than 270° C. is within the above range of numerical values, the defect inhibition ability is further improved.

In a case where the organic impurity having a boiling point equal to or higher than 250° C. contains an organic impurity having a boiling point equal to or higher than 300° C., from the viewpoint of further improving the defect inhibition ability, the content of the organic impurity having a boiling point equal to or higher than 300° C. with respect to the total mass of the solution is preferably 0.01 to 30 mass ppm, and more preferably 0.1 to 30 mass ppm. In a case where the content of the organic impurity having a boiling point equal to or higher than 300° C. is within the above range of numerical values, the defect inhibition ability is further improved.

From the viewpoint of further improving the defect inhibition ability, the content of the organic impurity having a boiling point equal to or higher than 250° C. with respect to the total mass of the solution is preferably 0.1 to 8 mass ppm.

Particularly, the organic impurity having a boiling point equal to or higher than 250° C. is preferably an organic compound having 8 or more carbon atoms, and more preferably an organic compound having 12 or more carbon atoms. Generally, as the number of carbon atoms in the organic impurity increases, a defect failure tends to more easily occur. However, it has been confirmed that particularly in a case where the content of the organic impurity having a boiling point equal to or higher than 250° C. with respect to the total mass of the solution is a predetermined amount (particularly, in a case where the content of the organic impurity is 0.1 to 8 mass ppm), the solution has an excellent defect inhibition ability regardless of the number of carbon atoms. That is, as the number of carbon atoms increases, the obtained effects of the present invention become more apparent.

The content of the organic impurity having a boiling point equal to or higher than 250° C. in the solution is measured by gas chromatography (GC-MS).

As the method for making the content of the organic impurity having a boiling point equal to or higher than 250° C. in the solution fall into the above range, for example, a method exemplified in a purification step, which will be described later, can be used.

<Metal Component (Metal Impurity) Containing Element Selected from the Group Consisting of Fe, Cr, Ni, and Pb>

In the present invention, the content of a metal component, which contains an element selected from the group consisting of Fe, Cr, Ni, and Pb, in the solution with respect to the total mass of the solution is preferably 0.001 to 10 mass ppt.

The metal component is present in the organic solvent to a certain extent and intermixed with the solution in some cases through the organic solvent. The inventors of the present invention have found that the metal component which is contained in the solution and contains an element selected from the group consisting of Fe, Cr, Ni, and Pb exerts a big influence particularly on the defect performance.

In a case where the content of the metal component containing an element selected from the group consisting of Fe, Cr, Ni, and Pb with respect to the total mass of the solution is equal to or smaller than 10 mass ppt, the defect inhibition ability is further improved. In contrast, in a case where the content of the metal component containing an element selected from the group consisting of Fe, Cr, Ni, and Pb with respect to the total mass of the solution is equal to or greater than 0.001 mass ppt (preferably equal to or greater than 0.1 mass ppt), an effect of further improving the defect inhibition ability is obtained.

In a case where the solution contains a plurality of kinds of metal components containing an element selected from the group consisting of Fe, Cr, Ni, and Pb, the total amount of the metal components is preferably within the above range.

From the viewpoint of further improving the defect inhibition ability, the content of the metal component containing an element selected from the group consisting of Fe, Cr, Ni, and Pb is more preferably 0.1 to 10 mass ppt, and even more preferably 0.1 to 5 mass ppt.

The content of the metal impurity in the solution is measured by inductively coupled plasma mass spectrometry (ICP-MS).

As the method for making the content of the metal impurity in the solution fall into the above range, for example, a method exemplified in a purification step, which will be described later, can be used (for example, a treatment using an ion exchange resin, filtering using a metal adsorption member, or the like).

Contrary to the aforementioned method, SP-ICP-MS makes it possible to measure the content of metal particles. Accordingly, by subtracting the content of metal particles from the content of metal atoms in a sample, the content of metal ions in the sample can be calculated.

Examples of the measurement device for SP-ICP-MS include Agilent 8800 triple quadrupole inductively coupled plasma mass spectrometry (ICP-MS, for semiconductor analysis, option #200) manufactured by Agilent Technologies, Inc, NexION 350S manufactured by PerkinElmer Inc., and Agilent 8900 manufactured by Agilent Technologies, Inc.

<Coarse Particles>

It is preferable that the solution substantially does not contain coarse particles.

The coarse particles mean objects to be counted having a size equal to or greater than 0.1 μm that are counted by a light scattering-type liquid-borne particle counter.

"Substantially does not contain coarse particles" means that in a case where the solution is measured using a commercial measurement device (for example, "KS-18F" (manufactured by RION Co., Ltd.)) for a light scattering-type liquid-borne particle measurement method, the number of the objects to be counted in 1 mL of the solution is equal to or smaller than 100. In a case where the number of the objects to be counted in 1 mL of the solution is equal to or smaller than 100, the defect inhibition ability is further improved, and the temporal stability of the organic solvent in the solution is further improved.

The coarse particles contained in the solution are particles of dirt, dust, organic solids, inorganic solids, and the like contained in raw materials as impurities, particles of dirt, dust, organic solids, inorganic solids, and the like incorporated as contaminants into the solution in the process of preparing the solution, or the like. The coarse particles correspond to the objects that are present as particles finally in the obtained solution without being dissolved.

The objects to be counted of the present invention are not particularly limited, as long as they are detected as objects having a size equal to or greater than 0.1 μm by a light scattering-type liquid-borne particle counter.

As the method for removing the coarse particles, for example, a treatment such as filtering which will be described later can be used.

<Water>

The solution may also contain water. The content of water in the solution with respect to the total mass of the solution is preferably 0.01% to 1.0% by mass.

The water may be moisture that the organic solvent composing the solution inevitably contains or moisture inevitably incorporated into the organic solvent at the time of manufacturing the organic solvent. Furthermore, the water may be intentionally added water.

In a case where the content of water with respect to the total mass of the solution is equal to or smaller than 1.0% by mass, it is possible to inhibit a defect failure caused by a watermark on the surface of a substrate. In contrast, in a case where the content of water with respect to the total mass of the solution is equal to or greater than 0.01% by mass, it is possible to obtain an effect of inhibiting a defect failure caused by the precipitation of metal ions on the surface of a substrate.

From the viewpoint of further improving the defect inhibition ability, the content of water is more preferably 0.05% to 1.0% by mass.

The content of water in the solution is measured by the method explained in Examples, which will be described later, by using a device adopting a Karl Fischer water content measurement method (coulometric titration method) as a measurement principle.

For example, as one of the methods for making the content of water in the solution fall into the above range, a method can be used in which the solution is put into a desiccator having undergone nitrogen gas purging and heated in the desiccator in a state where the internal pressure of the desiccator is being kept positive. Furthermore, by the method exemplified in a purification step which will be described later, the content of water in the solution can be adjusted to fall into the desired range.

<Method for Confirming Defect Resulting from Chemical Solution>

In a semiconductor manufacturing process, it is preferable that a defect resulting from impurities in a chemical solution (corresponding to the solution according to the embodiment of the present invention or the like) hardly occurs.

The method for confirming a defect resulting from impurities in a chemical solution is not particularly limited and will be described based on the following example.

The method for detecting a foreign substance on a wafer or a pattern defect is not particularly limited, and a wafer surface inspection device (SP-5; manufactured by KLA-Tencor Corporation) can be used.

A semiconductor wafer is coated with a chemical solution, and the wafer surface coated with the chemical solution is irradiated with laser beams. At this time, in a case where the laser beams touch a foreign substance/defect, light is scattered, and the scattered light is detected by a detector. The foreign substance/defect is detected in this way.

In a case where the wafer is measured by being rotated at the time of laser beam irradiation, from the rotation angle of the wafer and the radial position of the laser beams, a coordinate position of the foreign substance/defect can be assigned.

Examples of the wafer surface inspection device include a SURFSCAN series manufactured by KLA-Tencor Corporation, and the like.

Particularly, for evaluating a defect relating to the manufacturing of a fine semiconductor device at a node equal to or smaller than 10 nm, it is preferable to use a wafer surface inspection device having resolution equal to or higher than that of SP-5.

<Use>

The use of the solution according to the embodiment of the present invention is not particularly limited, but it is particularly preferable to use the solution in a semiconductor device manufacturing process. Particularly, the solution can be suitably used in a semiconductor manufacturing process at a node equal to or smaller than 10 nm. The solution according to the embodiment of the present invention can also be used in any of steps for manufacturing a semiconductor device. Specifically, examples of the use of the solution include a prewet solution with which a substrate is coated before a step of forming a resist film by using a photoresist composition so as to ameliorate the coating properties of the composition, a developer for developing an exposed resist film formed of a photoresist composition, and a rinse solution for washing a developed film. Furthermore, the solution according to the embodiment of the present invention can be used as a diluent of resist materials contained in a photoresist composition.

(Substrate)

"Substrate" mentioned in the present invention includes, for example, a semiconductor substrate including a single layer and a semiconductor substrate including multiple layers.

The material constituting the semiconductor substrate including a single layer is not particularly limited. Generally, the semiconductor substrate including a single layer is preferably constituted with silicon, silicon germanium, a group III-V compound such as GaAs, or a combination of any of these materials.

The constitution of the semiconductor substrate including multiple layers is not particularly limited. For example, the semiconductor substrate including multiple layers may have the structure of an integrated circuit in which interconnect features such as metal wires and dielectric materials are exposed on a semiconductor substrate such as silicon described above. Examples of metals and alloys used in the interconnect features include, but are not limited to, aluminum, aluminum alloyed with copper, copper, titanium, tantalum, cobalt, silicon, titanium nitride, tantalum nitride, and tungsten. Furthermore, on the semiconductor substrate, there may be an interlayer dielectric and layers of silicon oxide, silicon nitride, silicon carbide, carbon-doped silicon oxide, and the like.

The solution according to the embodiment of the present invention can also be suitably used for other uses in addition to the manufacturing of a semiconductor. The solution according to the embodiment of the present invention can be used as a developer or rinse solution for polyimide, a resist for a sensor, a resist for a lens, and the like.

Furthermore, the solution according to the embodiment of the present invention can be used as a solvent for medical uses or washing. Particularly, the solution according to the embodiment of the present invention can be suitably used for washing a container, a pipe, or a substrate (for example, a wafer, glass, or the like).

<Manufacturing Method of Solution>

It is preferable that the solution according to the embodiment of the present invention is subjected to the following purification step such that the content of the metal component, the organic impurity having a boiling point equal to or higher than 250° C., and water falls into the desired range.

(Purification Step)

The purification step is a step of purifying the solution such that the content of the components (for example, the metal component, the organic impurity having a boiling point equal to or higher than 250° C., water, and the like) intermixed at the time of manufacturing the organic solvent having a boiling point lower than 200° C. that composes the solution becomes the desired content described above.

The purification step may be performed at any timing. Examples of the purification step include the following purification treatments I to IV.

That is, the purification treatment I is a treatment in which raw materials used for manufacturing the organic solvent having a boiling point lower than 200° C. are purified before the manufacturing of the organic solvent having a boiling point lower than 200° C. that composes the solution.

The purification treatment II is a treatment in which the organic solvent having a boiling point lower than 200° C. that composes the solution is purified at the time of manufacturing the organic solvent and/or after the manufacturing of the organic solvent.

The purification treatment III is a treatment in which at the time of manufacturing the solution, each of the components is purified before two or more kinds of organic solvents having a boiling point lower than 200° C. are mixed together.

The purification treatment IV is a treatment in which at the time of manufacturing the solution, after two or more kinds of organic solvents having a boiling point lower than 200° C. are mixed together, the mixture is purified.

In a case where a commercial product is used as the organic solvent having a boiling point lower than 200° C., the purification treatment II may be performed such that the content of the metal component, the organic impurity having a boiling point equal to or higher than 250° C., water, and the like becomes the desired amount.

Each of the purification treatments I to IV may be performed once or twice or more.

Hereinafter, an example of the purification step will be described. In the following description, a subject to be purified in the purification step (for example, the organic solvent having a boiling point lower than 200° C. or a mixture obtained by mixing together two or more kinds of organic solvents having a boiling point lower than 200° C.) will be simply collectively referred to as "solution to be purified".

One of the examples of the purification step include an aspect in which a first ion exchange treatment of performing an ion exchange treatment on the solution to be purified, a dehydration treatment of dehydrating the solution to be purified having undergone the first ion exchange treatment, a distillation treatment of performing distillation of the solution to be purified having undergone the dehydration treatment, a second ion exchange treatment of performing an ion exchange treatment on the solution to be purified having undergone the distillation treatment, and an organic impurity removing treatment of removing an organic impurity from the solution to be purified having undergone the second ion exchange treatment are carried out in this order. Hereinafter, an example of the purification step described above will be explained, but the purification method at the time of preparing the solution according to the embodiment of the present invention is not limited thereto. For example, an aspect may also be adopted in which a dehydration treatment of dehydrating the solution to be purified is carried out first and then a distillation treatment of performing distillation of the solution to be purified having undergone the dehydration treatment, a first ion exchange treatment of performing an ion exchange treatment on the solution to be purified, and an organic impurity removing treatment of removing an organic impurity from the solution to be purified having undergone a second ion exchange treatment are carried out in this order.

According to the first ion exchange treatment, an ion component (for example, a metal component or the like) in the solution to be purified can be removed.

In the first ion exchange treatment, first ion exchange means such as an ion exchange resin is used. The ion exchange resin may be any of a cation exchange resin or an anion exchange resin provided as a single bed, a cation exchange resin and an anion exchange resin provided as a dual bed, and a cation exchange resin and an anion exchange resin provided as a mixed bed.

Furthermore, in order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG•DRY (trade name, dry cation exchange resin, moisture: equal to or smaller than 2%) and MSPS2-1•DRY (trade name, mixed bed resin, moisture: equal to or smaller than 10%) manufactured by ORGANO CORPORATION, and the like.

According to the dehydration treatment, water in the solution to be purified can be removed. In a case where zeolite (particularly, MOLECULAR SIEVE (trade name) manufactured by Union Showa K. K.), which will be described later, is used in the dehydration treatment, olefins can also be removed.

Examples of dehydration means used in the dehydration treatment include a dehydration membrane, a water adsorbent insoluble in the solution to be purified, an aeration purging device using dried inert gas, a heating device, a vacuum heating device, and the like.

In a case where the dehydration membrane is used, membrane dehydration by pervaporation (PV) or vapor permeation (VP) is performed. The dehydration membrane is constituted as a permeable membrane module, for example. As the dehydration membrane, it is possible to use a membrane formed of a polymeric material such as a polyimide-based material, a cellulose-based material, and a polyvinyl alcohol-based material or an inorganic material such as zeolite.

The water adsorbent is used by being added to the solution to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

According to the distillation treatment, it is possible to remove impurities eluted from the dehydration membrane, metal components in the solution to be purified that are not easily removed by the first ion exchange treatment, fine particles (including fine particles of the metal components as well in a case where the metal components are fine particles), and water in the solution to be purified.

The distillation means is constituted with a single-stage distillation device, for example. By the distillation treatment, impurities are concentrated in the distillation device and the like. In order to prevent the leakage of some of the concentrated impurities, the distillation means is preferably provided with means for regularly or constantly discharging a portion of the liquid containing the concentrated impurities to the outside.

According to the second ion exchange treatment, it is possible to remove the impurities accumulated in the distillation device in a case where the impurities leak or to remove substances eluted from a pipe made of stainless steel (SUS) or the like used as a feed line.

Examples of the second ion exchange means include a tower-like container filled with an ion exchange resin and an ion adsorption membrane. Among these, an ion adsorption membrane is preferable because this makes it possible to perform the treatment at a high flow rate. Examples of the ion adsorption membrane include NEOSEPTA (trade name, manufactured by ASTOM Corporation).

Each of the treatments described above is preferably performed under a sealed condition in an inert gas atmosphere in which water is less likely to be intermixed with the solution to be purified.

Furthermore, in order to inhibit the intermixing of moisture as much as possible, each of the treatments is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be intermixed with the solution (solution to be purified) is reduced.

Examples of the purification step include, in addition to the above treatment, the adsorptive purification treatment for metal component using silicon carbide described in WO2012/043496A, and the like.

According to the organic impurity removing treatment, it is possible to remove a high-boiling point organic impurity (including the organic impurity having a boiling point equal to or higher than 250° C.) which is contained in the solution to be purified having undergone the distillation treatment and is not easily removed by the distillation treatment.

The organic impurity can be removed by means of an organic impurity adsorption member comprising an organic impurity adsorption filter which can adsorb the organic impurity. Generally, the organic impurity adsorption member is constituted with the aforementioned organic impurity adsorption filter and a base material to which the impurity adsorption filter is fixed.

From the viewpoint of improving the organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). One of the examples of the constitution in which the organic impurity adsorption filter having the skeleton of an organic substance, which can interact with the organic impurity, on the surface thereof, include an aspect in which the surface of the base material constituting the organic impurity adsorption filter, which will be described later, is provided with the skeleton of an organic substance which can interact with the organic impurity.

Examples of the skeleton of an organic substance which can interact with the organic impurity include a chemical structure which can react with the organic impurity so as to make the organic impurity trapped in the organic impurity adsorption filter. More specifically, in a case where the organic impurity includes dioctyl phthalate, diisononyl phthalate, dioctyl adipate, or dibutyl phthalate, examples of the skeleton of an organic substance include a benzene ring skeleton. Furthermore, in a case where the organic impurity includes ethylene propylene rubber, examples of the skeleton of an organic substance include an alkylene skeleton. In addition, in a case where the organic impurity includes long chain n-alkyl alcohol (structural isomer in a case where long chain 1-alkyl alcohol is used as a solvent), examples of the skeleton of an organic substance include an alkyl group.

Examples of the base material (material) constituting the organic impurity adsorption filter include cellulose supporting active carbon, diatomite, nylon, polyethylene, polypropylene, polystyrene, a fluororesin, and the like.

Furthermore, as an organic impurity removing filter, it is possible to use the filters obtained by fixing activated carbon to non-woven cloth that are described in JP2002-273123A and JP2013-150979A.

The organic impurity removing treatment is not limited to the aspect in which an organic impurity adsorption filter which can adsorb organic impurities as described above is used, and may adopt, for example, an aspect in which organic impurities are physically trapped. In many cases, the organic impurity having a relatively high boiling point such as a boiling point equal to or higher than 250° C. is coarse (for example, a compound having 8 or more carbon atoms). Therefore, in a case where a filter having a pore size of about 1 nm is used, the organic impurity can be physically trapped.

For example, in a case where the solution contains dioctyl phthalate as an organic impurity, the structure of the dioctyl phthalate is larger than 10 Å (=1 nm). Accordingly, in a case where an organic impurity removing filter having a pore size of 1 nm is used, the dioctyl phthalate cannot pass through the pore of the filter. That is, by being physically trapped by the filter, the dioctyl phthalate is removed from the solution to be purified. In this way, for removing an organic impurity, not only a chemical interaction but also a physical removing method can be used. Here, in this case, a filter having a pore size equal to or greater than 3 nm is used as "filtering member" which will be described later, and a filter having a pore size less than 3 nm is used as "organic impurity removing filter".

In the present specification, 1 Å (angstrom) equals 0.1 nm.

The purification step of the present invention may further have, for example, a purification treatment V and a purification treatment VI which will be described later. The purification treatment V and the purification treatment VI may be performed at any timing. For example, the purification treatment V and the purification treatment VI may be performed after the purification treatment IV is performed.

The purification treatment V is a filtering treatment in which a metal ion adsorption member is used for the purpose of removing metal ions.

The purification treatment VI is a filtering treatment for removing coarse particles.

Hereinafter, the purification treatment V and the purification treatment VI will be described.

One of the examples of means for removing metal ions in the purification treatment V includes filtering in which a metal ion adsorption member comprising a metal ion adsorption filter is used.

The metal ion adsorption member is constituted with at least one metal ion adsorption filter, and may be constituted with a plurality of metal ion adsorption filters which are stacked according to the intended purification level. Generally, the metal ion adsorption member is constituted with the metal ion adsorption filter and a base material to which the metal ion adsorption filter is fixed.

The metal ion adsorption filter comprises a function of adsorbing metal ions in the solution to be purified. The metal ion adsorption filter is preferably a filter which can perform ion exchange.

Herein, the metal ions to be adsorbed are not particularly limited but are preferably Fe, Cr, Ni, and Pb because these readily become the cause of a defect in a semiconductor device.

From the viewpoint of improving the metal ion adsorption performance, it is preferable that the metal ion adsorption filter has an acid group on the surface thereof. Examples of the acid group include a sulfo group, a carboxy group, and the like.

Examples of the base material (material) constituting the metal ion adsorption filter include cellulose, diatomite, nylon, polyethylene, polypropylene, polystyrene, a fluororesin, and the like.

One of other examples of means for removing metal ions includes filtering in which a filter constituted with material including polyimide and/or polyamide imide is used. Examples thereof include filtering in which a metal ion adsorption member comprising a polyimide and/or polyamide imide porous membrane described in JP2016-155121A as a metal ion adsorption filter is used. The polyimide and/or polyamide imide porous membrane used in the filtering may have at least one group selected from the group consisting of a carboxy group, a salt-type carboxy group, and a —NH— bond.

From the viewpoint of solvent resistance, it is preferable to use fluorinated polyimide and/or fluorinated polyamide imide.

One of the examples of filtering means in the purification treatment VI includes an aspect in which filtering is performed using a filtering member comprising a filter for removing particles having a diameter equal to or smaller than 20 nm. In a case where the aforementioned filter is additionally used for the solution to be purified, impurities in the form of particles can be removed from the solution to be purified. Examples of "impurities in the form of particles" include particles of dirt, dust, organic solids, inorganic solids, and the like contained in raw materials as impurities at the time of manufacturing the solution to be purified, particles of dirt, dust, organic solids, inorganic solids, and the like incorporated as contaminants into the solution to be purified at the time of purifying the solution to be purified, and the like. The impurities in the form of particles correspond to the objects that are finally present as particles in the solution to be purified without being dissolved.

Furthermore, "impurities in the form of particles" also include colloidized impurities containing metal atoms. The metal atoms are not particularly limited. However, in a case where the content of at least one kind of metal atom selected from the group consisting of Na, K, Ca, Fe, Cu, Mg, Mn, Li, Al, Cr, Ni, Zn, and Pb (preferably Fe, Cr, Ni, and Pb) is particularly small (for example, in a case where the content of each of the aforementioned metal atoms in the solution to be purified is equal to or smaller than 1,000 mass ppt), the impurities containing these metal atoms are easily colloidized. It is likely that the colloidized impurities will not be easily removed with the aforementioned metal ion adsorption member. Accordingly, in a case where a filter for removing particles having a diameter equal to or smaller than 20 nm (for example, a microfiltration membrane having a pore size equal to or smaller than 20 nm) is used, the colloidized impurities can be effectively removed.

The impurities in the form of particles have a size that enables the impurities to be removed by a filter for removing particles having a diameter equal to or smaller than 20 nm. Specifically, the impurities in the form of particles are particles having a diameter equal to or greater than 20 nm. In the present specification, the impurities in the form of particles will be referred to as "coarse particles" in some cases.

Particularly, the diameter of the particles to be removed by the aforementioned filter is preferably 1 to 15 nm, and more preferably 1 to 12 nm. In a case where the diameter of the particles to be removed is equal to or smaller than 15 nm, the impurities in the form of finer particles can be removed. In a case where the diameter of particles to be removed is equal to or greater than 1 nm, the filtering efficiency of the solution to be purified is improved.

The diameter of particles to be removed means the minimum size of particles that can be removed by the filter. For example, in a case where the diameter of particles to be removed by the filter is 20 nm, the filter can remove particles having a particle diameter equal to or greater than 20 nm.

Examples of the material of the aforementioned filter include 6-nylon, 6,6-nylon, polyethylene, polypropylene, polystyrene, polyimide and/or polyamide imide, a fluororesin, and the like. The polyimide and/or polyamide imide may have at least one group selected from the group consisting of a carboxy group, a salt-type carboxy group, and a —NH— bond. From the viewpoint of solvent resistance, the polyimide and/or polyamide imide may be fluorinated polyimide and/or fluorinated polyamide imide.

The filtering member may further comprise a filter for removing particles having a diameter equal to or greater than 50 nm (for example, a microfiltration membrane for removing fine particles having a pore size equal to or greater than 50 nm). In a case where fine particles are present in the solution in addition to the colloidized impurities, particularly, colloidized impurities containing metal atoms such as iron or aluminum, by filtering the solution to be purified by using a filter for removing particles having a diameter equal to or greater than 50 nm (for example, a microfiltration membrane for removing fine particles having a pore size equal to or greater than 50 nm) before filtering the solution by using a filter for removing particles having a diameter equal to or smaller than 20 nm (for example, a microfiltration membrane having a pore size equal to or smaller than 20 nm), the filtering efficiency of the filter for removing particles having a diameter equal to or smaller than 20 nm (for example, a microfiltration membrane having a pore size equal to or smaller than 20 nm) is improved, and the coarse particle removing performance is further improved.

The solution to be purified that is obtained through each of the above treatments can be used for composing the solution according to the embodiment of the present invention or can be used as the solution according to the embodiment of the present invention.

Hitherto, as an example of the aforementioned purification step, a case where all of the treatments are performed has been described. However, the present invention is not limited thereto. Each of the treatments may be performed singly, or a plurality of the treatments may be performed in combination. Furthermore, each of the treatments may be performed once or plural times.

As the method for making the content of the organic impurity having a boiling point equal to or higher than 250° C., the metal component, and water contained in the solution fall into the desired range, in addition to the above purification step, for example, it is possible to use a method of storing the raw material of the organic solvent, which composes the solution and has a boiling point lower than 200° C., or the solution in a container which hardly causes the elution of impurities. Furthermore, for example, it is possible to use a method of lining the inner wall of "pipe" with a fluororesin so as to prevent metal components from being eluted from the pipe and the like at the time of manufacturing the solution.

[Container (Storage Container)]

The solution according to the embodiment of the present invention can be stored, transported, and used by being filled into any container as long as corrosiveness and the like do not become issues.

As the container, a container for a semiconductor is preferable which has a high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these. It is preferable that the inner wall of the container (solution contact portion contacting the solution in the container) is formed of a nonmetallic material.

As the nonmetallic material, at least one kind of material selected from the group consisting of a polyethylene resin, polypropylene resin, a polyethylene-polypropylene resin, a tetrafluoroethylene resin (PTFE), a tetrafluoroethylene-perfluoroalkyl vinyl ether copolymer (PFA), a tetrafluoroethylene-hexafluoropropylene copolymer resin (FEP), a tetrafluoroethylene-ethylene copolymer resin (ETFE), a chlorotrifluoro ethylene-ethylene copolymer resin (ECTFE), a vinylidene fluoride resin (PVDF), a chlorotrifluoroethylene copolymer resin (PCTFE), and a vinyl fluoride resin (PVF) is more preferable.

Particularly, in a case where a container whose inner wall is formed of a fluororesin among the above materials is used, the occurrence of a problem such as elution of an ethylene or propylene oligomer can be further reduced than in a case where a container whose inner wall is formed of a polyethylene resin, a polypropylene resin, or a polyethylene-polypropylene resin is used.

Specific examples of the container whose inner wall is formed of a fluororesin include FluoroPure PFA composite drum manufactured by Entegris, Inc., and the like. Furthermore, it is possible to use the containers described on p. 4 in JP1991-502677A (JP-H03-502677A), p. 3 in WO2004/016526A, p. 9 and p. 16 in WO99/046309A, and the like.

In a case where the nonmetallic material is used as the inner wall, it is preferable that the organic components in the nonmetallic material are inhibited from being eluted to the solution.

For the inner wall of the container, in addition to the aforementioned nonmetallic material, quartz or a metallic material (more preferably an electropolished metallic material, in other words, a metallic material finished up with electropolishing) is also preferably used.

It is preferable that the metallic material (particularly, the metallic material used for manufacturing the electropolished metallic material) contains chromium in an amount greater than 25% by mass with respect to the total mass of the metallic material, and examples of such a material include stainless steel.

The content of chromium in the metallic material with respect to the total mass of the metallic material is preferably equal to or greater than 30% by mass. The upper limit of the content of chromium is not particularly limited, but is preferably equal to or smaller than 90% by mass in general.

As the stainless steel, known stainless steel can be used without particular limitation. Particularly, an alloy in which the content of nickel is equal to or greater than 8% by mass is preferable, and austenite-based stainless steel in which the content of nickel is equal to or greater than 8% by mass is more preferable. Examples of the austenite-based stainless steel include steel use stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may become higher than the chromium content in the parent phase. Presumably, for this reason, from the inner wall coated with the electropolished metallic material, metal components may not easily leak into the solution, and a solution with reduced metal components (metal impurities) can be obtained.

It is preferable that the metallic material is finished up with buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material.

It is preferable that the buffing is performed before the electropolishing.

Furthermore, the metallic material may be obtained by performing one of multiple-stage buffing, which is carried out by changing sizes of abrasive grains and the like, acid washing, magnetic fluid polishing, and the like or obtained by performing two or more kinds of the above processing in combination.

In the present invention, a substance which has the aforementioned container and the aforementioned solution stored in the container is referred to as a solution storage body in some cases.

It is preferable that the interior of the aforementioned container is washed before the container is filled with the solution. In a case where the solution according to the embodiment of the present invention or a solution obtained by diluting the solution according to the embodiment of the present invention is used as a liquid for washing, the effects of the present invention become more apparent. After being manufactured, the solution according to the embodiment of the present invention may be bottled using a container such as a gallon bottle or a quart bottle and transported and stored as it is. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 20° C.

(Clean Room)

It is preferable that all of the manufacturing of the solution according to the embodiment of the present invention, the opening and/or washing of the storage container, the handling including filling with the solution and the like, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

(Filtering)

It is preferable that the solution according to the embodiment of the present invention is subjected to filtering such that the content of the organic impurity having a boiling point equal to or higher than 250° C., the metal component, and water falls into the desired range and that foreign substances, coarse particles, and the like are removed.

As a filter used for filtering, those used for filtering in the related art can be used without particular limitation. Examples of materials constituting the filter include a fluororesin such as polytetrafluoroethylene (PTFE), a polyamide-based resin such as nylon, a polyolefin resin (including a high-density polyolefin resin and an ultrahigh molecular-weight polyolefin resin) such as polyethylene and polypropylene (PP), and the like. Among these, a polyamide-based resin, PTFE, and polypropylene (including high-density polypropylene) are preferable. In a case where a filter formed of these materials is used, it is possible to more effectively remove foreign substances having high polarity that readily become the cause of a particle defect and to more efficiently reduce the amount of the metal component (metal impurity).

The lower limit of the critical surface tension of the filter is preferably equal to or higher than 70 mN/m. The upper limit of the critical surface tension of the filter is preferably equal to or lower than 95 mN/m. Particularly, the critical surface tension of the filter is more preferably equal to or higher than 75 mN/m and equal to or lower than 85 mN/m.

The value of the critical surface tension is the nominal value from manufacturers. In a case where a filter having critical surface tension within the above range is used, it is possible to more effectively remove foreign substances having high polarity that readily become the cause of a particle defect and to more efficiently reduce the amount of the metal component (metal impurity).

The filter used for filtering is not particularly limited as long as it has been used for filtering in the related art. Examples of materials constituting the filter include a fluororesin such as polytetrafluoroethylene (PTFE), a polyamide-based resin such as nylon, a polyolefin resin (including a high-density polyolefin resin and an ultrahigh molecular-weight polyolefin resin) such as polyethylene and polypropylene (PP), and the like. Among these, polypropylene (including high-density polypropylene) and nylon are preferable.

The pore size of the filter is preferably about 0.001 to 1.0 µm, more preferably about 0.01 to 0.5 µm, and even more preferably about 0.01 to 0.1 µm. In a case where the pore size of the filter is within the above range, it is possible to reliably remove fine foreign substances contained in the solution while inhibiting filter clogging.

At the time of using the filter, different filters may be combined. At this time, filtering carried out using a first filter may be performed once or performed two or more times. In a case where filtering is performed two or more times by using different filters in combination, the filters may be of the same type or different types, but it is preferable that the filters are of different types. Typically, it is preferable that at least one of the pore size or the constituent material varies between the first filter and the second filter.

It is preferable that the pore size for the second filtering and the next filtering is the same as or smaller than the pore size for the first filtering. Furthermore, first filters having different pore sizes within the above range may be combined. As the pore size mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 µm, critical surface tension: 77 mN/m)" made of polyamide; (manufactured by Pall Corporation Japan), "PE-CLEAN FILTER (pore size: 0.02 µm)" made of high-density polyethylene; (manufactured by Pall Corporation Japan), and "PE-CLEAN FILTER (pore size: 0.01 µm)" made of high-density polyethylene; (manufactured by Pall Corporation Japan).

For example, from the viewpoint of further improving the effects of the solution according to the embodiment of the present invention and from the viewpoint of inhibiting the increase of particulate metals during the storage of the purified solution, provided that an interaction radius in the Hansen solubility parameter space (HSP) derived from the material of the filter used for filtering is R0, and that a radius of a sphere in the Hansen space derived from the liquid contained in the solution is Ra, it is preferable that the solution used in an aspect of the present application and the material of the filter used for filtering are combined such that the solution and the filter have a relationship satisfying a relational expression of $(Ra/R0) \leq 1$, although the combination of the solution and the filter is not particularly limited. Ra/R0 is preferably equal to or smaller than 0.98, and more preferably equal to or smaller than 0.95. The lower limit of the Ra/R0 is preferably equal to or greater than 0.5, more preferably equal to or greater than 0.6, and even more preferably 0.7. In a case where Ra/R0 is within the above range, the formation of a particulate metal or the growth of a particulate metal during long-term storage is inhibited, although the mechanism is unclear.

The combination of the filter and the solution is not particularly limited, and examples thereof include those described in US2016/0089622.

As a second filter, a filter formed of the same material as the aforementioned first filter can be used. Furthermore, a filter having the same pore size as the aforementioned first filter can be used. In a case where a filter having a pore size smaller than that of the first filter is used as the second filter, a ratio between the pore size of the second filter and the pore size of the first filter (pore size of second filter/pore size of first filter) is preferably 0.01 to 0.99, more preferably 0.1 to 0.9, and even more preferably 0.2 to 0.9. In a case where the pore size of the second filter is within the above range, fine foreign substances intermixed with the solution are more reliably removed.

In the present invention, in a case where the content of one kind of metal element or two or more kinds of metal elements selected from the group consisting of Na, K, Ca, Fe, Cu, Mg, Mn, Li, Al, Cr, Ni, Pb, and Zn in the solution is particularly small (for example, in a case where the content rate of each of the above metal elements in the solution is equal to or lower than 1,000 mass ppt), impurities containing these metal elements tend to be easily colloidized. Therefore, it is likely that the colloidized impurities are not easily removed with an ion adsorption membrane. Therefore, the inventors of the present invention have found that in a case where the solution is purified using a microfiltration membrane having a pore size equal to or smaller than 20 nm, the colloidized impurity components can be removed.

Furthermore, in a case where fine particles are also present in the solution in addition to the colloidized impurities (particularly, colloidized impurities containing a metal element such as iron or aluminum), it is preferable that the solution is purified by being filtered using a microfiltration membrane for removing fine particles having a pore size equal to or greater than 50 nm, before being filtered using a microfiltration membrane having a pore size equal to or smaller than 20 nm.

It is preferable that the solution according to the embodiment of the present invention is purified using ion adsorption means in addition to the aforementioned filter. The ion adsorption means is preferably constituted with cellulose, diatomite, nylon, polyethylene, polypropylene, polystyrene, or a fluororesin whose surface is modified with either or both of an anionic group such as a sulfo group or a carboxy group and a cationic group. The ion adsorption means modified with an anionic group can remove a cation such as a Na ion and a Ca ion, and the ion adsorption means modified with a cationic group can remove an anion such as a Cl ion and an acid component. For the ion adsorption means, according to the purpose, an anionic group or a cationic group may be used singly, or an anionic group and a cationic group may be used in combination. The ion adsorption means may be a filter.

The aforementioned filtering step may be repeated plural times according to the purpose.

It is preferable that the filter to be used is treated before filtering the solution. The liquid used for the treatment is not particularly limited. In a case where the solution according to the embodiment of the present invention or a solution obtained by diluting the solution according to the embodiment of the present invention is used, the desired effects of the present invention are more apparently obtained.

In a case where filtering is performed, the upper limit of the temperature at the time of filtering is preferably equal to or lower than room temperature (25° C.), more preferably equal to or lower than 23° C., and even more preferably equal to or lower than 20° C. The lower limit of the temperature at the time of filtering is preferably equal to or higher than 0° C., more preferably equal to or higher than 5° C., and even more preferably equal to or higher than 10° C.

By the filtering, particulate foreign substances or impurities can be removed. In a case where the filtering is performed at the above temperature, the amount of particulate foreign substances and impurities dissolved in the solution is reduced, and hence the filtering is more efficiently performed.

Particularly, from the viewpoint of adjusting the content of the metal component (metal impurity), it is preferable that filtering is performed at the above temperature. It is considered that many of the metal components (metal impurities) may be present in a particulate colloidal state, although the mechanism is unclear. In a case where filtering is performed at the above temperature, some of the metal components (metal impurities) floating in the form of colloid are aggregated, and hence the aggregated metal components are efficiently removed by filtering. It is considered that for this reason, the content of the metal component (metal impurity) can be easily adjusted to be the desired amount.

The filtering pressure affects the filtering accuracy. Therefore, it is preferable that the pulsation of pressure at the time of filtering is as low as possible.

In a case where two or more filters are used, the differential pressure before and after the solution passes through each of the filters (hereinafter, referred to as "differential pressure of filtering" as well) is not particularly limited, but is preferably equal to or lower than 250 kPa and more preferably equal to or lower than 200 kPa. The lower limit thereof is not particularly limited, but is preferably equal to or higher than 50 kPa. In a case where the differential pressure of filtering is equal to or lower than 250 kPa, it is possible to prevent an excessive pressure from being applied to the filter, and hence the eluted substances are expected to be reduced.

In the preparation and purification of the solution according to the embodiment of the present invention, the filtering speed is not particularly limited. However, from the viewpoint of further improving the effects of the present invention, the filtering speed is preferably equal to or higher than 1.0 L/min/m$^2$, more preferably equal to or higher than 0.75 L/min/m$^2$, and even more preferably equal to or higher than 0.6 L/min/m$^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/m$^2$ although the upper limit usually depends on the endurable differential pressure of the filter.

In the preparation and purification of the solution according to the embodiment of the present invention, from the viewpoint of further improving the effects of the present invention, the filtering pressure is preferably equal to or higher than 0.001 Mpa and equal to or lower than 1.0 MPa, more preferably equal to or higher than 0.003 MPa and equal to or lower than 0.5 MPa, and particularly preferably equal to or higher than 0.005 MPa and equal to or lower than 0.3 MPa.

Particularly, in a case where a filter having a small pore size is used, by increasing the filtering pressure, it is possible to efficiently reduce the amount of particulate foreign substances or impurities dissolved in the solution. In a case where a filter having a pore size smaller than 20 nm is used, the filtering pressure is particularly preferably equal to or higher than 0.005 MPa and equal to or lower than 0.3 MPa.

The smaller the pores size of the filtration filter membrane, the lower the filtering speed. However, for example, in a case where a plurality of filters equipped with the same type of filtration filter membrane are connected to each other in parallel, the filtering area is enlarged, and the filtering pressure is reduced. Therefore, in this way, the reduction in the filtering speed can be compensated.

The filter may be washed before being used. The method for washing the filter is not particularly limited, and examples thereof include a method of immersing the filter in a wash solution, a method of causing a wash solution to pass through the filter, and a method obtained by combining these.

In a case where the filter is washed, it is easy to control the amount of components extracted from the filter, and consequently, a solution having the further improved effects of the present invention is obtained.

As the wash solution, known wash solutions can be used without particular limitation. Examples of the wash solution are not particularly limited and include water, an organic solvent, and the like. The organic solvent may be an organic solvent that the solution can contain, such as alkylene glycol monoalkyl ether carboxylate, alkylene glycol monoalkyl ether, lactic acid alkyl ester, alkoxyalkyl propionate, cyclic lactone (preferably having 4 to 10 carbon atoms), a monoketone compound (preferably having 4 to 10 carbon atoms) which may have a ring, alkylene carbonate, alkoxyalkyl acetate, or alkyl pyruvate.

More specifically, examples of the wash solution include propylene glycol monomethyl ether, propylene glycol monomethyl ether acetate, dimethylsulfoxide, n-methylpyrrolidone, diethylene glycol, ethylene glycol, dipropylene glycol, propylene glycol, ethylene carbonate, propylene carbonate, sulfolane, cyclohexane, cyclohexanone, cycloheptanone, cyclopentanone, 2-heptanone, γ-butyrolactone, a mixture of these, and the like.

Before the washing, a step of wetting the filter with an organic solvent (for example, immersion) may be additionally performed. In a case where the step of wetting the filter with an organic solvent in advance is performed, wet particles are reduced, and hence the filtering efficiency is improved.

The organic solvent used in the wetting step is not particularly limited, and examples thereof include the organic solvents exemplified in the section of <Organic solvent having boiling point lower than 200° C.>. Furthermore, although the organic solvent is not particularly limited, in a case where the organic solvent has surface tension lower than that of the solution to be manufactured, the filtering efficiency is improved.

It is preferable that the aforementioned organic solvent and the aforementioned wash solution are high-purity products having a small amount of impurities. The organic solvent and the wash solution may be the same as the solution to be manufactured.

[Electricity Removing Step]

The preparation and purification of the solution according to the embodiment of the present invention may further include an electricity removing step. The electricity removing step is a step of removing electricity from at least one kind of substance (hereinafter, referred to as "purified substance or the like") selected from the group consisting of a raw material, a reactant, and a purified substance such that the charge potential of the purified substance or the like is reduced.

As the electricity removing method, known electricity removing methods can be used without particular limitation. Examples of the electricity removing method include a method of bringing the purified substance or the like into contact with a conductive material.

The contact time for which the purified substance or the like is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method of bringing the purified substance or the like into contact with a conductive material include a method of disposing a grounded mesh formed of a conductive material in the interior of a pipe line and passing the purified substance or the like through the mesh, and the like.

The electricity removing step may be performed at any point in time between the supply of raw materials and the filling of the purified substance. For example, it is preferable that the electricity removing step is performed before at least one step selected from the group consisting of the raw material supply step, the reaction step, the solution preparation step, the purification step, the filtering step, and the filling step. It is particularly preferable that the electricity removing step is performed before the purified substance or the like is filled into the container used in each of the above steps. In a case where the electricity removing step is performed at such a point in time, the impurities derived from the container or the like can be inhibited from being intermixed with the purified substance or the like.

[Actinic Ray-Sensitive or Radiation-Sensitive Resin Composition]

The actinic ray-sensitive or radiation-sensitive resin composition according to the embodiment of the present invention contains the solution according to the embodiment of the present invention.

The makeup of the actinic ray-sensitive or radiation-sensitive resin composition is not particularly limited as long as the composition contains the solution according to the embodiment of the present invention as a diluent of resist materials (solid component, such as a resin, a photoacid generator, and a photopolymerization initiator which are contained in the actinic ray-sensitive or radiation-sensitive resin composition and form a resist film). The actinic ray-sensitive or radiation-sensitive resin composition may be any of a negative composition or a positive composition.

As the resist materials contained in the actinic ray-sensitive or radiation-sensitive resin composition, known materials can be used.

As the resin, a resin whose polarity changes by the action of an acid is particularly preferable. As the resin, a resin P having a group, which generates a polar group by being decomposed by the action of an acid, is more preferable. As the aforementioned resin, a resin having a repeating unit represented by Formula (AI), which will be described later, is more preferable which is a resin whose solubility in a developer, which contains an organic solvent as a main component, is reduced by the action of an acid. The resin having a repeating unit represented by Formula (AI) has a group which generates an alkali-soluble group by being decomposed by the action of an acid (hereinafter, referred to as "acid-decomposable group" as well). Particularly, in a case where the solution according to the embodiment of the present invention is used for this type of resin, the permeability of the solution with respect to the resist materials is enhanced, and hence the defect resulting from a development residue is inhibited. Accordingly, the desired effects of the present invention are more apparently obtained.

Examples of the polar group include an alkali-soluble group. Examples of the alkali-soluble group include a carboxy group, a fluorinated alcohol group (preferably a hexafluoroisopropanol group), a phenolic hydroxyl group, and a sulfonic acid group.

In the acid-decomposable group, the polar group is protected with a group dissociated by an acid (acid-dissociable group). Examples of the acid-dissociable group include —$C(R_{36})(R_{37})(R_{38})$, —$C(R_{36})(R_{37})(OR_{39})$, —$C(R_{01})(R_{02})(OR_{39})$, and the like.

In the formulae, $R_{36}$ to $R_{39}$ each independently represent an alkyl group, a cycloalkyl group, an aryl group, an aralkyl group, or an alkenyl group. $R_{36}$ and $R_{37}$ may form a ring by being bonded to each other.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer, which contains an organic solvent as a main component, is reduced by the action of an acid will be specifically described.

(Formula (AI): Repeating Unit Having Acid-Decomposable Group)

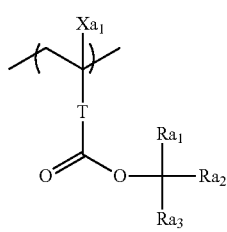

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may form a cycloalkyl group (monocyclic or polycyclic) by being bonded to each other.

Examples of the alkyl group represented by $Xa_1$ which may have a substituent include a methyl group and a group represented by —$CH_2$—$R_{11}$. $R_{11}$ represents a halogen atom (a fluorine atom or the like), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group formed by bonding of two groups out of $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group, and more preferably a monocyclic cycloalkyl group having 5 or 6 carbon atoms.

In the cycloalkyl group formed by bonding of two groups out of $Ra_1$ to $Ra_3$, for example, one methylene group constituting the ring may be substituted with a heteroatom such as an oxygen atom or a group having a heteroatom such as a carbonyl group.

As the repeating unit represented by Formula (AI), for example, an aspect is preferable in which $Ra_1$ is a methyl group or an ethyl group, and $Ra_2$ and $Ra_3$ form the aforementioned cycloalkyl group by being bonded to each other.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The total content of the repeating unit represented by Formula (AI) with respect to all the repeating units in the resin P is preferably 20 to 90 mol %, more preferably 25 to 85 mol %, and even more preferably 30 to 80 mol %.

Specific examples of the repeating unit represented by Formula (AI) will be shown below, but the present invention is not limited thereto.

In the specific examples, $R_Y$ and $Xa_1$ each independently represent a hydrogen atom, $CH_3$, $CF_3$, or $CH_2OH$. Rxa and Rxb each represent an alkyl group having 1 to 4 carbon atoms. Z represents a substituent containing a polar group. In a case where there is a plurality of Z's, Z's are independent from each other. p represents 0 or a positive integer. Examples of the substituent represented by Z containing a polar group include a linear or branched alkyl group or cycloalkyl group having a hydroxyl group, a cyano group, an amino group, an alkyl amide group, a sulfonamide group, and these groups.

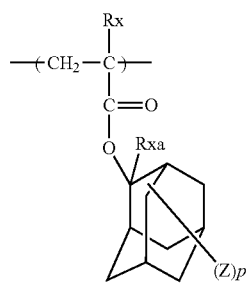

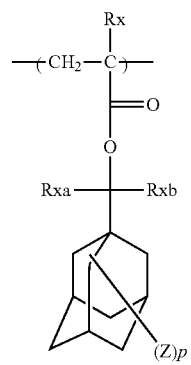

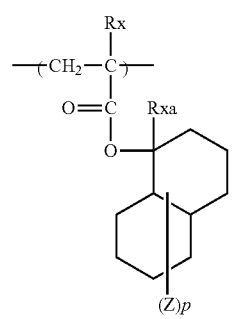

-continued
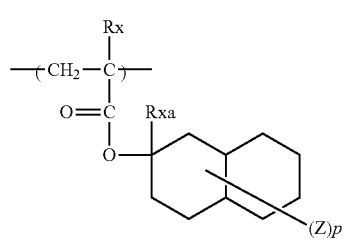
4
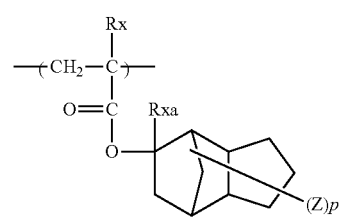
5
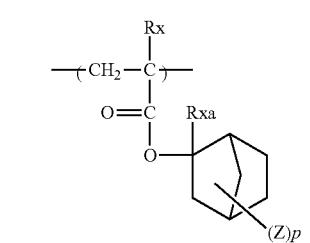
6
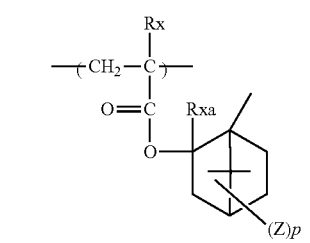
7
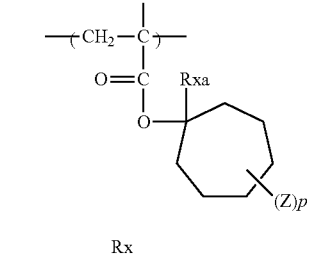
8
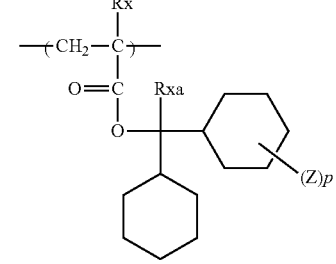
9
-continued
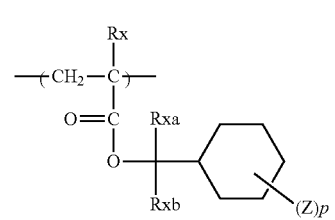
10
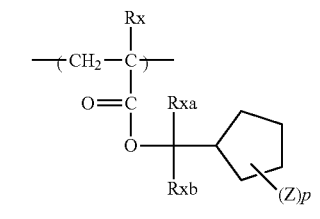
11
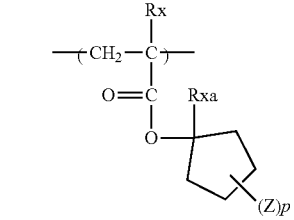
12
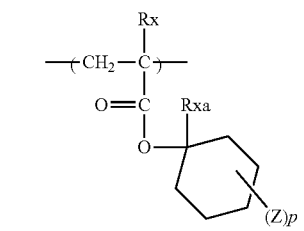
13
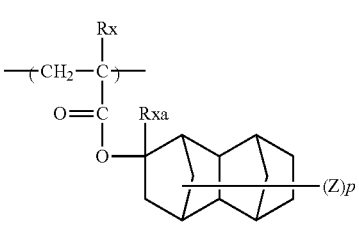
14
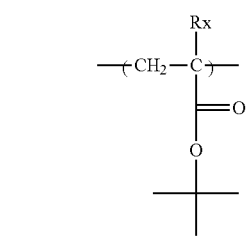
15
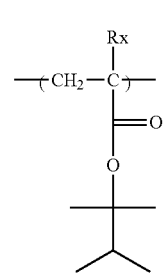
16

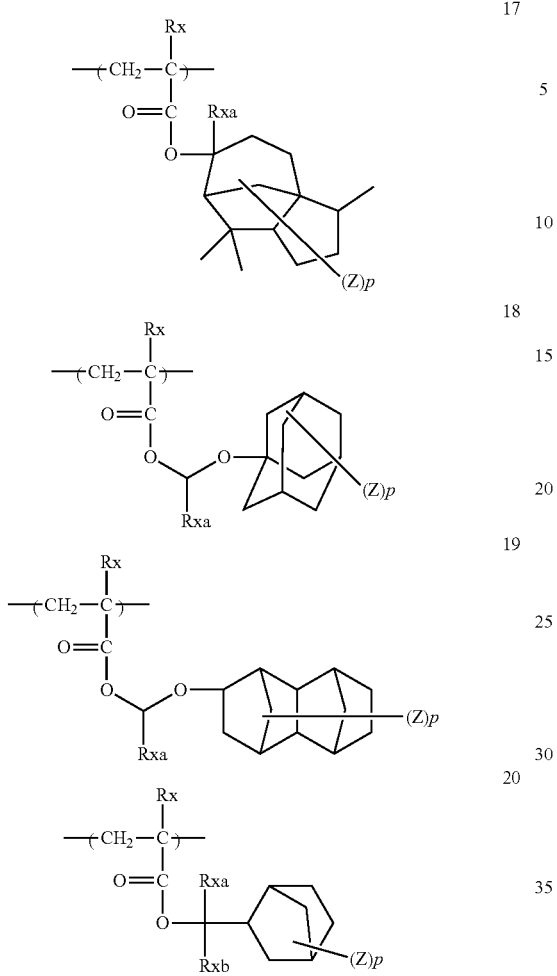

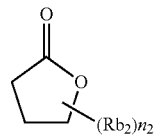
LC1-1

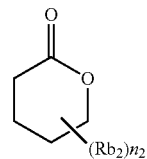
LC1-2

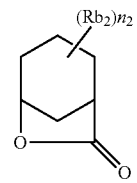
LC1-3

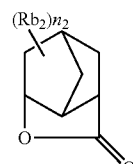
LC1-4

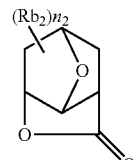
LC1-5

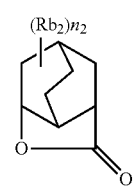
LC1-6

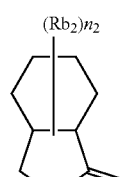
LC1-7

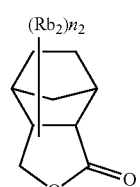
LC1-8

(Repeating Unit Having Lactone Structure)

It is preferable that the resin P contains a repeating unit Q having a lactone structure.

The repeating unit Q having a lactone structure preferably has a lactone structure on a side chain. For example, the repeating unit Q is more preferably a repeating unit derived from a (meth)acrylic acid derivative monomer.

One kind of repeating unit Q having a lactone structure may be used singly, or two or more kinds of repeating units Q may be used in combination. It is preferable to use one kind of repeating unit Q.

The content of the repeating unit Q having a lactone structure with respect to all the repeating units in the resin P is, for example, 3 to 80 mol %, and preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulae (LC1-1) to (LC1-17). As the lactone structure, a lactone structure represented by Formula (LC1-1), Formula (LC1-4), Formula (LC1-5), or Formula (LC1-8) is preferable, and a lactone structure represented by Formula (LC1-4) is more preferable.

LC1-9
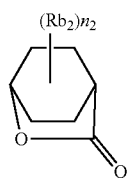

LC1-10
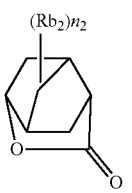

LC1-11
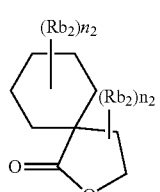

LC1-12
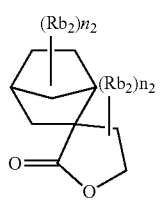

LC1-13
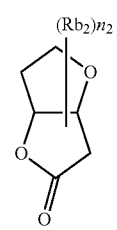

LC1-14
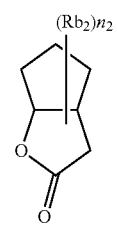

LC1-15
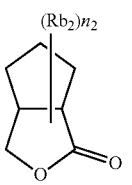

LC1-16
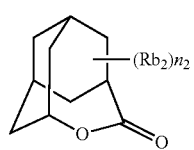

LC1-17
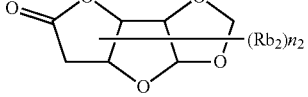

The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and a plurality of substituents ($Rb_2$) may form a ring by being bonded to each other.

The resin P is particularly preferably a resin represented by Formula (I). The resin represented by Formula (I) is a resin formed of a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e).

(I)

(a)
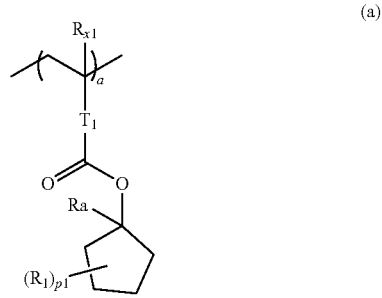

(b)
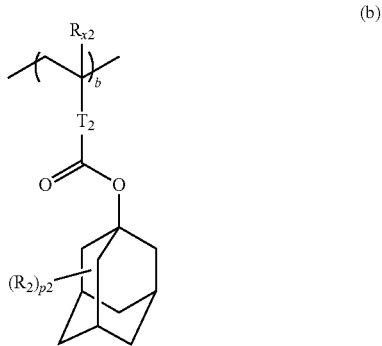

(c)

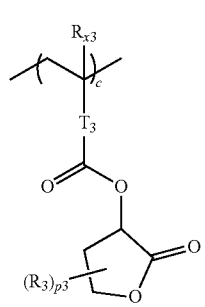

(d)

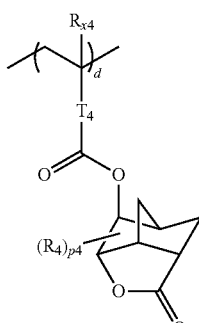

(e)

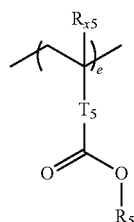

In Formula (I), $R_{x1}$ to $R_{x5}$ each independently represent a hydrogen atom or an alkyl group which may have a substituent.

$R_1$ to $R_4$ each represent a monovalent substituent, and $p_1$ to $p_4$ each independently represent 0 or a positive integer.

$R_a$ represents a linear or branched alkyl group.

$T_1$ to $T_5$ each represent a single bond or a divalent linking group.

$R_5$ represents a monovalent organic group.

a to e each represent mol %. a to e each independently represent a number included in a range of $0 \le a \le 100$, $0 \le b \le 100$, $0 \le c < 100$, $0 \le d < 100$, or $0 \le e < 100$. Here, a+b+c+d+e=100, and a+b≠0.

In Formula (I), the repeating unit (e) has a structure different from all of the repeating units (a) to (d).

in Formula (I), $R_{x1}$ to $R_{x5}$ have the same definition as $Xa_1$ in Formula (AI), and the suitable aspect thereof is also the same.

In Formula (I), $T_1$ to $T_5$ have the same definition as T in Formula (AI), and the suitable aspect thereof is also the same.

In Formula (I), $R_a$ represents a linear or branched alkyl group. Examples thereof include a methyl group, an ethyl group, a t-butyl group, and the like. Among these, a linear or branched alkyl group having 1 to 4 carbon atoms is preferable.

In Formula (I), $R_1$ to $R_4$ each represent a monovalent substituent. $R_1$ to $R_4$ are not particularly limited, and examples thereof include a hydroxyl group, a cyano group, and a linear or branched alkyl group or cycloalkyl group having a hydroxyl group, a cyano group, or the like.

In Formula (I), $p_1$ to $p_4$ each independently represent 0 or a positive integer. The upper limit of p equals the number of hydrogen atoms which can be substituted in each repeating unit.

In Formula (I), $R_5$ represents a monovalent organic group. $R_5$ is not particularly limited, and examples thereof include a monovalent organic group having a sultone structure and a monovalent organic group having a cyclic ether such as dioxolane.

In Formula (I), a to e each represent mol %. a to e each independently represent a number included in a range of $0 \le a \le 100$, $0 \le b \le 100$, $0 \le c < 100$, $0 \le d < 100$, or $0 \le e < 100$. Here, a+b+c+d+e=100, and a+b≠0. A preferable range of each of the content of the repeating unit having an acid-decomposable group and the content of the repeating unit having a lactone structure with respect to all the repeating units in Formula (I) is as described above.

The resin P may contain a repeating unit having a sultone structure.

(Repeating Unit Having Phenolic Hydroxyl Group)

The resin P may contain a repeating unit having a phenolic hydroxyl group.

Examples of the repeating unit having a phenolic hydroxyl group include a repeating unit represented by General Formula (I).

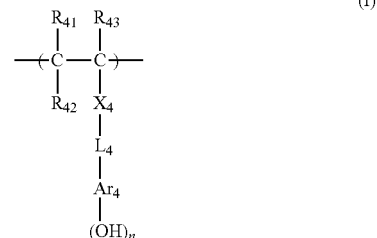

In the formula, $R_{41}$, $R_{42}$, and $R_{43}$ each independently represent a hydrogen atom, an alkyl group, a halogen atom, a cyano group, or an alkoxycarbonyl group. Here, $R_{42}$ and $Ar_4$ may form a ring by being bonded to each other. In this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group. In a case where $Ar_4$ forms a ring by being bonded to $R_{42}$, $Ar_4$ represents a (n+2)-valent aromatic ring group.

n represents an integer of 1 to 5.

The alkyl group represented by $R_{41}$, $R_{42}$, and $R_{43}$ in General Formula (I) is preferably an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group which may have a substituent, more preferably an alkyl group having 8 or less carbon atoms, and even more preferably an alkyl group having 3 or less carbon atoms.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group contained in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents a (n+1)-valent aromatic ring group. Examples of a divalent aromatic ring group obtained in a case where n is 1 include an arylene group having 6 to 18 carbon atoms such as a phenylene group, a tolylene group, a naphthylene group, or an anthracenylene group which may have a substituent and an aromatic ring group containing a hetero ring such as thiophene, furan, pyrrole, benzothiophene, benzofuran, benzopyrrole, triazine, imidazole, benzimidazole, triazole, thiadiazole, or thiazole.

Specific examples of the (n+1)-valent aromatic ring group obtained in a case where n is an integer equal to or greater than 2 include groups obtained by removing (n−1) pieces of any hydrogen atoms from the specific examples of the divalent aromatic ring group described above.

The (n+1)-valent aromatic ring group may further have a substituent.

Examples of the substituent that the alkyl group, the cycloalkyl group, the alkoxycarbonyl group, the alkylene group, and the (n+1)-valent aromatic ring group described above can have include the alkyl group exemplified as $R_{41}$, $R_{42}$, and $R_{43}$ in General Formula (I); an alkoxy group such as a methoxy group, an ethoxy group, a hydroxyethoxy group, a propoxy group, a hydroxypropoxy group, or a butoxy group; and an aryl group such as a phenyl group.

Examples of the alkyl group represented by $R_{64}$ in —$CONR_{64}$— ($R_{64}$ represents a hydrogen atom or an alkyl group) represented by $X_4$ include an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group which may have a substituent. Among these, an alkyl group having 8 or less carbon atoms is more preferable.

$X_4$ is preferably a single bond, —COO—, or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, or an octylene group which may have a substituent.

$Ar_4$ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, $Ar_4$ is preferably a benzene ring group.

The repeating unit having a phenolic hydroxyl group is preferably a repeating unit represented by General Formula (p1).

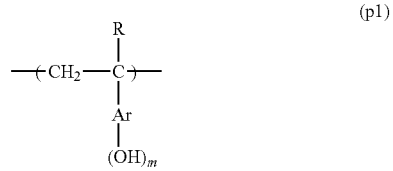

R in General Formula (p1) represents a hydrogen atom, a halogen atom, or a linear or branched alkyl group having 1 to 4 carbon atoms. A plurality of R's may be the same as or different from each other. As R in General Formula (p1), a hydrogen atom is preferable.

Ar in General Formula (p1) represents an aromatic ring, and examples thereof include an aromatic hydrocarbon ring having 6 to 18 carbon atoms that may have a substituent, such as a benzene ring, a naphthalene ring, an anthracene ring, a fluorene ring, or a phenanthrene ring, and an aromatic hetero ring containing a hetero ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. Among these, a benzene ring is more preferable.

m in General Formula (p1) represents an integer of 1 to 5. m is preferably 1.

Specific examples of the repeating unit having a phenolic hydroxyl group will be shown below, but the present invention is not limited thereto. In the formulae, a represents 1 or 2.

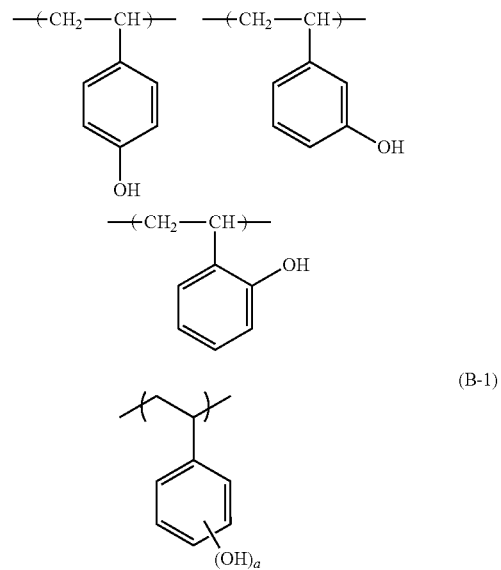

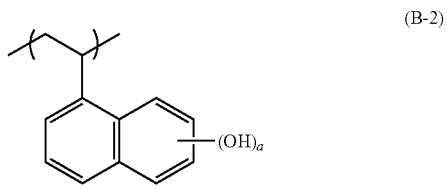

(B-3)
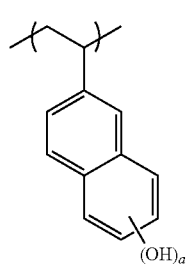
(B-4)
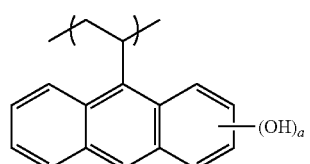
(B-5)
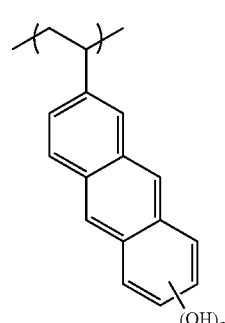
(B-6)
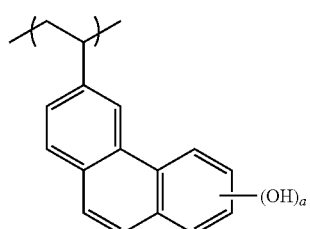
(B-7)
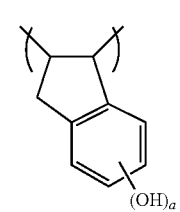
(B-8)
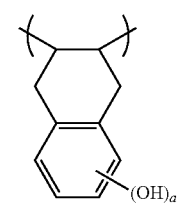
(B-9)
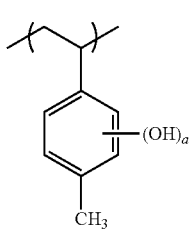
(B-10)
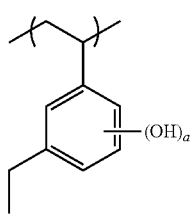
(B-11)
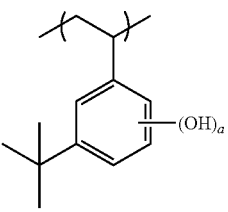
(B-12)
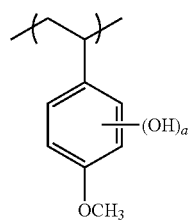
(B-13)
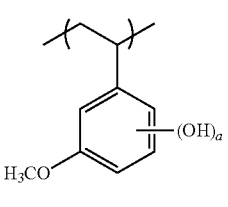
(B-14)
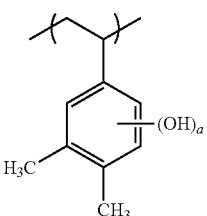
(B-15)
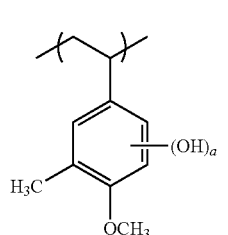
(B-16)

(B-17) 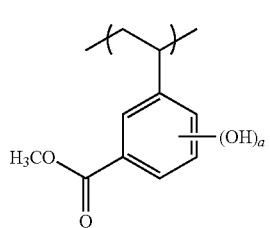
(B-18) 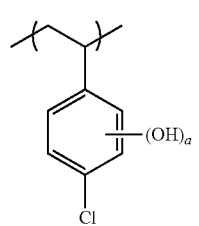
(B-19) 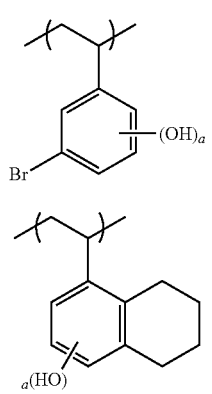
(B-20) 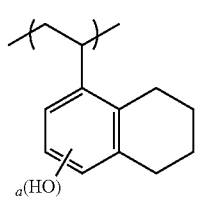
(B-21) 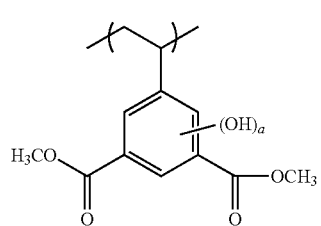
(B-22) 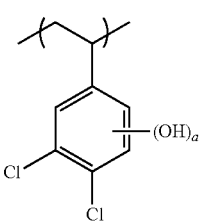
(B-23) 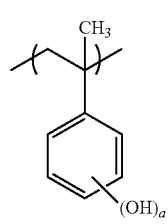
(B-24) 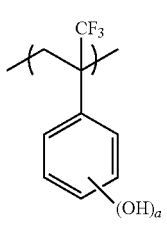
(B-25) 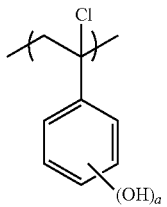
(B-26) 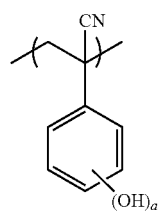
(B-27) 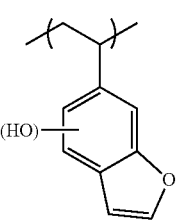
(B-28) 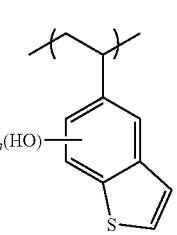
(B-29) 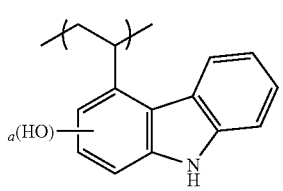
(B-30) 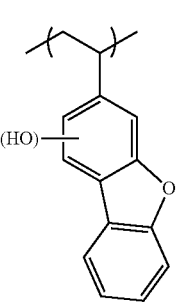

(B-31)
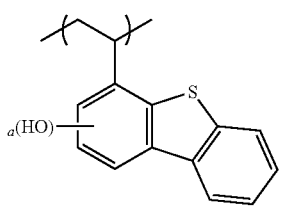

(B-32)
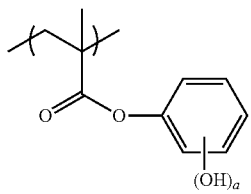

(B-33)
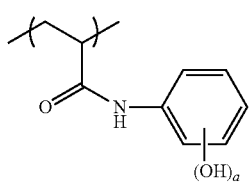

(B-34)
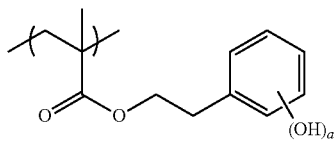

(B-35)
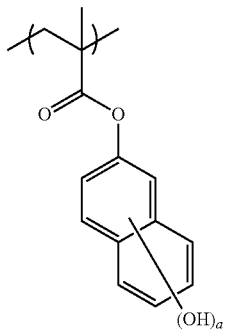

(B-36)
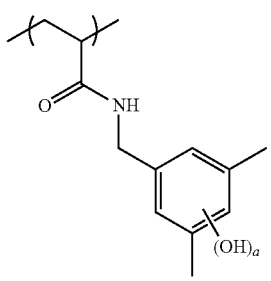

(B-37)
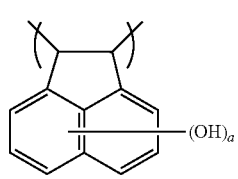

(B-38)
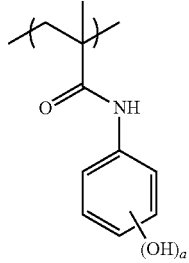

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group.

In a case where the resin P further contains such a repeating unit, the substrate adhesiveness and the affinity with a developer are improved. As the alicyclic hydrocarbon structure of the alicyclic hydrocarbon structure substituted with a polar group, an adamantyl group, a diamantyl group, or a norbornane group is preferable. As the polar group, a hydroxyl group or a cyano group is preferable.

Specific examples of the repeating unit having a polar group will be shown below, but the present invention is not limited thereto.

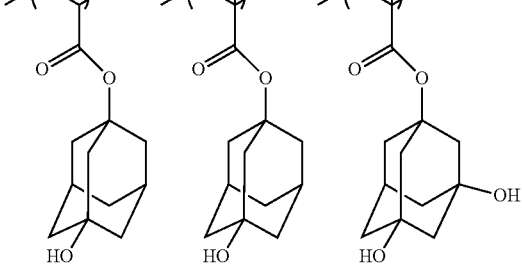

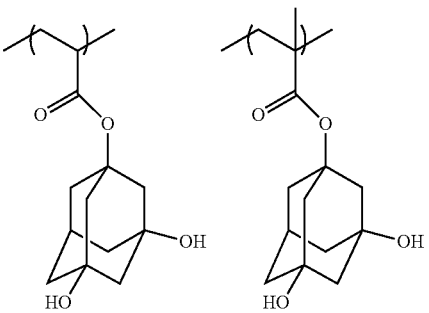

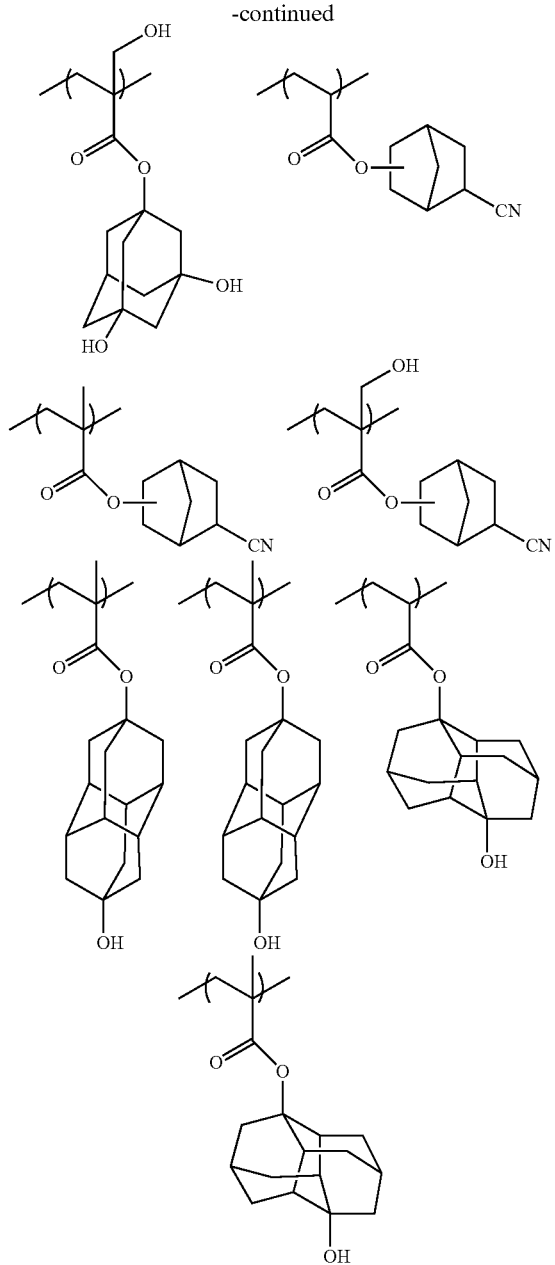

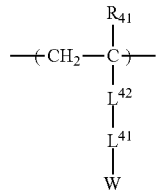

(4)

$R^{41}$ represents a hydrogen atom or a methyl group. $L^{41}$ represents a single bond or a divalent linking group. $L^{42}$ represents a divalent linking group. W represents a structural moiety generating an acid on a side chain by being decomposed by the irradiation of actinic rays or radiation.

Specific examples of the repeating unit represented by General Formula (4) will be shown below, but the present invention is not limited thereto.

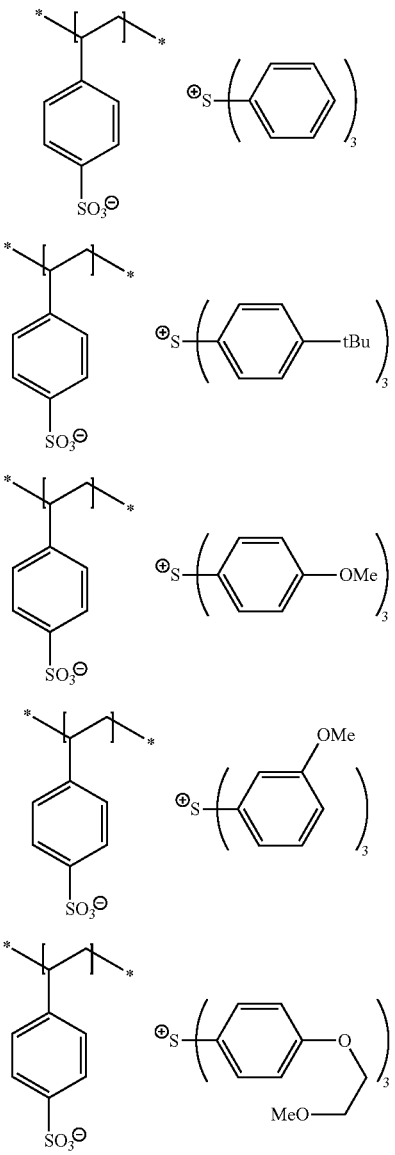

In a case where the resin P contains the repeating unit containing an organic group having a polar group, the content of the repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Having Group (Photoacid Generating Group) Generating Acid by Irradiation of Actinic Rays or Radiation)

The resin P may contain a repeating unit having a group (photoacid generating group) generating an acid by the irradiation of actinic rays or radiation.

Examples of the repeating unit having a group (photoacid generating group) generating an acid by the irradiation of actinic rays or radiation include a repeating unit represented by General Formula (4).

-continued
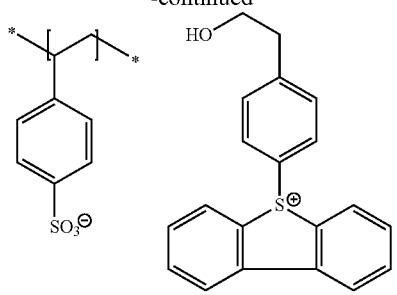
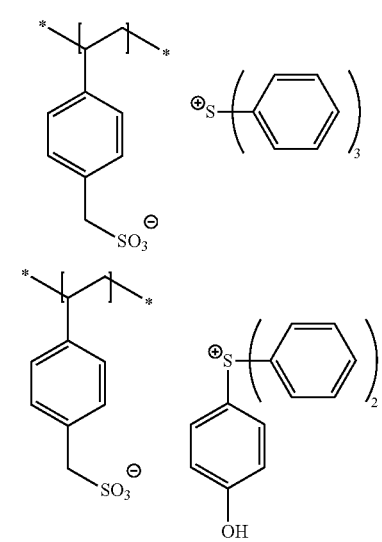
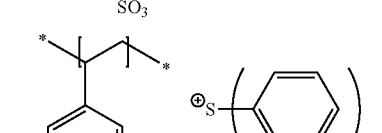
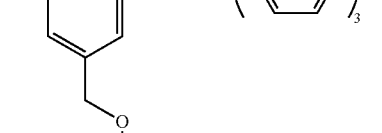
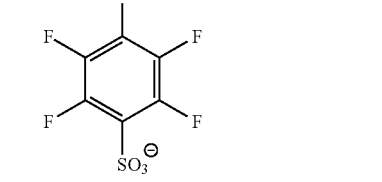
-continued
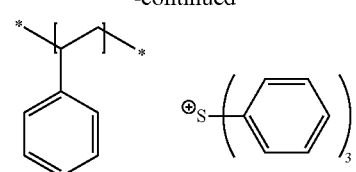
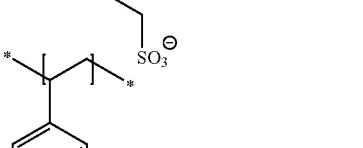
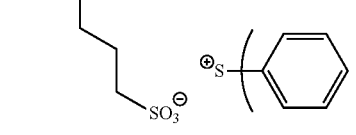
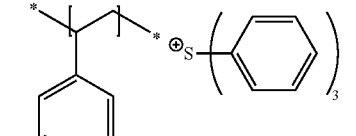
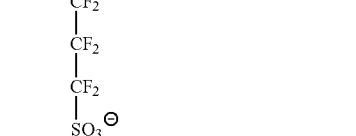
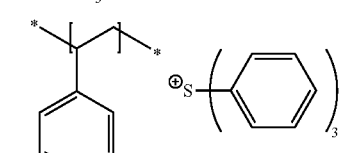
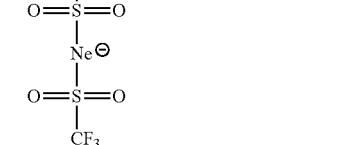

Examples of the repeating unit represented by General Formula (4) also include the repeating units described in paragraphs "0094" to "0105" in JP2014-041327A.

In a case where the resin P contains the repeating unit having a photoacid generating group, the content of the repeating unit having a photoacid generating group with respect to all the repeating units in the resin P is preferably 1 to 40 mol %, more preferably 5 to 35 mol %, and even more preferably 5 to 30 mol %.

The resin P may contain a repeating unit represented by General Formula (VI).

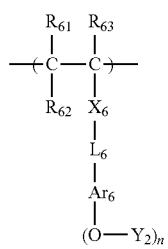

(VI)

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may form a ring by being bonded to $Ar_6$, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic ring group. In a case where $Ar_6$ forms a ring by being bonded to $R_{62}$, $Ar_6$ represents a (n+2)-valent aromatic ring group.

In a case where n≥2, $Y_2$ each independently represents a hydrogen atom or a group which is dissociated by the action of an acid. Here, at least one of $Y_2$'s represents a group which is dissociated by the action of an acid.

n represents an integer of 1 to 4.

As the group $Y_2$ which is dissociated by the action of an acid, a structure represented by General Formula (VI-A) is preferable.

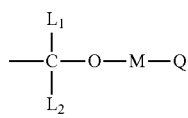

(VI-A)

$L_1$ and $L_2$ each independently represent a hydrogen atom, an alkyl group, a cycloalkyl group, an aryl group, or a group obtained by combining an alkylene group and an aryl group.

M represents a single bond or a divalent linking group.

Q represents an alkyl group, a cycloalkyl group which may contain a heteroatom, an aryl group which may contain a heteroatom, an amino group, an ammonium group, a mercapto group, a cyano group, or an aldehyde group.

At least two out of Q, M, and $L_1$ may form a ring (preferably a 5- or 6-membered ring) by being bonded to each other.

The repeating unit represented by General Formula (VI) is preferably a repeating unit represented by General Formula (3).

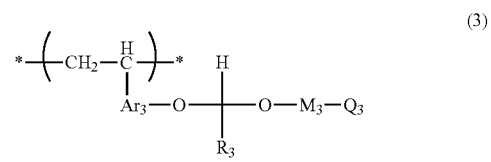

(3)

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may form a ring by being bonded to each other.

The aromatic ring group represented by $Ar_3$ is the same as $Ar_6$ in General Formula (VI) in a case where n in General Formula (VI) is 1. $Ar_3$ is more preferably a phenylene group or a naphthylene group, and even more preferably a phenylene group.

Specific examples of the repeating unit represented by General Formula (VI) will be shown below, but the present invention is not limited thereto.

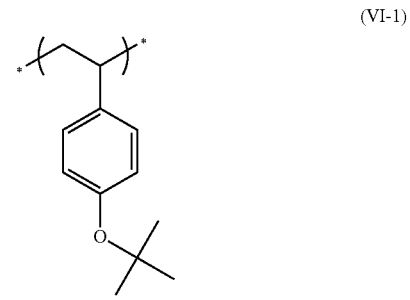

(VI-1)

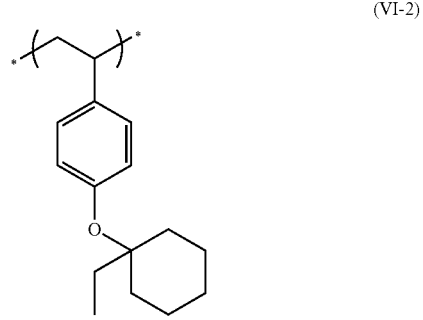

(VI-2)

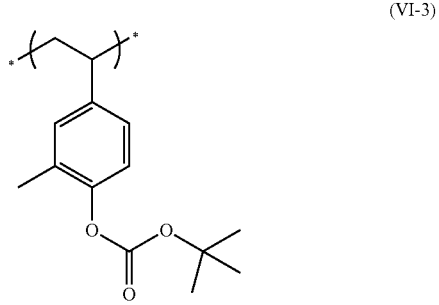

(VI-3)

(VI-4)
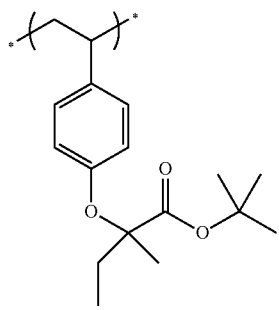
(VI-5)
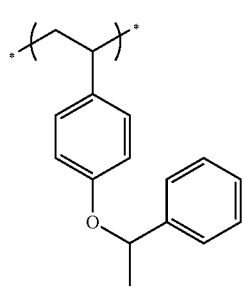
(VI-6)
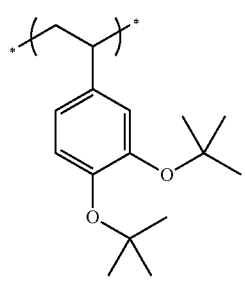
(VI-7)
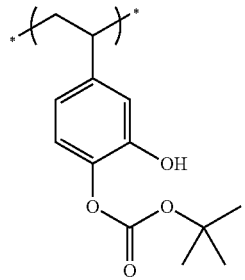
(VI-8)
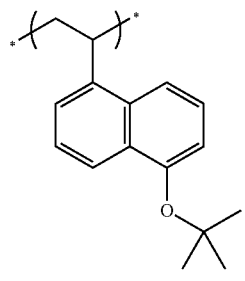
(VI-9)
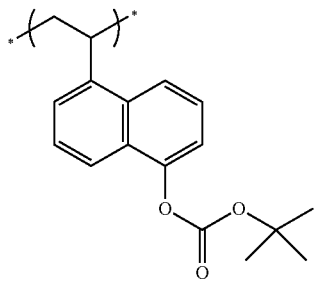
(VI-10)
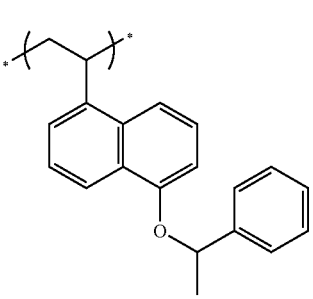
(VI-11)
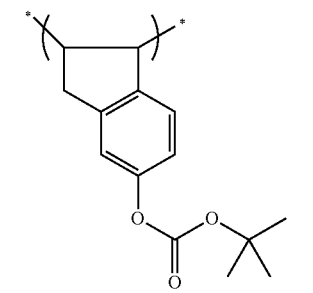
(VI-12)
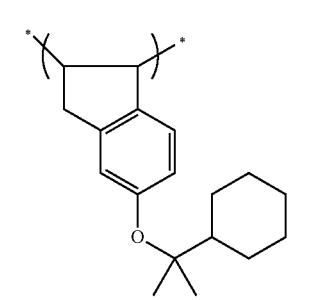
(VI-13)
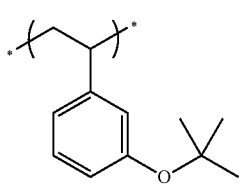

(VI-14)
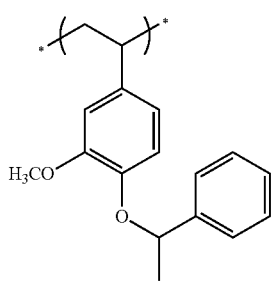
(VI-15)
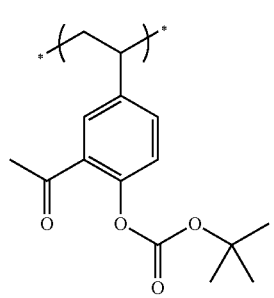
(VI-16)
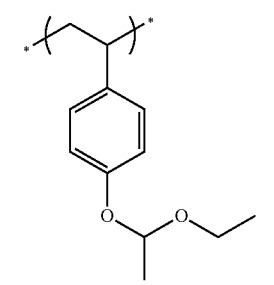
(VI-17)
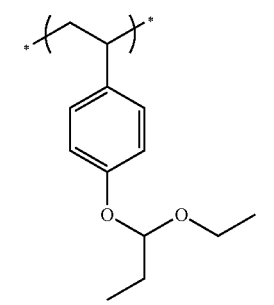
(VI-18)
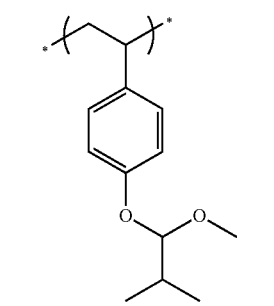
(VI-19)
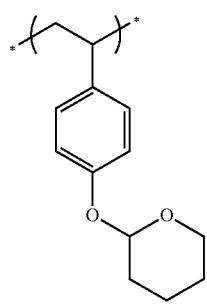
(VI-20)
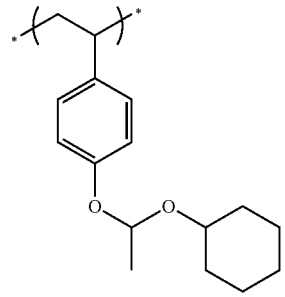
(VI-21)
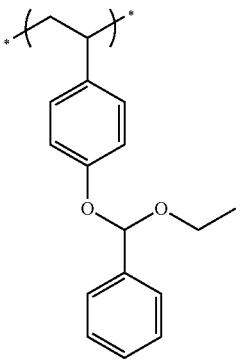
(VI-22)
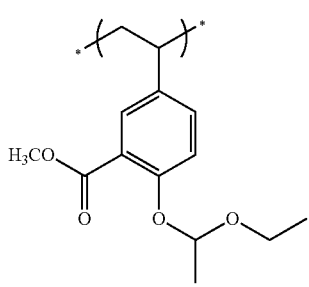
(VI-23)
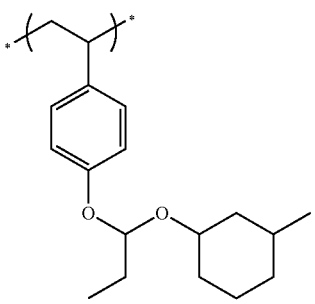

(VI-24)
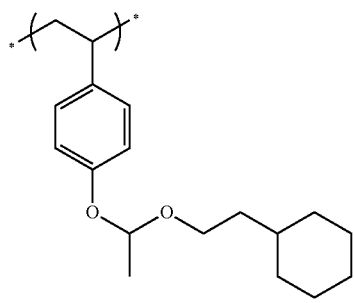
(VI-25)
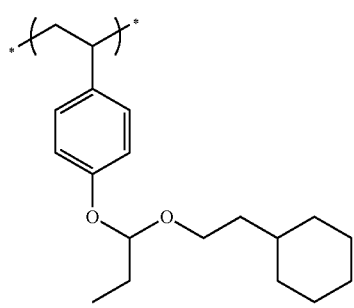
(VI-26)
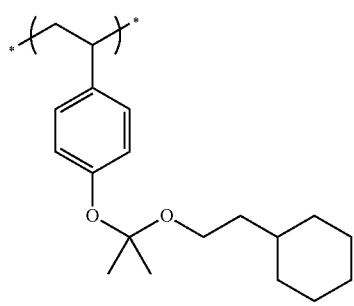
(VI-27)
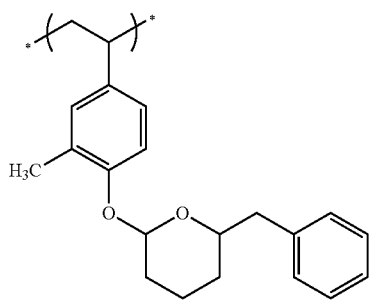
(VI-28)
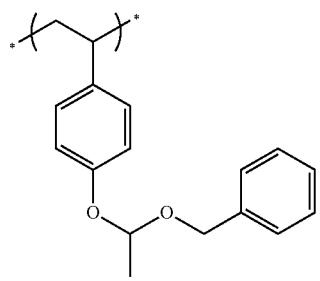
(VI-29)
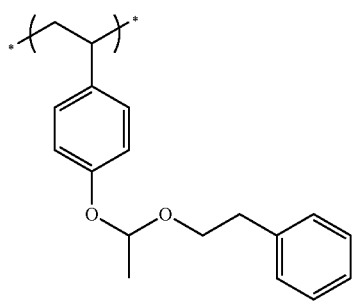
(VI-30)
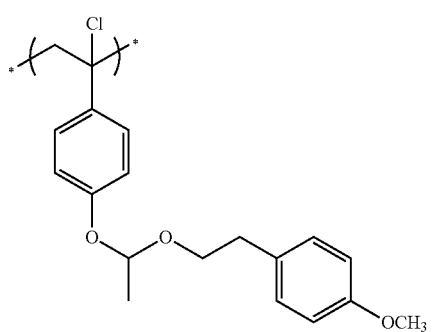
(VI-31)
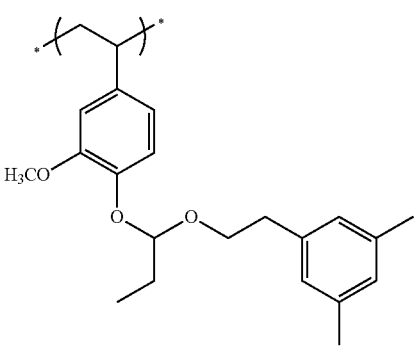
(VI-32)
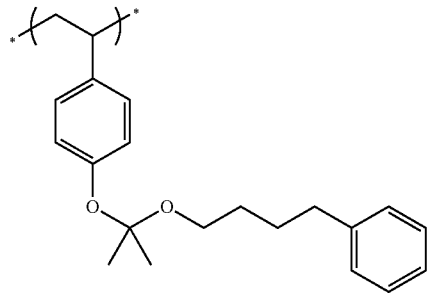
(VI-33)
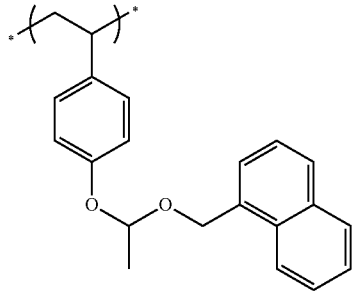

-continued (VI-34)
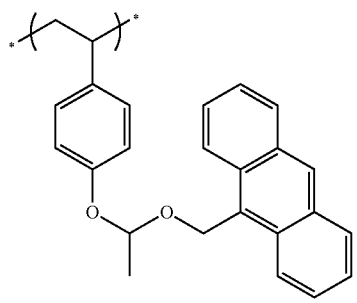

(VI-35)
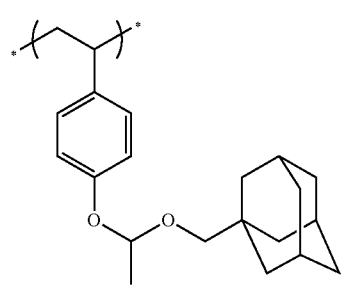

(VI-36)
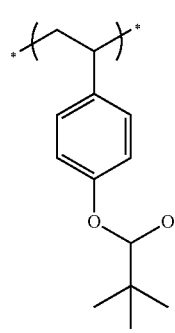

The resin P may contain a repeating unit represented by General Formula (4).

(4)
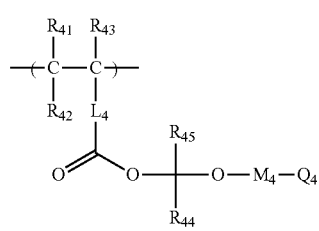

In General Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ and $L_4$ may form a ring by being bonded to each other, and in this case, $R_{42}$ represents an alkylene group.

$L_4$ represents a single bond or a divalent linking group. In a case where $L_4$ forms a ring together with $R_{42}$, $L_4$ represents a trivalent linking group.

$R_{44}$ and $R_{45}$ each represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two out of $Q_4$, $M_4$, and $R_{44}$ may form a ring by being bonded to each other.

$R_{41}$, $R_{42}$, and $R_{43}$ have the same definition as $R_{51}$, $R_{52}$, and $R_{53}$ in General Formula (V), and the preferable range thereof is also the same.

$L_4$ has the same definition as $L_5$ in General Formula (V), and the preferable range thereof is also the same.

$R_{44}$ and $R_{45}$ have the same definition as $R_3$ in General Formula (3), and the preferable range thereof is also the same.

$M_4$ has the same definition as $M_3$ in General Formula (3), and the preferable range thereof is also the same.

$Q_4$ has the same definition as $Q_3$ in General Formula (3), and the preferable range thereof is also the same.

Examples of the ring formed by bonding of at least two out of $Q_4$, $M_4$, and $R_{44}$ include a ring formed by bonding of at least two out of $Q_3$, $M_3$, and $R_3$, and the preferable range thereof is also the same.

Specific examples of the repeating unit represented by General Formula (4) will be shown below, but the present invention is not limited thereto.

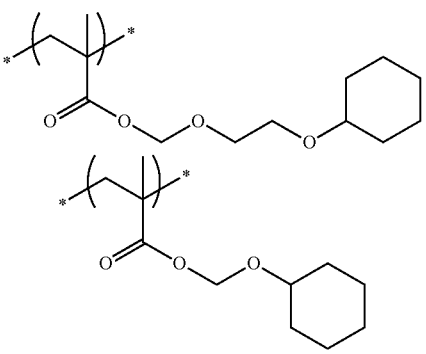

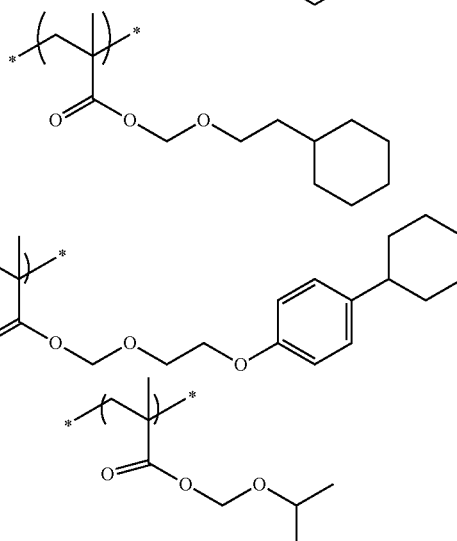

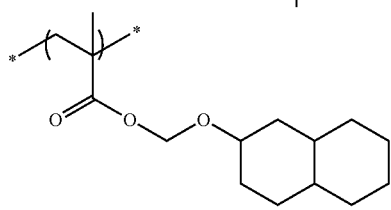

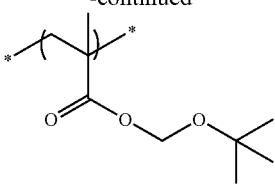
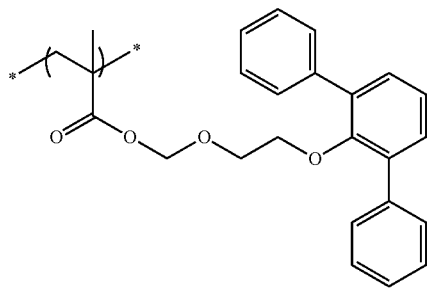
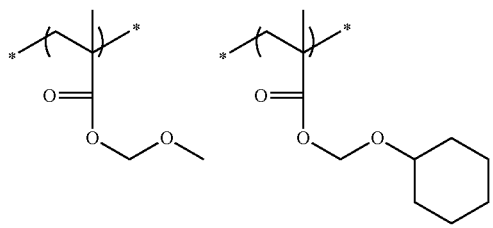
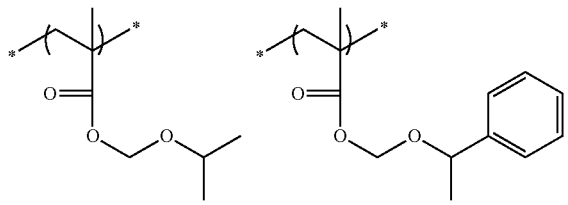
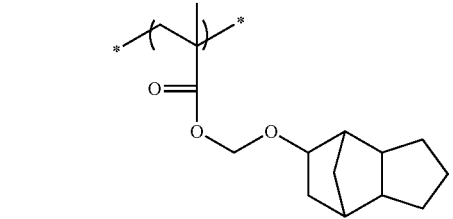
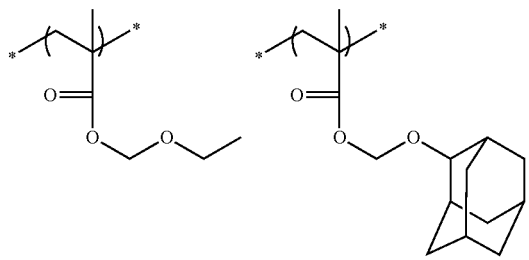
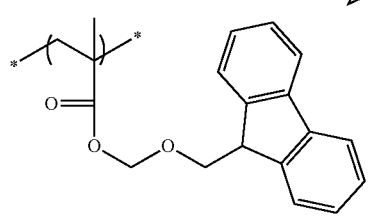

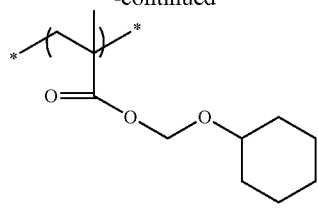
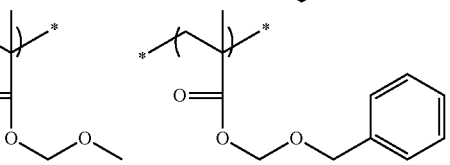

The resin P may contain a repeating unit represented by General Formula (BZ)

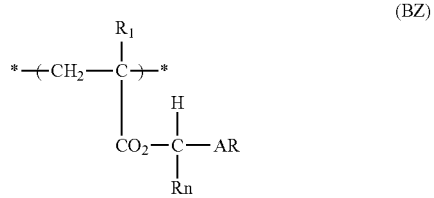

In General Formula (BZ), AR represents an aryl group. Rn represents an alkyl group, a cycloalkyl group, or an aryl group. Rn and AR may form a nonaromatic ring by being bonded to each other.

$R_1$ represents a hydrogen atom, an alkyl group, a cycloalkyl group, a halogen atom, a cyano group, or an alkyloxycarbonyl group.

Specific examples of the repeating unit represented by General Formula (BZ) will be shown below, but the present invention is not limited thereto.

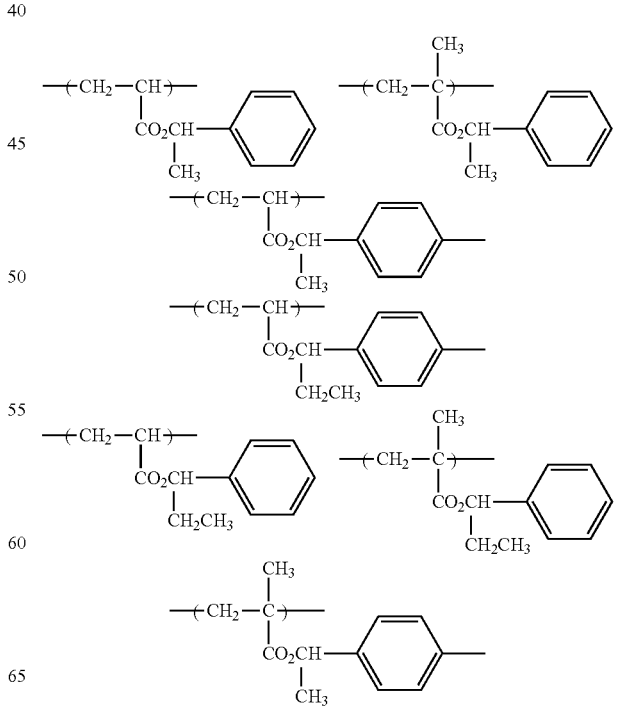

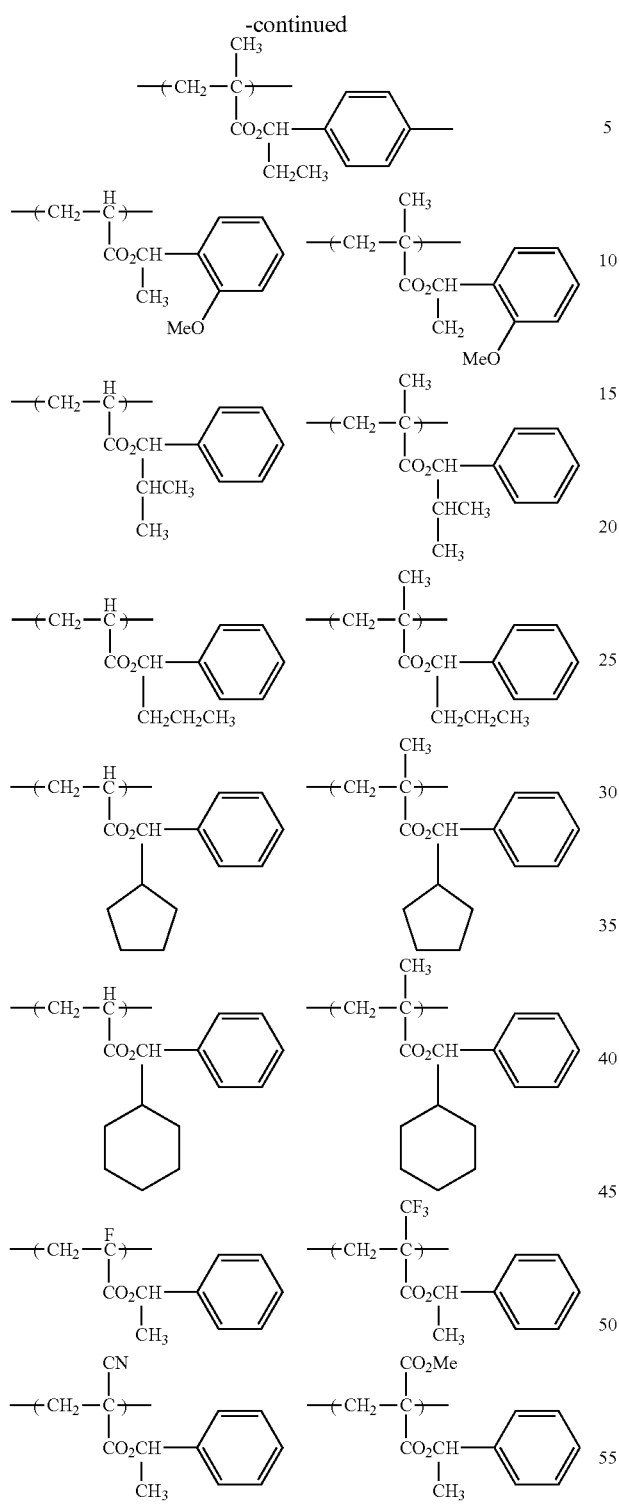

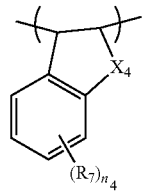

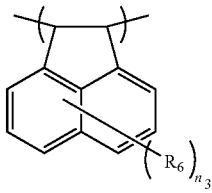

In the formulae, $R_6$ and $R_7$ each independently represent a hydrogen atom, a hydroxy group, a linear, branched, and cyclic alkyl group having 1 to 10 carbon atoms, an alkoxy group, an acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ represents a methylene group, an oxygen atom, or a sulfur atom.

Specific examples of the repeating unit represented by General Formula (V) or General Formula (VI) will be shown below, but the present invention is not limited thereto.

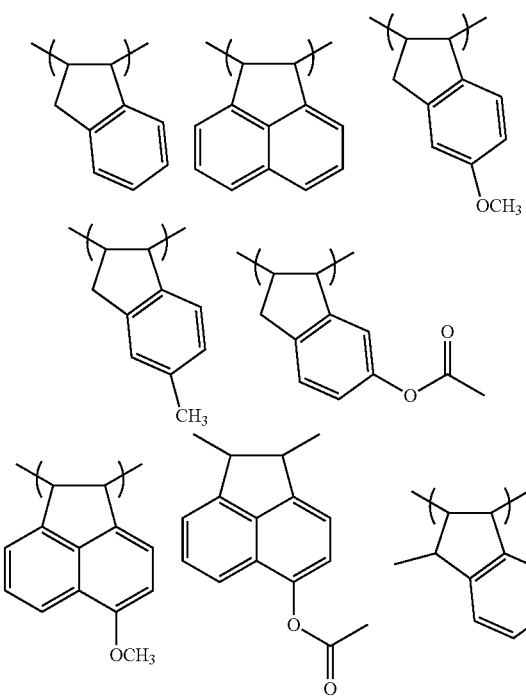

In the resin P, the content of the repeating unit having an acid-decomposable group (total content in a case where the resin P contains a plurality of kinds of the repeating units) with respect to all the repeating units in the resin P is preferably 5 to 80 mol %, more preferably 5 to 75 mol %, and even more preferably 10 to 65 mol %.

The resin P may contain a repeating unit represented by General Formula (V) or General Formula (VI).

The resin P may further contain a repeating unit having a silicon atom on a side chain. Examples of the repeating unit having a silicon atom on a side chain include a (meth)acrylic repeating unit having a silicon atom, a vinyl-based repeating unit having a silicon atom, and the like. Typically, the repeating unit having a silicon atom on a side chain is a repeating unit having a group having a silicon atom on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formulae, R and $R^1$ each independently represent a monovalent substituent. * represents a bond.

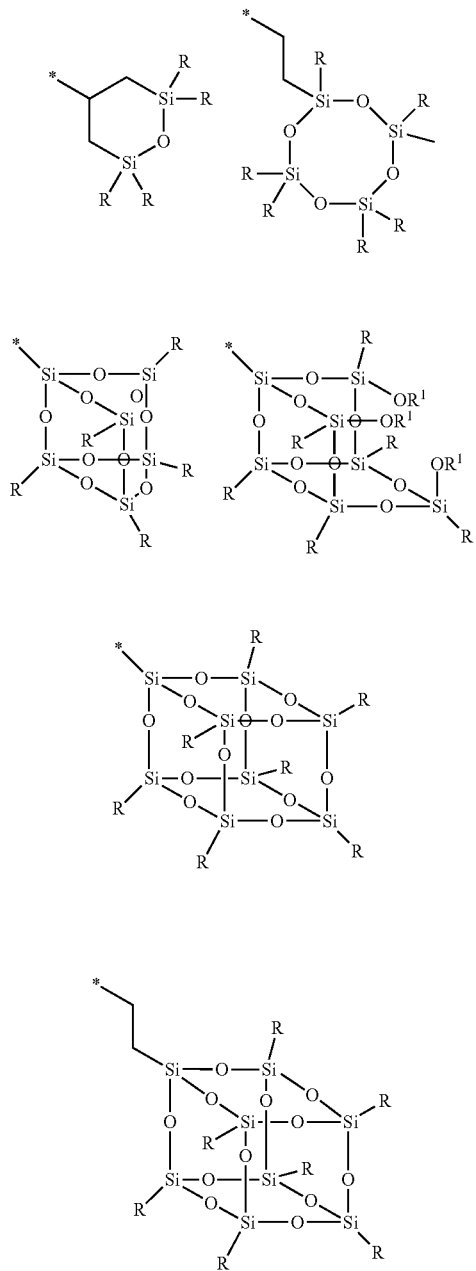

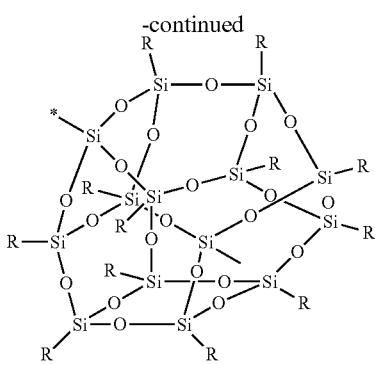

As the repeating unit having the aforementioned group, for example, a repeating unit derived from an acrylate or methacrylate compound having the aforementioned group or a repeating unit derived from a compound having the aforementioned group and a vinyl group is preferable.

It is preferable that the repeating unit having a silicon atom is preferably a repeating unit having a silsesquioxane structure. In a case where the repeating unit has a silsesquioxane structure, in forming an ultrafine pattern (for example, a line width equal to or smaller than 50 nm) having a cross-sectional shape with a high aspect ratio (for example, film thickness/line width is equal to or greater than 3), an extremely excellent collapse performance can be demonstrated.

Examples of the silsesquioxane structure include a cage-like silsesquioxane structure, a ladder-like silsesquioxane structure, and a random silsesquioxane structure. Among these, a cage-like silsesquioxane structure is preferable.

The cage-like silsesquioxane structure is a silsesquioxane structure having a cage-like skeleton. The cage-like silsesquioxane structure may be a complete cage-like silsesquioxane structure or an incomplete cage-like silsesquioxane structure, but is preferably a complete cage-like silsesquioxane structure.

The ladder-like silsesquioxane structure is a silsesquioxane structure having a ladder-like skeleton.

The random silsesquioxane structure is a silsesquioxane structure having a random skeleton.

The cage-like silsesquioxane structure is preferably a siloxane structure represented by Formula (S).

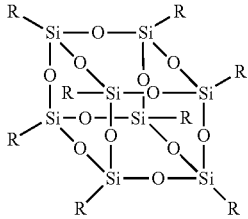

(S)

In Formula (S), R represents a monovalent organic group. A plurality of R's may be the same as or different from each other.

The organic group is not particularly limited, and specific examples thereof include a hydroxy group, a nitro group, a carboxy group, an alkoxy group, an amino group, a mercapto group, a blocked mercapto group (for example, a mercapto group blocked (protected) by an acyl group), an acyl group, an imide group, a phosphino group, a phosphinyl group, a silyl group, a vinyl group, a hydrocarbon group which may have a heteroatom, a (meth)acryl group-containing group, an epoxy-containing group, and the like.

Examples of the heteroatom in the hydrocarbon group which may have a heteroatom include an oxygen atom, a nitrogen atom, a sulfur atom, a phosphorus atom, and the like.

Examples of the hydrocarbon group which may have a heteroatom include an aliphatic hydrocarbon group, an aromatic hydrocarbon group, a group obtained by combining these, and the like.

The aliphatic hydrocarbon group may be any of a linear, branched, or cyclic aliphatic hydrocarbon group. Specific examples of the aliphatic hydrocarbon group include a linear or branched alkyl group (particularly having 1 to 30 carbon atoms), a linear or branched alkenyl group (particularly having 2 to 30 carbon atoms), a linear or branched alkynyl group (particularly having 2 to 30 carbon atoms), and the like.

Examples of the aromatic hydrocarbon group include an aromatic hydrocarbon group having 6 to 18 carbon atoms such as a phenyl group, a tolyl group, a xylyl group, or a naphthyl group.

In a case where the resin P has the repeating unit having a silicon atom on a side chain, the content of the repeating unit with respect to all the repeating units in the resin P is preferably 1 to 30 mol %, more preferably 5 to 25 mol %, and even more preferably 5 to 20 mol %.

The weight-average molecular weight of the resin P that is measured by a gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

In the actinic ray-sensitive or radiation-sensitive resin composition, the content of the resin P in the total solid content is preferably 50% to 99.9% by mass, and more preferably 60% to 99.0% by mass.

In the actinic ray-sensitive or radiation-sensitive resin composition, one kind of resin P may be used, or a plurality of resins P may be used in combination.

As all of other components (for example, an acid generator, a basic compound, a quencher, a hydrophobic resin, a surfactant, a solvent, and the like) contained in the actinic ray-sensitive or radiation-sensitive resin composition, known components can be used. As the actinic ray-sensitive or radiation-sensitive resin composition, for example, the resist compositions described in JP2016-057614A, JP2014-219664A, JP2016-138219A, and JP2015-135379A can be preferably used.

[Pattern Forming Method]

The pattern forming method according to the embodiment of the present invention includes (i) prewet step of bringing a prewet solution into contact with a substrate, (ii) resist film forming step of forming a resist film on the substrate, and (iii) development step of developing the exposed resist film by using a developer which are steps generally performed for forming a pattern, in which the solution according to the embodiment of the present invention is used in any one or more steps among the above steps.

Hereinafter, as an example of the pattern forming method according to the embodiment of the present invention, a first embodiment to a third embodiment will be described.

First Embodiment

The first embodiment of the pattern forming method is a pattern forming method having a prewet step of bringing a prewet solution into contact with a substrate, a resist film forming step of forming a resist film on the substrate by using an actinic ray-sensitive or radiation-sensitive resin composition, an exposure step of exposing the resist film, and a development step of developing the exposed resist film by using a developer, in which the solution according to the embodiment of the present invention is used as the prewet solution.

Second Embodiment

The second embodiment of the pattern forming method is a pattern forming method having a resist film forming step of forming a resist film on a substrate by using an actinic ray-sensitive or radiation-sensitive resin composition, an exposure step of exposing the resist film, and a development step of developing the exposed resist film by using a developer, in which the actinic ray-sensitive or radiation-sensitive resin composition contains the solution according to the embodiment of the present invention.

Third Embodiment

The third embodiment of the pattern forming method is a pattern forming method having a resist film forming step of forming a resist film on a substrate by using an actinic ray-sensitive or radiation-sensitive resin composition, an exposure step of exposing the resist film, and a development step of developing the exposed resist film by using a developer, in which the solution according to the embodiment of the present invention is used as the developer.

Fourth Embodiment

The fourth embodiment of the pattern forming method is a pattern forming method having a resist film forming step of forming a resist film on a substrate by using an actinic ray-sensitive or radiation-sensitive resin composition, an exposure step of exposing the resist film, a development step of developing the exposed resist film by using a developer, and a rinsing step of rinsing the formed pattern by using a rinse solution, in which the solution according to the embodiment of the present invention is used as the rinse solution.

The first embodiment to the fourth embodiment of the pattern forming method can be performed by known methods by using known materials.

The first embodiment is not particularly limited as long as the solution according to the embodiment of the present invention is used as the prewet solution, and the prewet method may be performed according to a known method.

The second embodiment is not particularly limited as long as the solution according to the embodiment of the present invention is used as an organic solvent which is used as a diluent in a known actinic ray-sensitive or radiation-sensitive resin composition, and as other materials and the technique for forming the resist film, known materials and techniques may be adopted.

The third embodiment is not particularly limited as long as the solution according to the embodiment of the present invention is used as the developer, and the development method may be performed according to a known method.

The fourth embodiment is not particularly limited as long as the solution according to the embodiment of the present invention is used as the rinse solution, and the rinsing method may be performed according to a known method.

In the first embodiment to the third embodiment of the pattern forming method, the actinic ray-sensitive or radiation-sensitive resin composition preferably contains the aforementioned resin P. Particularly, in the first embodiment, the third embodiment, and the fourth embodiment of the pattern forming method, the actinic ray-sensitive or radiation-sensitive resin composition more preferably contains the resin P. In a case where the solution according to the embodiment of the present invention is used as a prewet solution, a developer, or a rinse solution for the resist film formed of the actinic ray-sensitive or radiation-sensitive resin composition containing the resin P, the defect inhibition ability for the substrate is further improved.

[Manufacturing Method of Electronic Device]

The present invention also relates to a manufacturing method of a semiconductor device including the aforementioned pattern forming method according to the embodiment of the present invention. The semiconductor device manufactured by the manufacturing method of a semiconductor device according to the embodiment of the present invention is suitably mounted on electric and electronic instruments (for example, home appliances, office automation (OA)-related instruments, media-related instruments, optical instruments, communication instruments, and the like).

EXAMPLES

Hereinafter, the present invention will be more specifically described based on examples. The materials, the amount of the materials used, the proportion of the materials, the treatment contents, the treatment procedure, and the like shown in the following examples can be appropriately modified as long as the gist of the present invention is maintained. Accordingly, the scope of the present invention is not limited to the following examples. Unless otherwise specified, "%", "ppt", and "ppm" are based on mass.

[Defect Evaluation Test 1]
[Preparation of Solution]

Each of the solutions of examples and comparative examples was prepared by mixing together an organic solvent having a boiling point lower than 200° C. and an organic compound having a boiling point equal to or higher than 250° C. exemplified in Table 1 and performing the following purification step on the obtained mixed solution.

The organic compound having a boiling point equal to or higher than 250° C. shown in Table 1 corresponds to an organic compound which has been actually confirmed to be eluted from a member (for example, an O-ring) of a manufacturing device at the time of preparing the solvent or the like. That is, in the present examples and comparative examples, model solutions each containing an organic solvent having a boiling point lower than 200° C. and the aforementioned organic compound having a boiling point equal to or higher than 250° C. as an organic impurity having a boiling point equal to or higher than 250° C. were prepared and evaluated.

As the organic solvent having a boiling point lower than 200° C. and the organic compound having a boiling point equal to or higher than 250° C. shown in Table 1, those classified as a semiconductor grade or those classified as a high-purity grade equivalent to the semiconductor grade were used.

As the purification step for the aforementioned mixed solution (hereinafter, referred to as "solution to be purified"), the following steps (1) to (5) were performed in this order.

(1) Dehydration treatment of performing dehydration (volatilization removal by heating)

(2) Distillation treatment of distilling solution to be purified having undergone dehydration treatment (3) First ion exchange treatment of performing ion exchange treatment on solution to be purified by using 15 nm ion-exchange (IEX) PTFE filter manufactured by Entegris, Inc.

(4) Second ion exchange treatment of performing ion exchange treatment on solution to be purified having undergone distillation treatment by using 12 nm PTFE filter manufactured by Entegris, Inc.

(5) Particle removing treatment of removing particles by using microfiltration membrane having pore size equal to or smaller than 20 nm At the time of preparing each of the solutions of examples and comparative examples, all of the preparation, filling, storage, and analytical measurement of the solutions were performed in a clean room that met the level equal to or lower than ISO Class 2. Furthermore, in examples, containers were used after being washed in advance with the solution according to the embodiment of the present invention. In order to improve the measurement accuracy, at the time of measuring the content of the organic compound having a boiling point equal to or higher than 250° C. (organic impurity having a boiling point equal to or higher than 250° C.) and measuring the content of a metal component, in a case where the content of the organic compound or the metal material was found to be equal to or smaller than a detection limit by general measurement, the solution was concentrated by $1/100$ in terms of volume for performing the measurement, and the content was calculated by converting the concentration into the concentration of the solution not yet being concentrated.

The components used for preparing each of the solutions of examples and comparative examples are as below.

<Organic Solvent Having Boiling Point Lower than 200° C.> nBA: butyl acetate (boiling point: 126° C.)

PGME: propylene glycol monomethyl ether (boiling point: 121° C.)

PGEE: propylene glycol monoethyl ether (boiling point: 133° C.)

PGPE: propylene glycol monopropyl ether (boiling point: 149° C.)

EL: ethyl lactate (boiling point: 155° C.)

CyPe: cyclopentanone (boiling point: 130° C.)

CyHe: cyclohexanone (boiling point: 155° C.)

PGMEA: propylene glycol monomethyl ether acetate (boiling point: 146° C.)

MIBC: 4-methyl-2-pentanol (boiling point: 132° C.)

<Organic Compound Having Boiling Point Equal to or Higher than 250° C. (Organic Impurity Having Boiling Point Equal to or Higher than 250° C.)>

DOP: dioctyl phthalate (boiling point: 385° C., number of carbon atoms: 24)

DINP: diisononyl phthalate (boiling point: 403° C., number of carbon atoms: 26)

DOA: dioctyl adipate (boiling point: 335° C., number of carbon atoms: 22)

DBP: dibutyl phthalate (boiling point: 340° C., number of carbon atoms: 16)

EPDM: ethylene propylene rubber (boiling point: 300° C. to 450° C., number of carbon atoms >12)

Dimethyl phthalate (boiling point: 283° C., number of carbon atoms: 10)

p-Toluic acid (boiling point: 275° C., number of carbon atoms: 8)

DEHP: bis(2-ethylhexyl)phthalate (boiling point: 385° C., number of carbon atoms: 24)

ENB: addition polymer of 5-ethylidene-2-norbornene (the following structural formula: boiling point >250° C., number of carbon atoms >50)

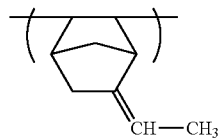

DCP: addition polymer of cyclopentadiene (the following structural formula: boiling point >250° C., number of carbon atoms >50)

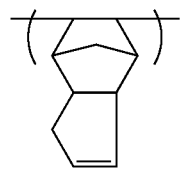

DOP: dioctyl phthalate (boiling point: 385° C., number of carbon atoms: 24)

HD: addition polymer of 1,4-hexadiene (the following structural formula: boiling point >250° C., number of carbon atoms >50)

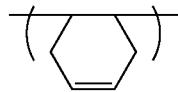

DIDP: diisodecyl phthalate (boiling point: 420° C., number of carbon atoms: 28)

DPHP: bis(2-propylheptyl)phthalate (boiling point: 361° C., number of carbon atoms: 28)

BBzP: benzyl butyl phthalate (boiling point: 340° C., number of carbon atoms: 16)

DIOP: diisooctyl phthalate (boiling point: 385° C., number of carbon atoms: 24)

DEP: diethyl phthalate (boiling point: 302° C., number of carbon atoms: 12)

DIBP: diisobutyl phthalate (boiling point: 320° C., number of carbon atoms: 16)

TEHTM: tris(2-ethylhexyl)trimellitate (boiling point: 414° C., number of carbon atoms: 33)

ATM: tris(n-octyl-n-decyl)trimellitate (boiling point: 455° C., number of carbon atoms: 72)

DEHA: bis(2-ethylhexyl)adipate (boiling point: 335° C., number of carbon atoms: 22)

MMAD: monomethyl adipate (boiling point: 265° C., number of carbon atoms: 7)

DBS: dibutyl sebacate (boiling point: 345° C., number of carbon atoms: 18)

DBM: dibutyl maleate (boiling point: 281° C., number of carbon atoms: 12)

DIBM: diisobutyl maleate (boiling point: 296° C., number of carbon atoms: 12)

DEHT: dioctyl terephthalate (boiling point: 385° C., number of carbon atoms: 24)

DINCH: diisononyl 1,2-cyclohexanedicarboxylic acid ester (boiling point: 395° C., number of carbon atoms: 26)

Epoxidized vegetable oil: boiling point >400° C., number of carbon atoms >50

HP BSA: N-(2-hydroxypropyl)benzene sulfonamide (boiling point: 279° C., number of carbon atoms: 9)

BBSA-NBBS: N-(n-butyl)benzene sulfonamide (boiling point: 306° C., number of carbon atoms: 10)

TCP: tricresyl phosphate (boiling point: 312° C., number of carbon atoms: 21)

TBP: tributyl phosphate (boiling point: 289° C., number of carbon atoms: 12)

TEC: triethyl citrate (boiling point: 294° C., number of carbon atoms: 12)

ATEC: acetyl triethyl citrate (boiling point: 300° C., number of carbon atoms: 14)

TBC: tributyl citrate (boiling point: 302° C., number of carbon atoms: 18)

ATBC: acetyl tributyl citrate (boiling point: 305° C., number of carbon atoms: 20)

TOC: trioctyl citrate (boiling point: 320° C., number of carbon atoms: 30)

ATOC: acetyl trioctyl citrate (boiling point: 335° C., number of carbon atoms: 32)

THC: trihexyl citrate (boiling point: 310° C., number of carbon atoms: 24)

ATHC: acetyl trihexyl citrate (boiling point: 305° C., number of carbon atoms: 26)

ESBO: epoxidized soybean oil (boiling point: 256° C., number of carbon atoms: 60)

[Various Measurements]

(Measurement of Content of Organic Impurity Having Boiling Point Equal to or Higher than 250° C.)

By using each of the solutions of examples and comparative examples, the content of the organic impurity having a boiling point equal to or higher than 250° C. in the solution (content with respect to the total mass of the solution) was measured. The content was measured using GC-MS (trade name "GCMS-2020", manufactured by Shimadzu Corporation) and determined by an area normalization method. The measurement results are shown in Table 1.

(Measurement of Content of Water)

By using each of the solutions of examples and comparative examples, the content of water in the solution (content with respect to the total mass of the solution) was measured. The content of water was measured using a Karl Fischer moisture meter (trade name "MKC-710M", manufactured by KYOTO ELECTRONICS MANUFACTURING CO., LTD., for Karl Fischer coulometric titration method). The measurement results are shown in Table 1.

(Measurement of Content of Metal Component (Fe Element, Cr Element, Ni Element, and Pb Element))

By using each of the solutions of examples and comparative examples, the content of the metal component (metal impurity) in the solution (content with respect to the total mass of the solution) was measured. Specifically, the content was measured by an ICP-MS method by using each of the solutions of examples and comparative examples and Nex- ION 350S (trade name, manufactured by PerkinElmer Inc.). The measurement results are shown in Table 1.

Specifically, the conditions of the measurement by the ICP-MS method are as below.

A detectable amount was measured based on the peak intensity for a standard solution having known concentration and converted into the mass of the metal element, and the content of each metal element in the solution used for the measurement was calculated.

(Conditions of Measurement by ICP-MS Method)
((Standard Substance))

Ultrapure water was measured and put into a clean glass container, and metal particles to be measured that had a median diameter of 50 nm were added thereto such that the concentration thereof became 1 mass ppt, and then the solution was treated for 30 minutes in an ultrasonic washing machine. A dispersion liquid obtained in this way was used as a standard substance for measuring transport efficiency.

((ICP-MS Device Used))
Manufacturer: PerkinElmer Inc.
Model: NexION 350S
((Measurement Conditions of ICP-MS))

For ICP-MS, by using a coaxial nebulizer made of PFA ("PFA" is a copolymer of tetrafluoroethylene and perfluoroalkyl vinyl ether), a cyclonic spray chamber made of quartz, and a torch injector made of quartz having an inner diameter of 1 mm, a solution to be measured was aspirated at 0.2 mL/min. Oxygen was added in an amount of 0.1 L/min, a plasma output was 1,600 W, and cell purging was performed using ammonia gas. The analysis was performed at a temporal resolution of 50 μs.

((Software))

The content of the metal element was measured using the following attached analysis software provided from the manufacturer.

Syngistix for ICP-MS software (Number of Coarse Particles)

By using each of the solutions of examples and comparative examples, the number of coarse particles in the solution was measured.

After being prepared, the aforementioned solution was left to stand for 1 day at room temperature. Then, based on a dynamic light scattering method, by using a light scattering-type liquid-borne particle counter (manufactured by RION Co., Ltd., model number: KS-18F, light source: semiconductor laser-excited solid-state laser (wavelength: 532 nm, rated power: 500 mW), flow rate: 10 mL/min), the number of objects to be counted having a size equal to or greater than 0.1 μm that were contained in 1 mL of the solution was counted 5 times, and the average thereof was adopted as a measured value.

The light scattering-type liquid-borne particle counter was used after being calibrated using a polystyrene latex (PSL) standard particle solution.

[Defect Evaluation]

By using a wafer surface inspection device (SP-5; manufactured by KLA-Tencor Corporation), the number of particles (hereinafter, referred to as "defects") having a diameter equal to or greater than 32 nm that were present on the surface of a silicon oxide film substrate having a diameter of 300 mm were counted. Then, the silicon oxide film substrate was set in a spin jetting device, and while the silicon oxide film substrate was being rotated, each of the solutions of examples or comparative examples was jetted to the surface of the same substrate at a flow rate of 1.5 L/min. Thereafter, the wafer was spin-dried.

For the obtained dried wafer, by using the aforementioned device (SP-5), the number of defects present on the surface of the silicon oxide film substrate was counted again, and a difference with the initial value (initial value−counted value) was adopted as the number of defects.

Table 1 shows the result obtained by evaluating the obtained number of defects based on the following standards. In a case where the evaluation result is "C" or better based on the following standards, the solution is considered as achieving a defect inhibition ability required for a solution for manufacturing a semiconductor device.

"A": the number of defects is equal to or smaller than 500.

"B": the number of defects is greater than 500 and equal to or smaller than 1,000.

"C": the number of defects is greater than 1,000 and equal to or smaller than 1,500.

"D": the number of defects is greater than 1,500.

The wafer surface inspection device (SP-5; manufactured by KLA-Tencor Corporation) is a device which detects a foreign substance or a pattern defect on a wafer and determines position coordinates (X, Y) of the defect. The defect includes a random defect and a systematic defect. The random defect occurs mainly by the adhesion of a foreign substance or the like. Accordingly, it is impossible to predict where such a defect will occur. Therefore, the primary role of the inspection device is to detect a defect on a wafer and to specify the location (position coordinates).

Particularly, SP-5 used in the present invention is a device for detecting a defect on a bare wafer and is effective for detecting a random defect. The device performs measurement based on a principle in which laser beams are shot to a rotating wafer and (relatively) moved in the radial direction such that the entire surface of the wafer is irradiated with the laser beams. At this time, in a case where the laser beams touch a foreign substance or a defect due to the rotation of the wafer, light is scattered, and the scattered light is detected by a detector. In this way, a foreign substance and a defect are detected. Based on the rotation angle of the wafer and the radial position of the laser beams, the coordinate positions of the foreign substance and the defect are assigned and registered.

Particularly, for evaluating defects relating to the manufacturing of a fine semiconductor device at a node equal to or smaller than 10 nm, it is preferable to use a wafer surface inspection device having resolution equal to or higher than that of SP-5.

In the following Table 1, the content of the organic solvent having a boiling point lower than 200° C. means "balance portion (% by mass)". That is, the content of the organic solvent having a boiling point lower than 200° C. means an amount obtained by subtracting the content (% by mass) of each of the organic impurity having a boiling point equal to or higher than 250° C., water, the metal component, and the coarse particles from the total mass (100% by mass) of the solution. In any of the following examples, the content of the organic solvent is equal to or greater than 98% by mass with respect to the total mass of the solution.

Furthermore, the compositional ratio described in the column of "organic solvent having boiling point lower than 200° C." in Example 21 means a mass ratio.

TABLE 1

| Table 1-1 | Organic solvent having boiling point lower than 200° C. (% by mass) | Organic compound having boiling point equal to or higher than 250° C. (mass ppm) | Water (% by mass) | Metal component (metal impurity) (mass ppt) | | | | | Coarse particles (particle/ml) | Defect performance |
| --- | --- | --- | --- | --- | --- | --- | --- | --- | --- | --- |
| | | | | Fe | Cr | Ni | Pb | Total | | |
| Example 1 | nBA | DOP 1 ppm | 0.10% | 2 | 1 | 3 | 1 | 7 | 8 | A |
| Example 2 | nBA | DINP 1 ppm | 0.10% | 2 | 2 | 2 | 1 | 7 | 8 | A |
| Example 3 | nBA | DINP 1 ppm | 0.10% | 3 | 1 | 4 | 1 | 9 | 8 | A |
| Example 4 | nBA | DOA 1 ppm | 0.10% | 2 | 2 | 2 | 1 | 7 | 8 | A |
| Example 5 | nBA | DBP 1 ppm | 0.10% | 1 | 1 | 4 | 1 | 7 | 8 | A |
| Example 6 | nBA | DOP 10 ppm | 0.10% | 2 | 2 | 2 | 1 | 7 | 13 | B |
| Example 7 | nBA | DOP 50 ppm | 0.10% | 3 | 1 | 4 | 1 | 9 | 20 | C |
| Example 8 | nBA | Dimethyl phthalate 50 ppm | 0.10% | 3 | 1 | 4 | 1 | 9 | 20 | B |
| Example 9 | nBA | p-Toluic acid 50 ppm | 0.10% | 3 | 1 | 4 | 1 | 9 | 20 | B |
| Example 10 | nBA | EPDM 1 ppm | 0.10% | 2 | 1 | 3 | 1 | 7 | 8 | A |
| Example 11 | nBA | DOP 1 ppm DINP 1 ppm | 0.10% | 3 | 2 | 4 | 1 | 10 | 10 | A |
| Example 12 | nBA | DOA 1 ppm DINP 1 ppm | 0.10% | 2 | 2 | 3 | 1 | 8 | 11 | A |
| Example 13 | PGME | DOP 1 ppm | 0.10% | 2 | 1 | 3 | 1 | 7 | 7 | A |
| Example 14 | PGEE | DOP 1 ppm | 0.10% | 2 | 1 | 3 | 1 | 7 | 6 | A |
| Example 15 | PGPE | DOP 1 ppm | 0.10% | 2 | 2 | 3 | 1 | 8 | 8 | A |
| Example 16 | EL | DOP 1 ppm | 0.10% | 2 | 1 | 3 | 1 | 7 | 9 | A |
| Example 17 | CyPe | DOP 1 ppm | 0.10% | 2 | 1 | 3 | 1 | 7 | 8 | A |
| Example 18 | CyHe | DOP 1 ppm | 0.10% | 2 | 2 | 3 | 1 | 8 | 7 | A |
| Example 19 | PGMEA | DOP 1 ppm | 0.10% | 2 | 2 | 3 | 1 | 8 | 8 | A |
| Example 20 | MIBC | DOP 1 ppm | 0.10% | 2 | 1 | 2 | 1 | 6 | 8 | A |
| Example 21 | PGMEA/PGME | DOP 1 ppm | 0.10% | 2 | 3 | 2 | 1 | 8 | 8 | A |
| Example 22 | nBA | DOP 1 ppm | 0.10% | 53 | 47 | 61 | 8 | 169 | 8 | C |
| Example 23 | CyHe | DOP 1 ppm | 0.10% | 61 | 45 | 65 | 13 | 184 | 8 | C |
| Example 24 | PGMEA | DOP 1 ppm | 0.10% | 57 | 51 | 59 | 9 | 176 | 8 | C |
| Example 25 | nBA | DOP 1 ppm | 0.10% | equal to or greater than 0.001 and less than 0.1 | equal to or greater than 0.001 and less than 0.1 | equal to or greater than 0.001 and less than 0.1 | equal to or greater than 0.001 and less than 0.1 | equal to or greater than 0.001 and less than 0.1 | 2 | B |
| Example 26 | CyHe | DOP 1 ppm | 0.10% | equal to or greater than 0.001 and less than 0.1 | equal to or greater than 0.001 and less than 0.1 | equal to or greater than 0.001 and less than 0.1 | equal to or greater than 0.001 and less than 0.1 | equal to or greater than 0.001 and less than 0.1 | 1 | B |
| Example 27 | PGMEA | DOP 1 ppm | 0.10% | equal to or greater than 0.001 and less than 0.1 | equal to or greater than 0.001 and less than 0.1 | equal to or greater than 0.001 and less than 0.1 | equal to or greater than 0.001 and less than 0.1 | equal to or greater than 0.001 and less than 0.1 | 1 | B |
| Example 28 | nBA | DOP 1 ppm | 0.10% | 20 | 12 | 13 | 8 | 53 | 115 | C |
| Example 29 | CyHe | DOP 1 ppm | 0.10% | 7 | 15 | 16 | 8 | 46 | 108 | C |
| Example 30 | PGMEA | DOP 1 ppm | 0.10% | 10 | 14 | 12 | 9 | 45 | 119 | C |
| Example 31 | nBA | DOP 1 ppm | 1.50% | 2 | 1 | 2 | 1 | 6 | 8 | B |
| Example 32 | CyHe | DOP 1 ppm | 1.50% | 2 | 1 | 3 | 1 | 7 | 8 | B |
| Example 33 | PGMEA | DOP 1 ppm | 1.50% | 2 | 1 | 3 | 1 | 7 | 8 | B |
| Example 34 | nBA | DOP 1 ppm | 0.005% | 2 | 1 | 2 | 1 | 6 | 8 | B |
| Example 35 | CyHe | DOP 1 ppm | 0.005% | 2 | 1 | 3 | 1 | 7 | 8 | B |
| Example 36 | PGMEA | DOP 1 ppm | 0.005% | 2 | 1 | 3 | 1 | 7 | 8 | B |
| Example 37 | nBA | DOP 1 ppm | 0.10% | <0.001 | <0.001 | <0.001 | <0.001 | <0.001 | 2 | C |
| Example 38 | CyHe | DOP 1 ppm | 0.10% | <0.001 | <0.001 | <0.001 | <0.001 | <0.001 | 1 | C |
| Example 39 | PGMEA | DOP 1 ppm | 0.10% | <0.001 | <0.001 | <0.001 | <0.001 | <0.001 | 1 | C |
| Comparative Example 1 | nBA | DOP 120 ppm | 0.10% | 2 | 1 | 3 | 1 | 7 | 16 | D |
| Comparative Example 2 | nBA | EPDM 120 ppm | 0.10% | 2 | 1 | 3 | 1 | 7 | 25 | D |
| Comparative Example 3 | nBA | DOP 0.05 ppm | 0.10% | 2 | 1 | 3 | 1 | 7 | 3 | D |

TABLE 2

| Table 1-2 | Organic solvent having boiling point lower than 200° C. (% by mass) | Organic compound having boiling point equal to or higher than 250° C. (mass ppm) | Water (% by mass) | Metal component (metal impurity) (mass ppt) | | | | | Coarse particles (particle/ml) | Defect performance |
|---|---|---|---|---|---|---|---|---|---|---|
| | | | | Fe | Cr | Ni | Pb | Total | | |
| Example 40 | nBA | DEHP 1 ppm | 0.10% | 2 | 1 | 3 | 2 | 8 | 8 | B |
| Example 41 | nBA | ENB 1 ppm | 0.10% | 3 | 2 | 3 | 1 | 9 | 8 | A |
| Example 42 | nBA | DCP 1 ppm | 0.10% | 2 | 1 | 4 | 1 | 8 | 7 | B |
| Example 43 | nBA | HD 1 ppm | 0.10% | 3 | 1 | 4 | 1 | 9 | 8 | B |
| Example 44 | nBA | DIDP 1 ppm | 0.10% | 2 | 1 | 3 | 1 | 7 | 8 | B |
| Example 45 | nBA | DPHP 1 ppm | 0.10% | 2 | 1 | 3 | 2 | 8 | 8 | B |
| Example 46 | nBA | BBzP 1 ppm | 0.10% | 1 | 1 | 3 | 1 | 6 | 9 | B |
| Example 47 | nBA | DOP 1 ppm | 0.10% | 2 | 1 | 3 | 1 | 7 | 8 | A |
| Example 48 | nBA | DIOP 1 ppm | 0.10% | 2 | 1 | 4 | 1 | 8 | 8 | B |
| Example 49 | nBA | DEP 1 ppm | 0.10% | 2 | 1 | 2 | 1 | 6 | 8 | B |
| Example 50 | nBA | DIBP 1 ppm | 0.10% | 3 | 1 | 2 | 1 | 7 | 10 | B |
| Example 51 | nBA | TEHTM 1 ppm | 0.10% | 2 | 1 | 2 | 1 | 6 | 8 | B |
| Example 52 | nBA | ATM 1 ppm | 0.10% | 2 | 1 | 2 | 1 | 6 | 8 | B |
| Example 53 | nBA | DEHA 1 ppm | 0.10% | 2 | 1 | 4 | 1 | 8 | 8 | B |
| Example 54 | nBA | MMAD 1 ppm | 0.10% | 2 | 2 | 3 | 1 | 8 | 7 | B |
| Example 55 | nBA | DBS 1 ppm | 0.10% | 3 | 1 | 3 | 1 | 8 | 8 | B |
| Example 56 | nBA | DBM 1 ppm | 0.10% | 2 | 2 | 3 | 1 | 8 | 8 | B |
| Example 57 | nBA | DIBM 1 ppm | 0.10% | 2 | 1 | 3 | 3 | 9 | 8 | B |
| Example 58 | nBA | DEHT 1 ppm | 0.10% | 2 | 1 | 3 | 1 | 7 | 8 | B |
| Example 59 | nBA | DINCH 1 ppm | 0.10% | 3 | 1 | 2 | 1 | 7 | 8 | B |
| Example 60 | nBA | Epoxidized vegetable oil 1 ppm | 0.10% | 2 | 1 | 3 | 1 | 7 | 8 | B |
| Example 61 | nBA | HP BSA 1 ppm | 0.10% | 2 | 2 | 3 | 1 | 8 | 8 | B |
| Example 62 | nBA | BBSA-NBBS 1 ppm | 0.10% | 2 | 1 | 3 | 2 | 8 | 8 | B |
| Example 63 | nBA | TCP 1 ppm | 0.10% | 3 | 1 | 2 | 1 | 7 | 5 | B |
| Example 64 | nBA | TBP 1 ppm | 0.10% | 2 | 1 | 2 | 1 | 6 | 8 | B |
| Example 65 | nBA | TEC 1 ppm | 0.10% | 1 | 1 | 4 | 1 | 7 | 6 | B |
| Example 66 | nBA | ATEC 1 ppm | 0.10% | 2 | 1 | 3 | 1 | 7 | 8 | B |
| Example 67 | nBA | TBC 1 ppm | 0.10% | 2 | 1 | 4 | 2 | 9 | 8 | B |
| Example 68 | nBA | ATBC 1 ppm | 0.10% | 3 | 1 | 3 | 2 | 9 | 8 | B |
| Example 69 | nBA | TOC 1 ppm | 0.10% | 2 | 1 | 3 | 1 | 7 | 9 | B |
| Example 70 | nBA | ATOC 1 ppm | 0.10% | 2 | 2 | 3 | 1 | 8 | 8 | B |
| Example 71 | nBA | THC 1 ppm | 0.10% | 1 | 1 | 3 | 1 | 6 | 8 | B |
| Example 72 | nBA | ATHC 1 ppm | 0.10% | 2 | 1 | 3 | 1 | 7 | 8 | B |
| Example 73 | nBA | ESBO 1 ppm | 0.10% | 2 | 1 | 3 | 1 | 7 | 8 | B |

It was confirmed that the solutions of examples shown in Table 1 had an excellent defect inhibition ability. In contrast, it was revealed that the defect inhibition ability of the solutions of comparative examples did not satisfy the desired requirement.

By the comparison of Examples 1 to 10, it was confirmed that in a case where the content of the organic compound having a boiling point equal to or higher than 300° C. (organic impurity having a boiling point equal to or higher than 300° C.) with respect to the total mass of the solution was 0.1 to 30 mass ppm, the defect inhibition ability was further improved.

Furthermore, it was confirmed that in a case where the content of the organic compound having a boiling point equal to or higher than 250° C. (organic impurity having a boiling point equal to or higher than 250° C.) with respect to the total mass of the solution was 0.1 to 8 mass ppm, the defect inhibition ability was further improved.

By the comparison of Examples 1, 22, 25, and 37, it was confirmed that in a case where the total content of the metal components (metal impurity; Fe, Cr, Ni, and Pb) with respect to the total mass of the solution was 0.1 to 10 mass ppt, the defect inhibition ability was further improved. Furthermore, by the comparison between Examples 18, 23, 26, and 38 and the comparison between Examples 19, 24, 27, and 39, the same result was confirmed.

By the comparison between Examples 1 and 28, it was confirmed that in a case where the number of objects to be counted (number of coarse particles), which had a size equal to or greater than 0.1 μm, in 1 mL of the solution counted by a light scattering-type liquid-borne particle counter was equal to or smaller than 100, the defect inhibition ability was further improved. Furthermore, by the comparison between Examples 18 and 29 and the comparison between Examples 19 and 30, the same result was confirmed.

By the comparison of Examples 1, 31, and 34, it was confirmed that in a case where the content of water with respect to the total mass of the solution was 0.01% to 1% by mass, the defect inhibition ability was further improved. Furthermore, by the comparison between Examples 18, 32, and 35 and the comparison between Examples 19, 33, and 36, the same result was confirmed.

From the results shown in Table 1, it was confirmed that in a case where the organic impurity is one or more kinds of compounds selected from the group consisting of dioctyl phthalate, diisononyl phthalate, dioctyl adipate, dibutyl phthalate, ethylene propylene rubber, and an addition polymer of 5-ethylidene-2-norbornene, the defect inhibition ability was further improved.

[Defect Evaluation Test 2]

By using photoresist compositions shown below, patterns were formed as shown in Table 2.

<Preparation of Actinic Ray-Sensitive or Radiation-Sensitive Resin Compositions 1 to 3>

The following compositions were used as actinic ray-sensitive or radiation-sensitive resin compositions. Each of the actinic ray-sensitive or radiation-sensitive resin compositions was prepared by mixing together components and then filtering the mixture through a polyethylene filter having a pore size of 0.03 μm.

Makeup of Actinic Ray-Sensitive or Radiation-Sensitive Resin Composition 1:

Acid-decomposable resin (resin represented by the following formula (weight-average molecular weight (Mw) 7,500): numerical values described in each repeating unit means mol %): 100 parts by mass

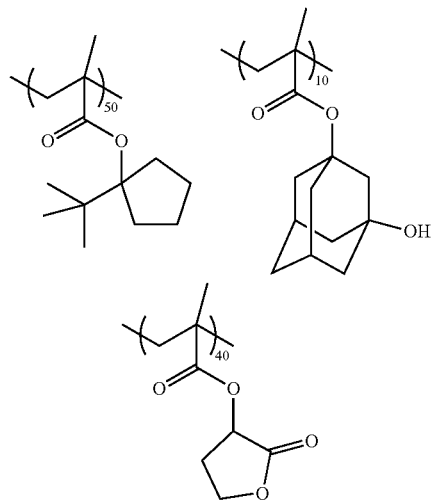

Photoacid Generator Shown Below: 8 Parts by Mass

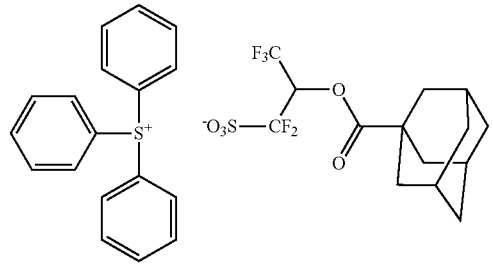

Quenchers Shown Below: 5 Parts by Mass (Mass Ratio: 0.1:0.3:0.3:0.2 in this Order from Left)

Among the following quenchers, polymer type quenches have a weight-average molecular weight (Mw) of 5,000, and the numerical value described in each repeating unit means a molar ratio.

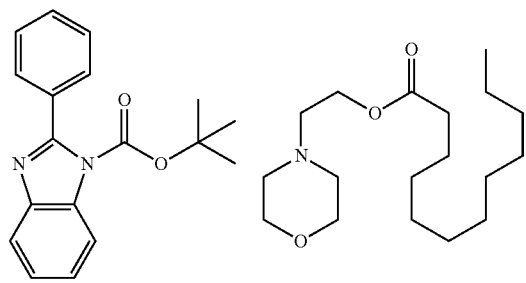

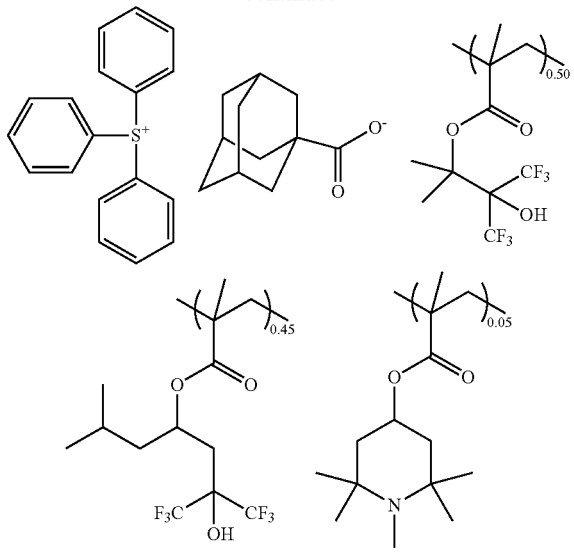

Hydrophobic Resins Shown Below: 4 Parts by Mass (Mass Ratio: 0.5:0.5 in this Order from Left)

Among the following hydrophobic resins, the hydrophobic resin on the left side has a weight-average molecular weight (Mw) of 7,000, and the numerical value described in each repeating unit means a molar ratio. Furthermore, the hydrophobic resin on the right side has a weight-average molecular weight (Mw) of 8,000, and the numerical value described in each repeating unit means a molar ratio.

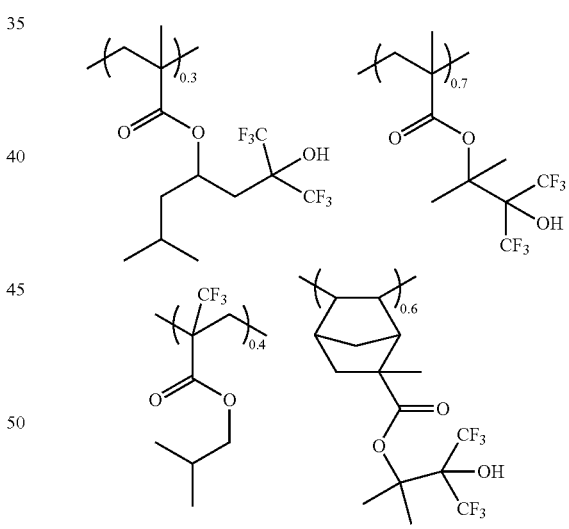

Solvent:
PGMEA (propylene glycol monomethyl ether acetate): 3 parts by mass
Cyclohexanone: 600 parts by mass
γ-BL (γ-butyrolactone): 100 parts by mass Makeup of Actinic Ray-Sensitive or Radiation-Sensitive Resin Composition 2:

Acid-decomposable resin (resin represented by the following formula (weight-average molecular weight (Mw) 8,000): numerical value described in each repeating unit means mol %): 100 parts by mass

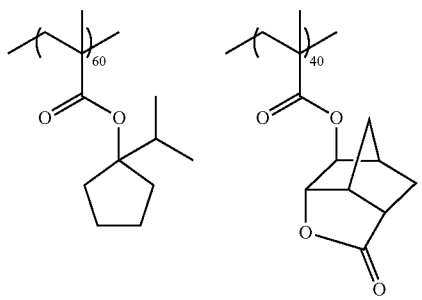

Photoacid Generators Shown Below: 12 Parts by Mass (Mass Ratio: 0.5:0.5 in this Order from Left)

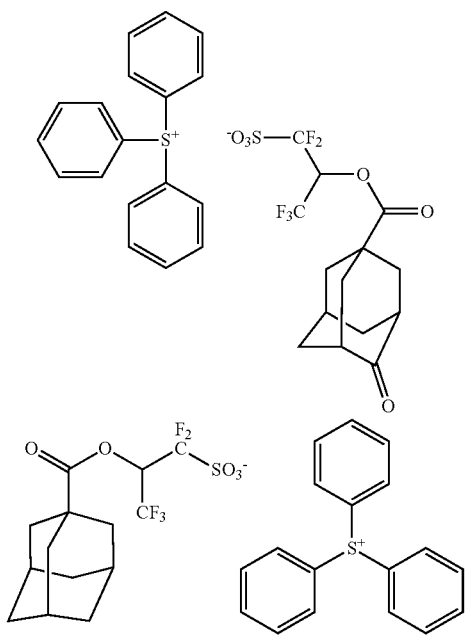

Quenchers Shown Below: 5 Parts by Mass (Mass Ratio: 0.3:0.7 in this Order from Left)

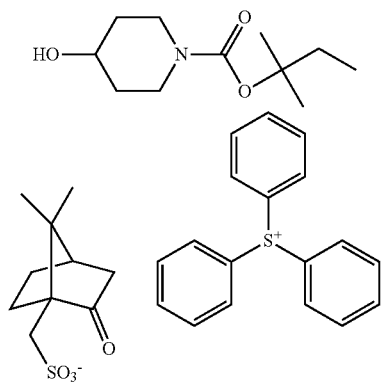

Hydrophobic Resins Shown Below: 5 Parts by Mass (Mass Ratio: 0.8:0.2 in this Order from Top)

Among the following hydrophobic resins, the hydrophobic resin on the upper side has a weight-average molecular weight (Mw) of 8,000, and the numerical value described in each repeating unit means a molar ratio. Furthermore, the hydrophobic resin on the lower side has a weight-average molecular weight (Mw) of 6,000, and the numerical value described in each repeating unit means a molar ratio.

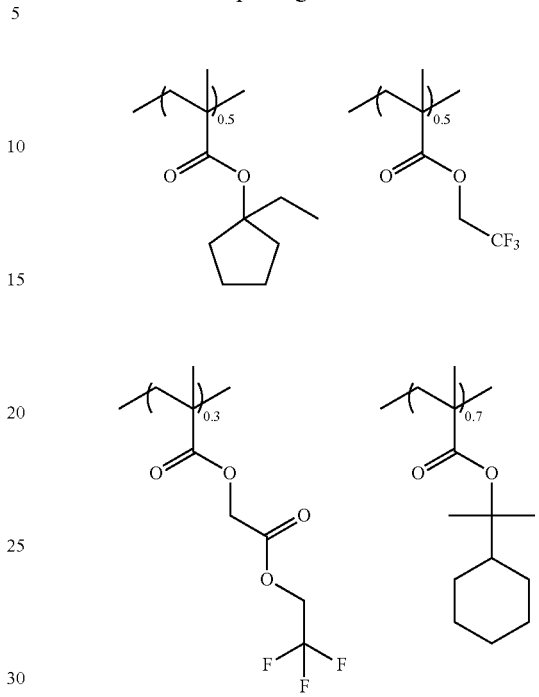

Solvent:
PGMEA (propylene glycol monomethyl ether acetate): 3 parts by mass
Cyclohexanone: 600 parts by mass
γ-BL (γ-butyrolactone): 100 parts by mass Makeup of Actinic Ray-Sensitive or Radiation-Sensitive Resin Composition 3:
Acid-decomposable resin (resin represented by the following formula (weight-average molecular weight (Mw) 10,000): numerical value described in each repeating unit means mol %): 100 parts by mass

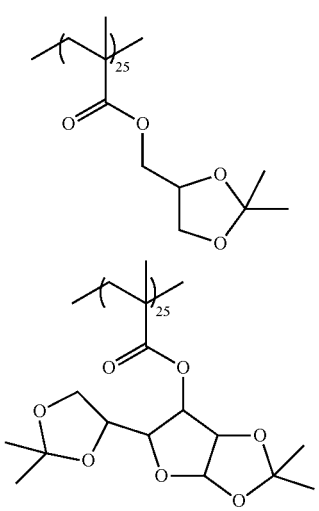

-continued

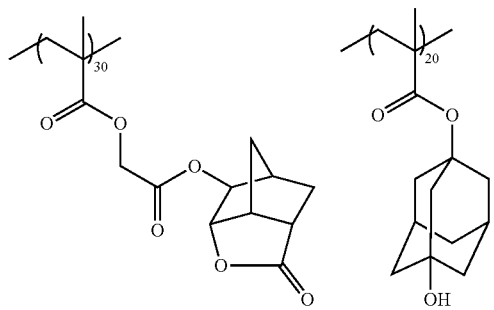

Photoacid Generators Shown Below: 20 Parts by Mass (Mass Ratio: 0.3:0.4:0.3 in this Order from Top)

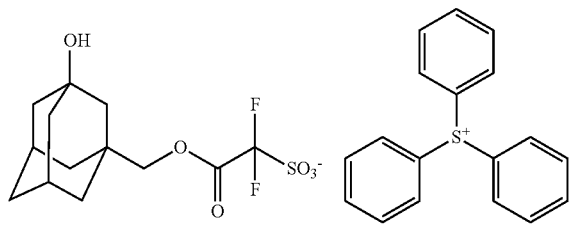

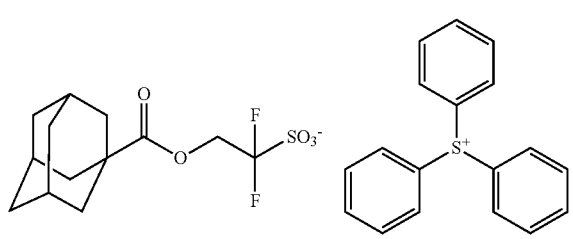

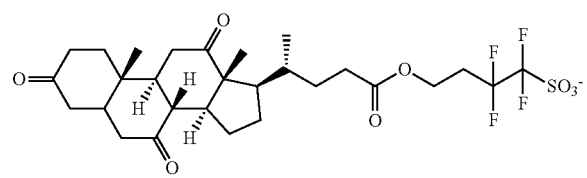

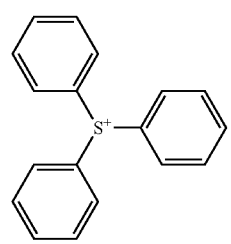

Quenchers Shown Below: 10 Parts by Mass (Mass Ratio: 0.5:0.5 in this Order from Left)

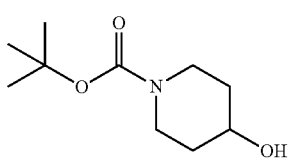

-continued

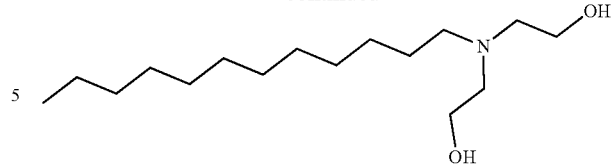

Hydrophobic Resin Shown Below (Weight-Average Molecular Weight (Mw): 10,000): 6 Parts by Mass

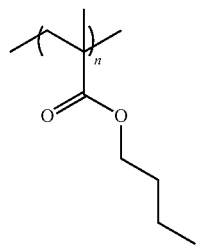

Solvent:
PGMEA (propylene glycol monomethyl ether acetate): 3 parts by mass
Cyclohexanone: 500 parts by mass
γ-BL (γ-butyrolactone): 200 parts by mass

[Evaluation]
<Evaluation of Resist Using Negative Developer (by Pattern Development by Means of NTI)>
(Formation of Resist Pattern)
A resist pattern was formed by the following operation.
<<Prewet Step>>
A prewet solution (described in the following Table 2) was added dropwise to the surface of a silicon wafer, and spin coating was performed.
<<Resist Film Forming Step>>
The silicon wafer was coated with an organic antireflection film forming composition ARC29SR (manufactured by NISSAN CHEMICAL INDUSTRIES, LTD.) and baked for 60 seconds at 205° C., thereby forming an antireflection film having a film thickness of 95 nm. Then, the obtained antireflection film was coated with the prepared actinic ray-sensitive or radiation-sensitive resin composition (described in the following Table 2) and baked (PB: prebake) for 60 seconds at 100° C., thereby forming a resist film having a film thickness of 90 nm.
<<Exposure and Development Step>>
By using an ArF excimer laser immersion scanner (manufactured by ASML; XT1700i, NA1.20, Dipole (outer σ: 0.981/inner σ: 0.895), Y-polarized), the obtained wafer was pattern-wise exposed through a halftone mask. As an immersion liquid, ultrapure water was used. Then, the wafer was heated for 60 seconds at 105° C. (PEB: Post Exposure Bake). Thereafter, the wafer was subjected to puddle development for 30 seconds by using a negative developer (described in the following Table 2). Subsequently, the wafer was rotated for 30 seconds at a rotation speed of 4,000 rpm, thereby forming a negative resist pattern.
For each of the patterns of Examples 74 to 88 obtained as above, defect evaluation was performed.
(Defect Evaluation)
By using a pattern defect device (for example, MULTI-PURPOSE SEM 'Inspago' RS6000 series manufactured by Hitachi-High Technologies Corporation), the number of defects on the pattern of the wafer on which the resist pattern was formed was counted. Based on the following evaluation standards, the defect inhibition ability was evaluated.

"A": the number of defects is equal to or smaller than 50.

"B": the number of defects is greater than 50 and equal to or smaller than 100.

"C": the number of defects is greater than 100 and equal to or smaller than 150.

"D": the number of defects is greater than 150.

TABLE 2

| | Prewet step<br>Type of prewet solution | Type of resist<br>composition | Resist film forming step<br>and exposure step<br>Exposure method | Development step<br>Type of developer | Defect<br>performance |
|---|---|---|---|---|---|
| Example 74 | Solution of Example 18 | (1) | NTI (ArF exposure) | Solution of Example 1 | A |
| Example 75 | Solution of Example 18 | (2) | NTI (ArF exposure) | Solution of Example 1 | A |
| Example 76 | Solution of Example 18 | (3) | NTI (ArF exposure) | Solution of Example 1 | A |
| Example 77 | Solution of Example 19 | (1) | NTI (ArF exposure) | Solution of Example 1 | C |
| Example 78 | Solution of Example 19 | (2) | NTI (ArF exposure) | Solution of Example 1 | C |
| Example 79 | Solution of Example 19 | (3) | NTI (ArF exposure) | Solution of Example 1 | C |
| Example 80 | Solution of Example 21 | (1) | NTI (ArF exposure) | Solution of Example 1 | B |
| Example 81 | Solution of Example 21 | (2) | NTI (ArF exposure) | Solution of Example 1 | B |
| Example 82 | Solution of Example 21 | (3) | NTI (ArF exposure) | Solution of Example 1 | B |
| Example 83 | Solution of Example 18 | (1) | NTI (ArF exposure) | Solution of Example 6 | C |
| Example 84 | Solution of Example 18 | (2) | NTI (ArF exposure) | Solution of Example 6 | C |
| Example 85 | Solution of Example 18 | (3) | NTI (ArF exposure) | Solution of Example 6 | C |
| Example 86 | Solution of Example 18 | (1) | NTI (ArF exposure) | Solution of Comparative Example 1 | D |
| Example 87 | Solution of Example 18 | (2) | NTI (ArF exposure) | Solution of Comparative Example 1 | D |
| Example 88 | Solution of Example 18 | (3) | NTI (ArF exposure) | Solution of Comparative Example 1 | D |

As shown in Table 2, it was confirmed that in a case where the solution according to the embodiment of the present invention was used as a prewet solution and a developer, the defect inhibition ability became excellent. Particularly, by the comparison of Examples 74 to 82, it was confirmed that in a case where cyclohexanone of Example 18 was used as a prewet solution, the defect performance was worst.

[Defect Evaluation Test 3]

By using the resist compositions shown below, a defect evaluation test was performed.

<Resin (A) and the Like>

(Synthesis Example 1) Synthesis of Resin (A-1)

Cyclohexanone (600 g) was put into a 2 L flask, and nitrogen purging was performed for 1 hour at a flow rate of 100 mL/min. Then, 4.60 g (0.02 mol) of a polymerization initiator V-601 (manufactured by Wako Pure Chemical Industries, Ltd.) was added thereto, and the flask was heated until the internal temperature became 80° C. Subsequently, the following monomer and 4.60 g (0.02 mol) of a polymerization initiator V-601 (manufactured by Wako Pure Chemical Industries, Ltd.) were dissolved in 200 g of cyclohexanone, thereby preparing a monomer solution. The monomer solution was added dropwise to the flask, which was heated to 80° C., for 6 hours. After the dropwise addition ended, the solution was further reacted for 2 hours at 80° C.

| 4-Acetoxystyrene | 48.66 g (0.3 mol) |
|---|---|
| 1-Ethylcyclopentyl methacrylate | 109.4 g (0.6 mol) |
| Monomer 1 | 22.2 g (0.1 mol) |

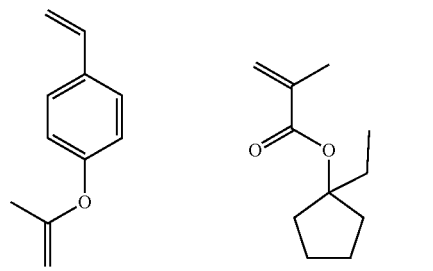

4-Acetoxystyrene     1-Ethylcyclopentyl methacrylate

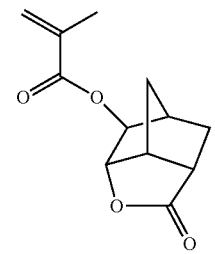

Monomer 1

The reaction solution was cooled to room temperature and added dropwise to 3 L of hexane such that a polymer was precipitated. The solids obtained after filtering were dissolved in 500 mL of acetone, added dropwise again to 3 L of hexane, and filtered, and the obtained solids were dried under reduced pressure, thereby obtaining 160 g of a 4-acetoxystyrene/1-ethylcyclopentyl methacrylate/monomer 1 copolymer (A-1a).

The obtained copolymer (A-1a) (10 g), 40 mL of methanol, 200 mL of 1-methoxy-2-propanol, and 1.5 mL of concentrated hydrochloric acid were put into a reaction container, heated to 80° C., and stirred for 5 hours. The reaction solution was cooled to room temperature and added dropwise to 3 L of distilled water. The solids obtained after filtering were dissolved in 200 mL of acetone, added dropwise again to 3 L of distilled water, and filtered, and the obtained solids were dried under reduced pressure, thereby obtaining a resin (A-1) (8.5 g). The weight-average molecular weight (Mw) of the resin measured by gel permeation chromatography (GPC) (solvent: tetrahydrofuran (THF)) and expressed in terms of standard polystyrene was 11,200, and the molecular weight dispersity (Mw/Mn) of the resin was 1.45.

Resins (A-2) to (A-19) having the structures shown in Table 3 were synthesized by the same method as that in Synthesis Example 1, except that the used monomer was changed.

In Table 3, the compositional ratio (molar ratio) of the resin was calculated by $^1$H-NMR (nuclear magnetic resonance) measurement. The weight-average molecular weight (Mw: expressed in terms of polystyrene) and the dispersity (Mw/Mn) of the resin were calculated by GPC (solvent: THF) measurement. For other resins shown in examples, the weight-average molecular weight and the dispersity were measured by the same method.

TABLE 3

| | Structure | Compositional ratio (molar ratio) From left | Mw | Mw/Mn |
|---|---|---|---|---|
| Resin A-1 | | 30/60/10 | 11,200 | 1.45 |
| Resin A-2 | | 30/60/10 | 12,300 | 1.51 |
| Resin A-3 | | 40/20/40 | 9,200 | 1.68 |
| Resin A-4 | | 30/60/10 | 12,300 | 1.51 |

TABLE 3-continued
| | Structure | Compositional ratio (molar ratio) From left | Mw | Mw/Mn |
|---|---|---|---|---|
| Resin A-5 | 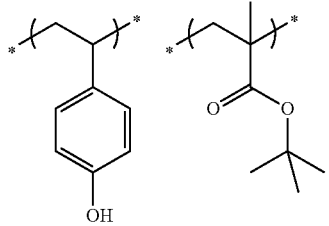 | 20/80 | 12,500 | 1.52 |
| Resin A-6 | 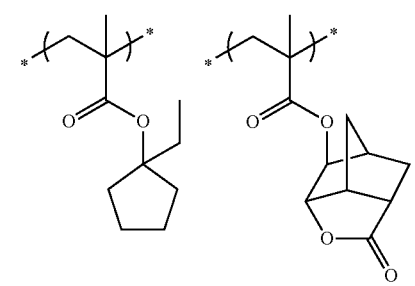 | 50/50 | 13,000 | 1.56 |
| Resin A-7 | 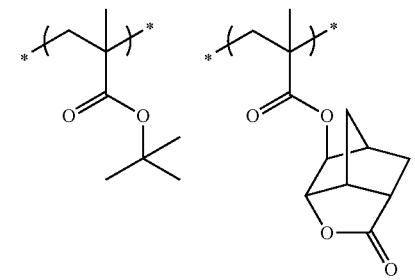 | 70/30 | 12,500 | 1.43 |
| Resin A-8 | 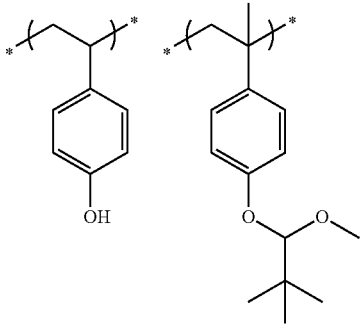 | 20/80 | 18,000 | 1.12 |
| Resin A-9 | 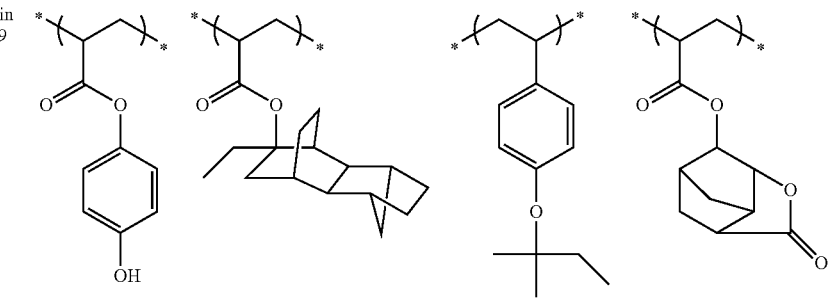 | 5/15/30/50 | 11,000 | 1.56 |

TABLE 3-continued

| | Structure | Compositional ratio (molar ratio) From left | Mw | Mw/Mn |
|---|---|---|---|---|
| Resin A-10 | | 50/50 | 11,000 | 1.45 |
| Resin A-11 | | 35/65 | 12,300 | 1.51 |
| Resin A-12 | | 60/40 | 12,500 | 1.68 |
| Resin A-13 | | 70/30 | 13,000 | 1.51 |
| Resin A-14 | | 20/40/40 | 11,000 | 1.45 |

TABLE 3-continued

| | Structure | Compositional ratio (molar ratio) From left | Mw | Mw/Mn |
|---|---|---|---|---|
| Resin A-15 | | 30/70 | 12,300 | 1.51 |
| Resin A-16 | | 50/20/30 | 14,500 | 1.68 |
| Resin A-17 | | 30/50/10/10 | 12,100 | 1.53 |
| Resin A-18 | | 50/35/15 | 11,100 | 1.61 |

TABLE 3-continued

| | Structure | Compositional ratio (molar ratio) From left | Mw | Mw/Mn |
|---|---|---|---|---|
| Resin A-19 | 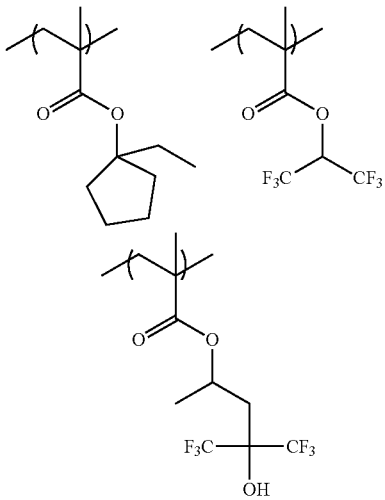 | 30/45/15/10 | 11,500 | 1.49 |

<Hydrophobic Resin (A')>

As hydrophobic resins, the following resins were used.

TABLE 4

| | Compositional ratio (molar ratio) | | | | Mw | Mw/Mn |
|---|---|---|---|---|---|---|
| Resin (1b) | 50 | 45 | 5 | — | 7,000 | 1.30 |
| Resin (2b) | 40 | 40 | 20 | — | 18,600 | 1.57 |
| Resin (3b) | 50 | 50 | — | — | 25,400 | 1.63 |
| Resin (4b) | 30 | 65 | 5 | — | 28,000 | 1.70 |
| Resin (5b) | 10 | 10 | 30 | 50 | 12,500 | 1.65 |

Specific structural formulae of the hydrophobic resins (1b) to (5b) described in the table will be shown below.

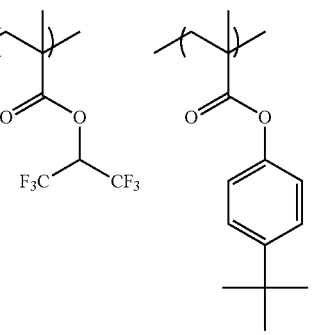
(1b)

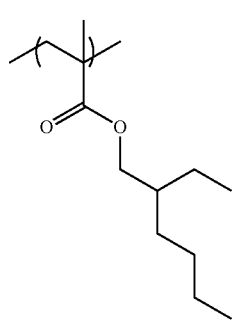

-continued

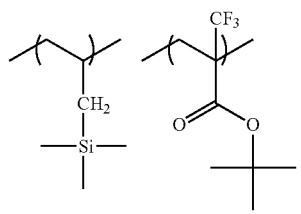
(2b)

(3b)
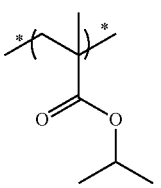

(4b)
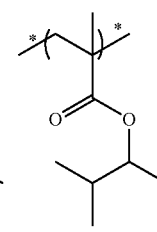 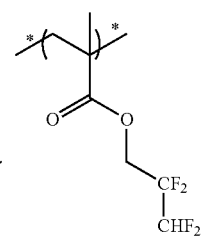

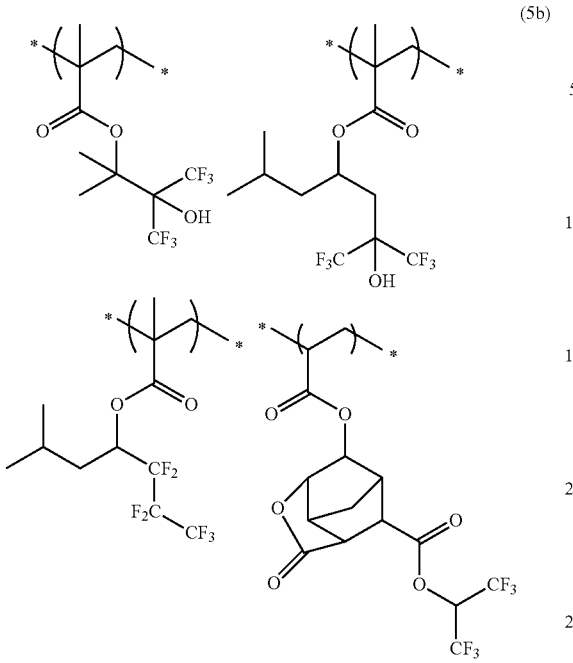
<Photoacid Generator (B)>
As photoacid generators, the following compounds were used.
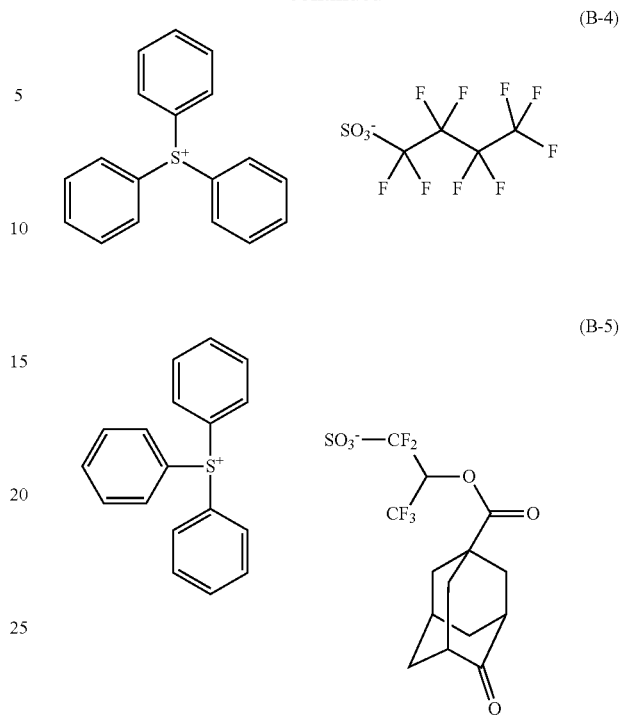
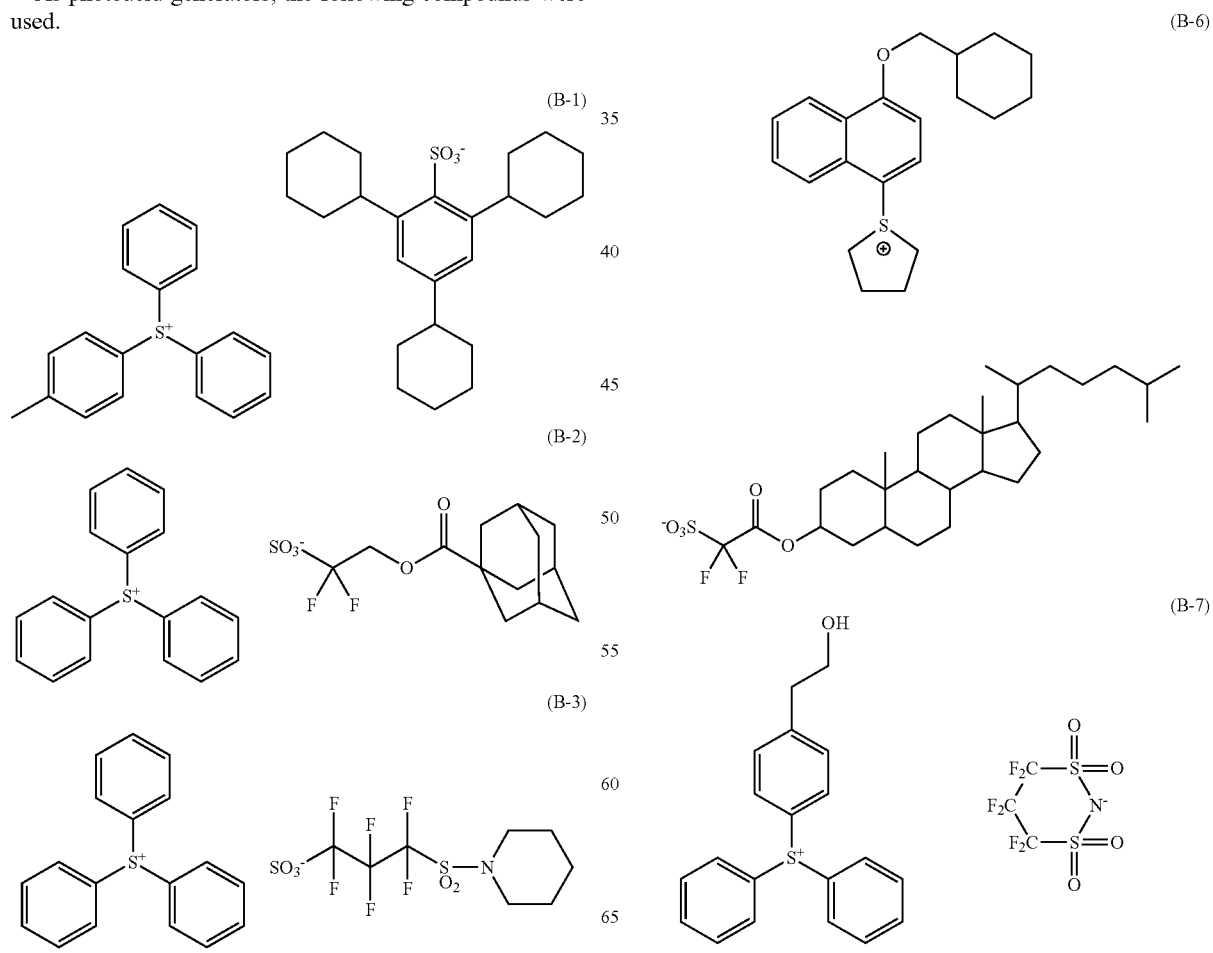

-continued
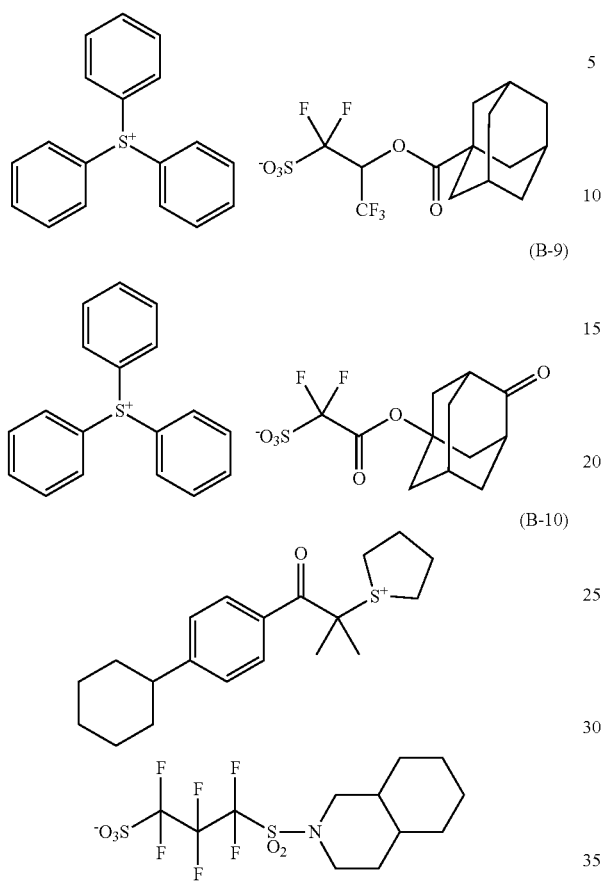
(B-8)
(B-9)
(B-10)
<Basic Compound (E)>
As basic compounds, the following compounds were used.
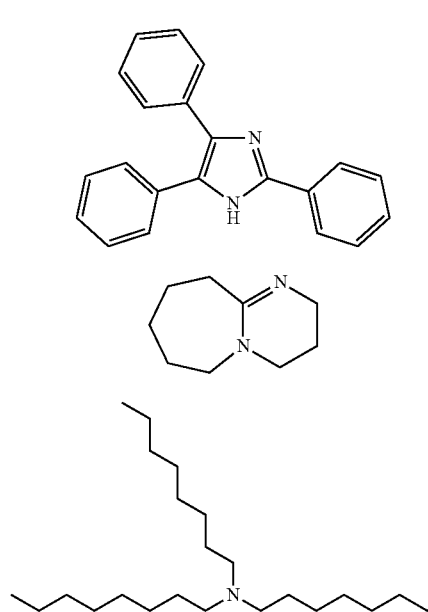
(E-1)
(E-2)
(E-3)
-continued
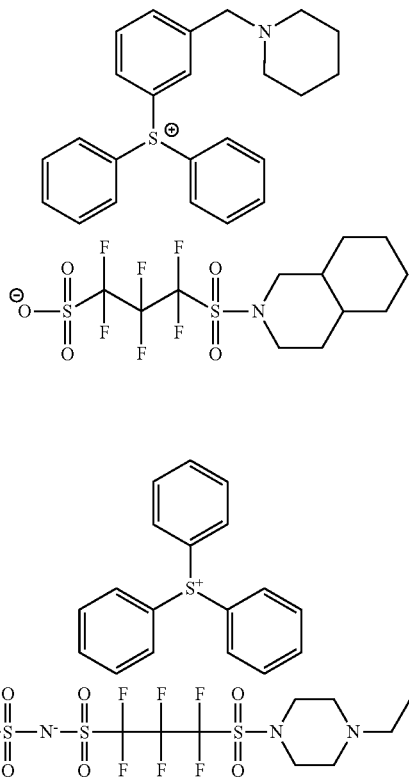
(E-4)
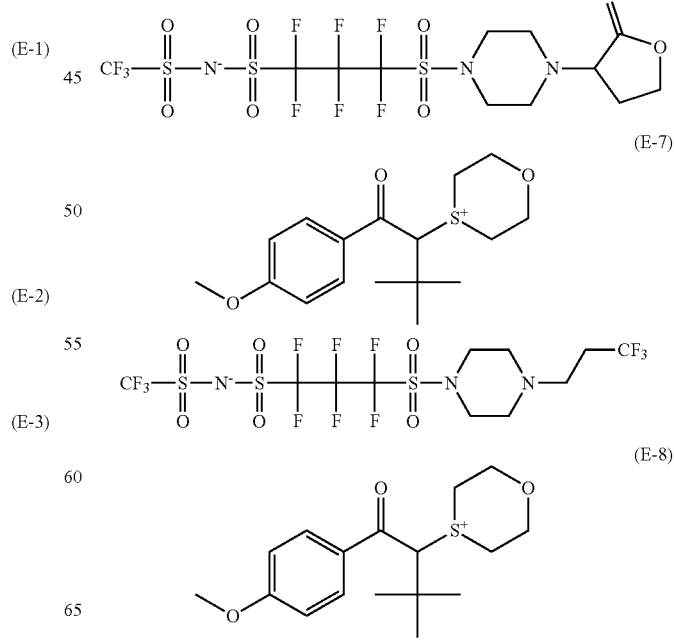
(E-5)
(E-6)
(E-7)
(E-8)

101

-continued

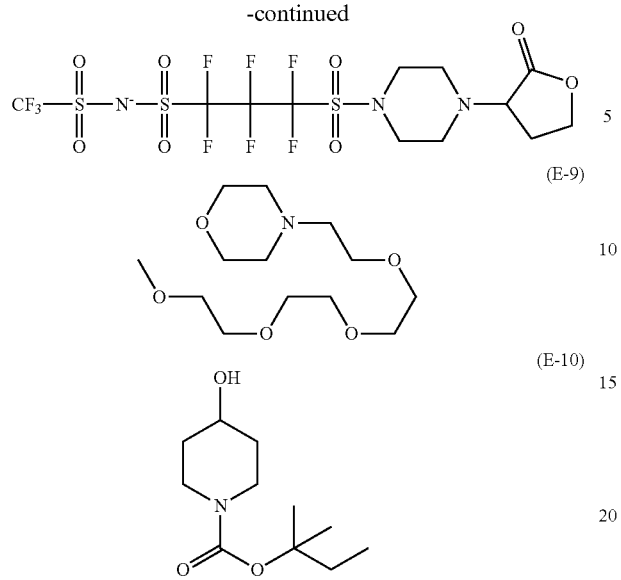

(E-9)

(E-10)

(E-11)

102

-continued

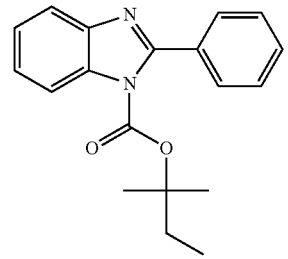
(E-12)

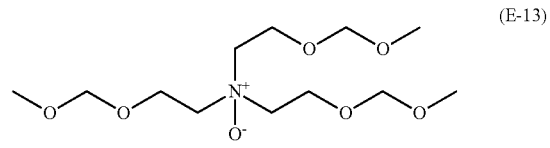
(E-13)

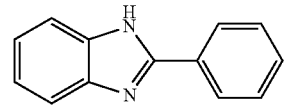
(E-14)

<Solvent (C)>

As resist solvents, the following solvents were used.
C-1: propylene glycol monomethyl ether acetate
C-2: propylene glycol monomethyl ether
C-3: ethyl lactate
C-4: cyclohexanone <Resist Composition>

The components shown in the following Table 5 were dissolved in the solvent shown in the same table. The solution was filtered using a polyethylene filter having a pore size of 0.03 μm, thereby obtaining a resist composition.

TABLE 5

| | Resin (A) | Acid generator (B) | Basic compound | Solvent (C) | | | Hydrophobic resin (A') |
|---|---|---|---|---|---|---|---|
| Resist composition 1 | A-1 | B-1 | E-3 | C-1 | C-3 | — | — |
| | 0.77 g | 0.2 g | 0.03 g | 67.5 g | 7.5 g | — | — |
| Resist composition 2 | A-2 | B-2 | E-1 | C-1 | C-2 | — | — |
| | 0.79 g | 0.18 g | 0.03 g | 45 g | 30 g | — | — |
| Resist composition 3 | A-3 | B-2 | E-1 | C-1 | C-2 | — | — |
| | 0.79 g | 0.18 g | 0.03 g | 45 g | 30 g | — | — |
| Resist composition 4 | A-4 | B-2 | E-1 | C-1 | C-3 | — | — |
| | 0.79 g | 0.18 g | 0.03 g | 60 g | 15 g | — | — |
| Resist composition 5 | A-5 | B-3 | E-3 | C-1 | C-3 | — | — |
| | 0.78 g | 0.19 g | 0.03 g | 67.5 g | 7.5 g | — | — |
| Resist composition 6 | A-6 | B-2 | E-1 | C-1 | C-3 | — | — |
| | 0.79 g | 0.18 g | 0.03 g | 67.5 g | 7.5 g | — | — |
| Resist composition 7 | A-6/A-7 | B-4 | E-4 | C-1 | C-4 | — | — |
| | 0.395 g/0.395 g | 0.2 g | 0.01 g | 45 g | 30 g | — | — |
| Resist composition 8 | A-8 | B-1 | E-1 | C-1 | C-2 | — | — |
| | 0.79 g | 0.18 g | 0.03 g | 45 g | 30 g | — | — |
| Resist composition 9 | A-1/A-2 | B-2 | E-1/E-5 | C-1 | C-2 | — | — |
| | 0.395 g/0.395 g | 0.18 g | 0.015 g/0.015 g | 45 g | 30 g | — | — |
| Resist composition 10 | A-2 | B-2 | E-6 | C-1 | C-2 | — | — |
| | 0.79 g | 0.18 g | 0.03 g | 45 g | 30 g | — | — |
| Resist composition 11 | A-2 | B-2 | E-7 | C-1 | C-2 | — | — |
| | 0.79 g | 0.18 g | 0.03 g | 45 g | 30 g | — | — |
| Resist composition 12 | A-2 | B-2 | E-8 | C-1 | C-2 | — | — |
| | 0.79 g | 0.18 g | 0.03 g | 45 g | 30 g | — | — |
| Resist composition 13 | A-9 | B-5 | E-9 | C-1 | C-2 | C-4 | 5b |
| | 0.76 g | 0.18 g | 0.03 g | 45 g | 15 g | 15 g | 0.03 g |
| Resist composition 14 | A-7 | B-5 | E-9 | C-1 | C-2 | C-4 | 4b |
| | 0.787 g | 0.18 g | 0.03 g | 45 g | 15 g | 15 g | 0.003 g |
| Resist composition 15 | A-6 | B-4 | E-10 | C-1 | C-2 | C-4 | 3b |
| | 0.785 g | 0.18 g | 0.03 g | 45 g | 15 g | 15 g | 0.005 g |
| Resist composition 16 | A-10 | B-3 | E-11 | C-1 | C-2 | C-4 | 2b |
| | 0.78 g | 0.18 g | 0.03 g | 45 g | 15 g | 15 g | 0.01 g |
| Resist composition 17 | A-11 | B-6/B-2 | E-12 | C-1 | C-2 | C-4 | 1b |
| | 0.72 g | 0.15 g/0.09 g | 0.03 g | 45 g | 15 g | 15 g | 0.01 g |

TABLE 5-continued

|  | Resin (A) | Acid generator (B) | Basic compound | Solvent (C) | | | Hydrophobic resin (A') |
|---|---|---|---|---|---|---|---|
| Resist composition 18 | A-12 | B-7 | E-13 | C-1 | C-2 | — | 5b |
|  | 0-76 g | 0.18 g | 0.03 g | 45 g | 30 g | — | 0.03 g |
| Resist composition 19 | A-13 | B-8 | E-14 | C-1 | C-2 | — | 4b |
|  | 0.787 g | 0.18 g | 0.03 g | 30 g | 45 g | — | 0.003 g |
| Resist composition 20 | A-14 | B-9 | E-2 | C-1 | C-4 | — | 3b |
|  | 0.785 g | 0.18 g | 0.03 g | 45 g | 30 g | — | 0.005 g |
| Resist composition 21 | A-15 | B-10/B-2 | E-13 | C-1 | C-4 | — | 2b |
|  | 0.78 g | 0.09 g/0.09 g | 0.03 g | 30 g | 45 g | — | 0.01 g |
| Resist composition 22 | A-16 | B-6 | E-14 | C-1 | C-2 | — | 1b |
|  | 0.71 g | 0.25 g | 0.03 g | 50 g | 10 g | — | 0.01 g |
| Resist composition 23 | A-17 | B-2 | E-1 | C-1 | C-3 | — | — |
|  | 0.79 g | 0.18 g | 0.03 g | 60 g | 15 g | — | — |
| Resist composition 24 | A-18 | B-2 | E-1 | C-1 | C-3 | — | — |
|  | 0.79 g | 0.18 g | 0.03 g | 60 g | 15 g | — | — |
| Resist composition 25 | A-19 | B-2 | E-1 | C-1 | C-3 | — | — |
|  | 0.79 g | 0.18 g | 0.03 g | 60 g | 15 g | — | — |

[Evaluation]
<Evaluation of Resist Using Negative Developer (by Pattern Development by Means of NTI)>
(Formation of Resist Pattern)

A resist pattern was formed by the following operation.
<<Prewet Step>>

A prewet solution (described in the following Table 6) was added dropwise to the surface of a silicon wafer, and spin coating was performed.
<<Coating with Resist Composition and Baking after Coating (PB)>>

A 12-inch silicon wafer was coated with each of the resist compositions obtained as above and baked for 60 seconds under the condition of 90° C. to 180° C., thereby forming a resist film having a film thickness of 40 nm.
<<Exposure>>

The wafer prepared as above was exposed to EUV by using a dipole lighting (Dipole 60×, outer σ: 0.81, inner σ: 0.43) at a numerical aperture (NA, number of lens apertures) of 0.25. Specifically, a negative resist was pattern-wise exposed through a halftone mask in an exposure amount of 1 mJ/cm$^2$.
<<Post-Exposure Bake (PEB)>>

After being irradiated, the wafer was taken out of the EUV exposure machine and then immediately baked for 60 seconds under the condition of 85° C. to 130° C.

<<Development>>

Then, by using a shower-type development machine (ADE3000S manufactured by Actes Kyosan Inc.), the wafer was rotated at a rotation speed of 50 (rpm), and in this state, a developer (23° C.) was spray-jetted for 30 seconds at a flow rate of 200 mL/min, thereby performing development. As the developer, a negative developer (described in the following Table 6) was used.

For each of the patterns of examples obtained as above, defect evaluation was performed.

(Defect Evaluation)

By using a pattern defect device (for example, MULTI-PURPOSE SEM 'Inspago' RS6000 series manufactured by Hitachi-High Technologies Corporation), the number of defects on the pattern of the wafer on which the resist pattern was formed was counted. Based on the following evaluation standards, the defect inhibition ability was evaluated.

"A": the number of defects is equal to or smaller than 50.

"B": the number of defects is greater than 50 and equal to or smaller than 100.

"C": the number of defects is greater than 100 and equal to or smaller than 150.

"D": the number of defects is greater than 150.

TABLE 6

| | Resist film forming step and exposure step | | | | |
|---|---|---|---|---|---|
| | Prewet step Type of prewet solution | Type of resist composition | Exposure method | Development step Type of developer | Defect performance |
| Example 89 | Solution of Example 18 | Resist composition 1 | NTI (EUV exposure) | Solution of Example 1 | A |
| Example 90 | Solution of Example 18 | Resist composition 2 | NTI (EUV exposure) | Solution of Example 1 | A |
| Example 91 | Solution of Example 18 | Resist composition 3 | NTI (EUV exposure) | Solution of Example 1 | A |
| Example 92 | Solution of Example 18 | Resist composition 4 | NTI (EUV exposure) | Solution of Example 1 | A |
| Example 93 | Solution of Example 18 | Resist composition 5 | NTI (EUV exposure) | Solution of Example 1 | A |
| Example 94 | Solution of Example 18 | Resist composition 6 | NTI (EUV exposure) | Solution of Example 1 | A |
| Example 95 | Solution of Example 18 | Resist composition 7 | NTI (EUV exposure) | Solution of Example 1 | A |
| Example 96 | Solution of Example 18 | Resist composition 8 | NTI (EUV exposure) | Solution of Example 1 | A |
| Example 97 | Solution of Example 18 | Resist composition 9 | NTI (EUV exposure) | Solution of Example 1 | A |
| Example 98 | Solution of Example 18 | Resist composition 10 | NTI (EUV exposure) | Solution of Example 1 | A |
| Example 99 | Solution of Example 18 | Resist composition 11 | NTI (EUV exposure) | Solution of Example 1 | A |
| Example 100 | Solution of Example 18 | Resist composition 12 | NTI (EUV exposure) | Solution of Example 1 | A |
| Example 101 | Solution of Example 18 | Resist composition 13 | NTI (EUV exposure) | Solution of Example 1 | A |
| Example 102 | Solution of Example 18 | Resist composition 14 | NTI (EUV exposure) | Solution of Example 1 | A |
| Example 103 | Solution of Example 18 | Resist composition 15 | NTI (EUV exposure) | Solution of Example 1 | A |
| Example 104 | Solution of Example 18 | Resist composition 16 | NTI (EUV exposure) | Solution of Example 1 | A |
| Example 105 | Solution of Example 18 | Resist composition 17 | NTI (EUV exposure) | Solution of Example 1 | A |

| | Resist film forming step and exposure step | | | |
|---|---|---|---|---|
| | Prewet step Type of prewet solution composition | Type of resist composition | Exposure method | Development step Type of developer | Defect performance |
| Example 106 | Solution of Example 18 Resist composition 18 | | NTI (EUV exposure) | Solution of Example 1 | A |
| Example 107 | Solution of Example 18 Resist composition 19 | | NTI (EUV exposure) | Solution of Example 1 | A |
| Example 108 | Solution of Example 18 Resist composition 20 | | NTI (EUV exposure) | Solution of Example 1 | A |
| Example 109 | Solution of Example 18 Resist composition 21 | | NTI (EUV exposure) | Solution of Example 1 | A |
| Example 110 | Solution of Example 18 Resist composition 22 | | NTI (EUV exposure) | Solution of Example 1 | A |
| Example 111 | Solution of Example 18 Resist composition 23 | | NTI (EUV exposure) | Solution of Example 1 | A |
| Example 112 | Solution of Example 18 Resist composition 24 | | NTI (EUV exposure) | Solution of Example 1 | A |
| Example 113 | Solution of Example 18 Resist composition 25 | | NTI (EUV exposure) | Solution of Example 1 | A |

As shown in Table 6, it was confirmed that in a case where the solution according to the embodiment of the present invention was used as a prewet solution and a developer, the defect inhibition ability became excellent.

What is claimed is:

1. An actinic ray-sensitive or radiation-sensitive resin composition comprising:

a solution comprising:

at least one kind of organic solvent having a boiling point lower than 200° C.; and an organic impurity having a boiling point equal to or higher than 250° C., wherein a content of the organic solvent with respect to a total mass of the solution is equal to or greater than 98% by mass, a content of the organic impurity with respect to the total mass of the solution is equal to or greater than 0.1 mass ppm and less than 100 mass ppm, and the organic impurity is at least one kind of compound selected from the group consisting of dioctyl phthalate, diisononyl phthalate, dioctyl adipate, dibutyl phthalate, ethylene propylene rubber, dimethyl phthalate, p-Toluic acid, bis (2-ethylhexyl) phthalate, addition polymer of 5-ethylidene-2-norbornene represented by the following structural formula,

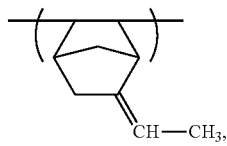

addition polymer of cyclopentadiene represented by the following structural formula,

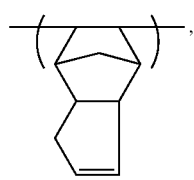

addition polymer of 1,4-hexadiene represented by the following structural formula,

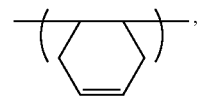

diisodecyl phthalate, bis (2-propylheptyl) phthalate, benzyl butyl phthalate, diisooctyl phthalate, diethyl phthalate, diisobutyl phthalate, tris (2-ethylhexyl) trimellitate, tris (n-octyl-n-decyl) trimellitate, bis (2-ethylhexyl) adipate, monomethyl adipate, dibutyl sebacate, dibutyl maleate, diisobutyl maleate, dioctyl terephthalate, diisononyl 1,2-cyclohexanedicarboxylic acid ester, epoxidized vegetable oil, N-(2-hydroxypropyl) benzene sulfonamide, N-(n-butyl) benzene sulfonamide, tricresyl phosphate, tributyl phosphate, triethyl citrate, acetyl triethyl citrate, tributyl citrate, acetyl tributyl citrate, trioctyl citrate, acetyl trioctyl citrate, trihexyl citrate, acetyl trihexyl citrate, and epoxidized soybean oil; and a resin P having a repeating unit represented by Formula (AI):

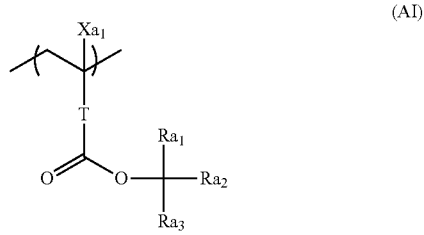

in Formula (AI), $Xa_1$ represents a hydrogen atom or an alkyl group which may have a substituent, T represents a single bond or a divalent linking group, $Ra_1$ to $Ra_3$ each independently represent an alkyl group or a cycloalkyl group, and two out of $Ra_1$ to $Ra_3$ may form a cycloalkyl group by being bonded to each other.

2. The actinic ray-sensitive or radiation-sensitive resin composition according to claim 1, wherein the resin P further has a repeating unit Q having a lactone structure on a side chain.

3. The actinic ray-sensitive or radiation-sensitive resin composition according to claim 1, wherein the resin P is a resin represented by Formula (I):

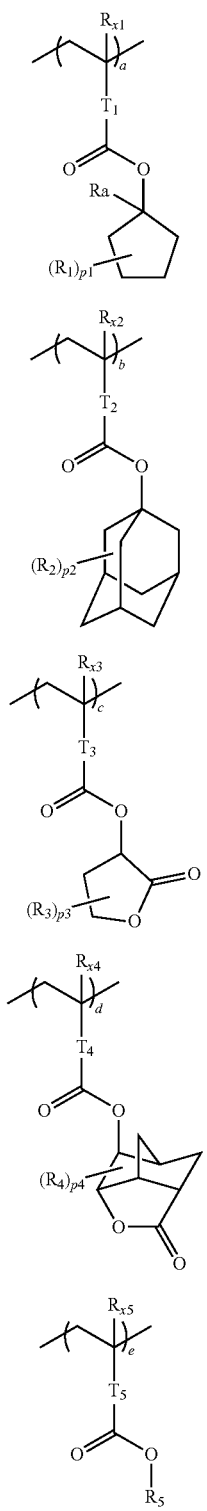

in Formula (I),

Rx$_1$ to Rx$_5$ each independently represent a hydrogen atom or an alkyl group which may have a substituent, R$_1$ to R$_4$ each represent a monovalent substituent, p$_1$ to p$_4$ each independently represent 0 or a positive integer, R$_a$ represents a linear or branched alkyl group, T$_1$ to T$_5$ each represent a single bond or a divalent linking group, R$_5$ represents a monovalent organic group, a to e each represent mol % and each independently represent a number included in a range of 0≤a≤100, 0≤b≤100, 0≤c<100, 0≤d<100, or 0≤e<100, here, a+b+c+d+e =100, and a +b≠0, and in Formula (I), the repeating unit (e) has a structure different from all of the repeating units (a) to (d).

4. An actinic ray-sensitive or radiation-sensitive resin composition comprising:
a solution comprising:
at least one kind of organic solvent having a boiling point lower than 200° C.; and
an organic impurity having a boiling point equal to or higher than 250° C.,
wherein a content of the organic solvent with respect to a total mass of the solution is equal to or greater than 98% by mass,
a content of the organic impurity with respect to the total mass of the solution is equal to or greater than 0.1 mass ppm and less than 100 mass ppm, and
the organic impurity is at least one kind of compound selected from the group consisting of dioctyl phthalate, diisononyl phthalate, dioctyl adipate, dibutyl phthalate, ethylene propylene rubber, dimethyl phthalate, p-Toluic acid, bis (2-ethylhexyl) phthalate, addition polymer of 5-ethylidene-2-norbornene represented by the following structural formula, addition polymer of cyclopentadiene represented by the following structural formula, addition polymer of 1,4-hexadiene represented by the following structural formula, diisodecyl phthalate, bis (2-propylheptyl) phthalate, benzyl butyl phthalate, diisooctyl phthalate, diethyl phthalate, diisobutyl phthalate, tris (2-ethylhexyl) trimellitate, tris (n-octyl-n-decyl) trimellitate, bis (2-ethylhexyl) adipate, monomethyl adipate, dibutyl sebacate, dibutyl maleate, diisobutyl maleate, dioctyl terephthalate, diisononyl 1,2-cyclohexanedicarboxylic acid ester, epoxidized vegetable oil, N-(2-hydroxypropyl) benzene sulfonamide, N-(n-butyl) benzene sulfonamide, tricresyl phosphate, tributyl phosphate, triethyl citrate, acetyl triethyl citrate, tributyl citrate, acetyl tributyl citrate, trioctyl citrate, acetyl trioctyl citrate, trihexyl citrate, acetyl trihexyl citrate, and epoxidized soybean oil; and a resin P which has a repeating unit having a phenolic hydroxyl group and has a group generating a polar group by being decomposed by the action of an acid.

* * * * *